(12) United States Patent
Radu et al.

(10) Patent No.: US 9,954,174 B2
(45) Date of Patent: Apr. 24, 2018

(54) HOLE TRANSPORT MATERIALS

(71) Applicant: E I DU PONT DE NEMOURS AND COMPANY, Wilmington, DE (US)

(72) Inventors: Nora Sabina Radu, Landenberg, PA (US); Juergen Weber, Lincoln University, PA (US); Adam Fennimore, Wilmington, DE (US); Arjan Zoombelt, Philadelphia, PA (US); Phillip Sharrow, Landenberg, PA (US); Michael Henry Howard, Jr., Montchanin, DE (US); Tiffany N Hoerter, West Grove, PA (US); Gene M Rossi, Wilmington, DE (US)

(73) Assignee: E I DU PONT DE NEMOURS AND COMPANY, Wilmington, DE (US)

( * ) Notice: Subject to any disclaimer, the term of this patent is extended or adjusted under 35 U.S.C. 154(b) by 100 days.

(21) Appl. No.: 15/134,032

(22) Filed: Apr. 20, 2016

(65) Prior Publication Data
US 2016/0329497 A1 Nov. 10, 2016

Related U.S. Application Data

(60) Provisional application No. 62/157,531, filed on May 6, 2015, provisional application No. 62/251,405, filed on Nov. 5, 2015.

(51) Int. Cl.
*C08G 61/12* (2006.01)
*H01L 51/00* (2006.01)
(Continued)

(52) U.S. Cl.
CPC .......... *H01L 51/0043* (2013.01); *C08G 61/12* (2013.01); *C08G 61/121* (2013.01);
(Continued)

(58) Field of Classification Search
CPC ..................................................... C08G 61/12
(Continued)

(56) References Cited

U.S. PATENT DOCUMENTS 6,670,645 B2 12/2003 Grushin et al.
7,351,358 B2 4/2008 Hsu et al.
(Continued)

FOREIGN PATENT DOCUMENTS

JP 09-310066 A 12/1997
JP 2009-021335 A 1/2009
(Continued)

OTHER PUBLICATIONS

Wang, Y., Kirk-Othmer Encyclopedia of Chemical Technology, Fourth Edition, 1996, vol. 18, pp. 837-860 (Book Not Included).
(Continued)

*Primary Examiner* — Duc Truong

(57) ABSTRACT

There is provided a copolymer having Formula I $$E + A \frac{}{a} + B' \frac{}{b} + C' \frac{}{c} E \qquad (I)$$

In Formula I: A is a monomeric unit containing at least one triarylamine group; B' is a monomeric unit having at least three points of attachment in the copolymer; C' is an aromatic monomeric unit or a deuterated analog thereof; E is the same or different at each occurrence and can be H, D, halide, alkyl, silyl, germyl, aryl, arylamino, siloxane, a crosslinkable group, deuterated alkyl, deuterated silyl, deuterated germyl, deuterated aryl, deuterated arylamino, deuterated siloxane, or a deuterated crosslinkable group; a, b,
(Continued)

and c are the same or different and are mole fractions, such that a+b+c=1, and a and b are non-zero.

21 Claims, 2 Drawing Sheets

(51) Int. Cl.
    *C08G 73/02* (2006.01)
    *H01L 51/50* (2006.01)
(52) U.S. Cl.
    CPC ..... *C08G 73/026* (2013.01); *C08G 2261/124* (2013.01); *C08G 2261/132* (2013.01); *C08G 2261/135* (2013.01); *C08G 2261/148* (2013.01); *C08G 2261/1412* (2013.01); *C08G 2261/312* (2013.01); *C08G 2261/3162* (2013.01); *C08G 2261/411* (2013.01); *C08G 2261/512* (2013.01); *C08G 2261/95* (2013.01); *H01L 51/5056* (2013.01)
(58) Field of Classification Search
    USPC ........................................................ 428/690
    See application file for complete search history.

(56) References Cited

U.S. PATENT DOCUMENTS

| 8,465,848 | B2 | 6/2013 | Smith |
| 2004/0102577 | A1 | 5/2004 | Hsu et al. |
| 2004/0127637 | A1 | 6/2004 | Hsu et al. |
| 2005/0184287 | A1 | 8/2005 | Herron et al. |
| 2005/0205860 | A1 | 9/2005 | Hsu et al. |
| 2012/0049167 | A1 | 3/2012 | Kuramochi et al. |
| 2014/0193937 | A1 | 7/2014 | Humphries et al. |
| 2014/0235800 | A1 | 8/2014 | Humphries et al. |
| 2014/0291651 | A1 | 10/2014 | Humphries et al. |

FOREIGN PATENT DOCUMENTS

| KR | 10-2009-0028943 A | 3/2009 |
| KR | 10-2010-0111767 A | 10/2010 |
| WO | 2003/008424 A1 | 1/2003 |
| WO | 2003/040257 A1 | 5/2003 |
| WO | 2003/063555 A1 | 7/2003 |
| WO | 2003/091688 A2 | 11/2003 |
| WO | 2004/016710 A1 | 2/2004 |
| WO | 2005/052027 A1 | 6/2005 |
| WO | 2007/145979 A3 | 4/2008 |
| WO | 2011/028216 A1 | 3/2011 |
| WO | 2011/159872 A1 | 12/2011 |
| WO | 2013/098113 A2 | 7/2013 |
| WO | 2014/021571 A1 | 2/2014 |
| WO | 2015/089304 A1 | 6/2015 |

OTHER PUBLICATIONS

Podzimek, Z. "The Use of GPC Coupled with a Multiangle laser Light Scattering Photometer for the Characterization of Polymers. On the Determination of Molecular Weight, Size, and Branching," Journal of Applied Polymer Science, 1994, vol. 54, 91-103.
PCT International Search Report, Application No. PCT/US2016/059288; Kim Dong Seok, Authorized Officer, ISA/KR, ; dated Feb. 6, 2017.
PCT International Search Report for Application No. PCT/US2015/061309; Chang Bong Ho, Authorized Officer; ISA/KR; dated Mar. 2, 2016.
Hitosugi et al. "A Facile Chromatographic Method for Purification of Pinacol Boronic Esters," Chem. Lett. 2012, 41, pp. 972-973.
Gustafsson, G. et al. "Flexible light-emitting diodes made from soluble conducting polymers," Letters to Nature, Jun. 11, 1992, vol. 357, pp. 477-479.
CRC Handbook of Chemistry and Physics, 81st Edition, 2000-2001 (Book Not Included).
Agilent Technologies publication "A guide to multi-detector gel permeation chromatography," 2012, pp. 1-24, www.agilent.com/cs/library/primers/public/5990-7196EN.pdf.

HOLE TRANSPORT MATERIALS

CLAIM OF BENEFIT OF PRIOR APPLICATION

This application claims the benefit of U.S. Provisional Application No. 62/157,531, filed May 6, 2015, and 62/251,405, filed Nov. 5, 2015, both of which are incorporated in their entirety herein by reference.

BACKGROUND INFORMATION

Field of the Disclosure

The present disclosure relates to novel hole transport compounds. The disclosure further relates to electronic devices having at least one layer comprising such a hole transport compound.

Description of the Related Art

In organic electronic devices, such as organic light emitting diodes ("OLED"), that make up OLED displays, one or more organic electroactive layers are sandwiched between two electrical contact layers. In an OLED at least one organic electroactive layer emits light through the light-transmitting electrical contact layer upon application of a voltage across the electrical contact layers.

It is well known to use organic electroluminescent compounds as the light-emitting component in light-emitting diodes. Simple organic molecules, conjugated polymers, and organometallic complexes have been used.

Devices that use electroluminescent materials frequently include one or more charge transport layers, which are positioned between a photoactive (e.g., light-emitting) layer and a contact layer (hole-injecting contact layer). A device can contain two or more contact layers. A hole transport layer can be positioned between the photoactive layer and the hole-injecting contact layer. The hole-injecting contact layer may also be called the anode. An electron transport layer can be positioned between the photoactive layer and the electron-injecting contact layer. The electron-injecting contact layer may also be called the cathode.

There is a continuing need for electroactive materials for use in electronic devices.

SUMMARY

There is provided a hole transport copolymer having Formula I

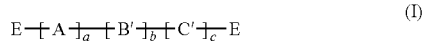

wherein:
A is a monomeric unit containing at least one triarylamine group;
B' is a monomeric unit having at least three points of attachment in the copolymer;
C' is an aromatic monomeric unit or a deuterated analog thereof;
E is the same or different at each occurrence and is selected from the group consisting of H, D, halide, alkyl, silyl, germyl, aryl, arylamino, siloxane, cross-linkable groups, deuterated alkyl, deuterated silyl, deuterated germyl, deuterated aryl, deuterated arylamino, deuterated siloxane, and deuterated crosslinkable groups;

a, b, and c are the same or different and are mole fractions, such that a+b+c=1, and a and b are non-zero.

There is also provided an electronic device having at least one layer comprising a copolymer of Formula I.

The foregoing general description and the following detailed description are exemplary and explanatory only and are not restrictive of the invention, as defined in the appended claims.

BRIEF DESCRIPTION OF THE DRAWINGS

Embodiments are illustrated in the accompanying figures to improve understanding of concepts as presented herein.

Figure 1:
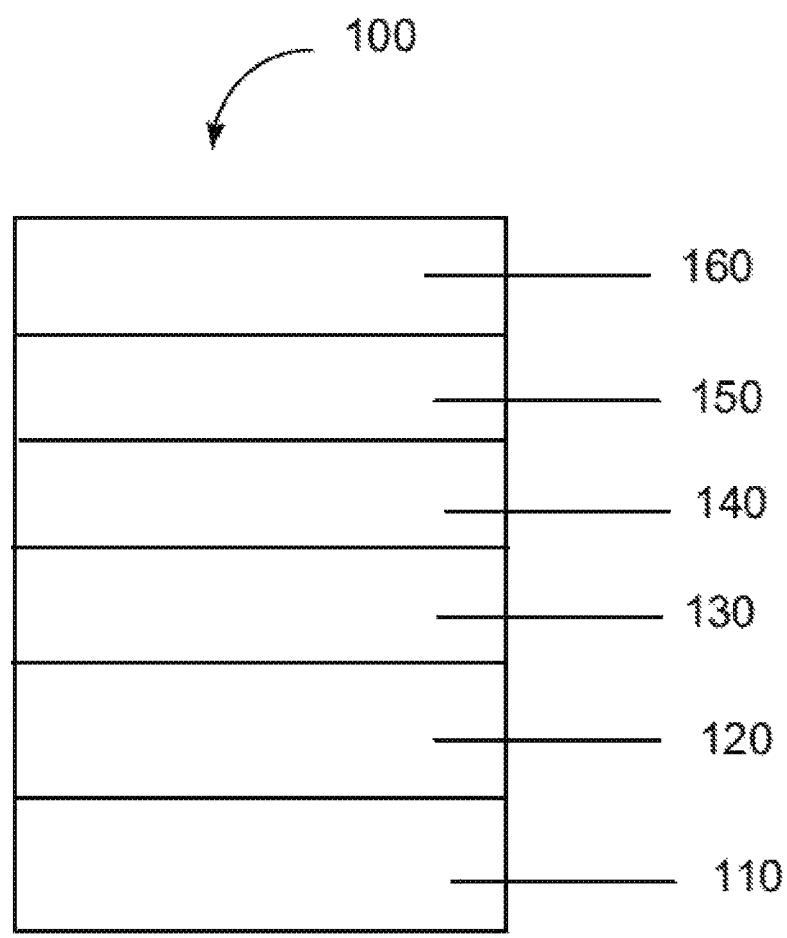
FIG. 1 includes an illustration of one example of an organic electronic device including the new hole transport copolymer described herein.

Skilled artisans appreciate that objects in the figures are illustrated for simplicity and clarity and have not necessarily been drawn to scale. For example, the dimensions of some of the objects in the figures may be exaggerated relative to other objects to help to improve understanding of embodiments.

DETAILED DESCRIPTION

There is provided a hole transport copolymer having Formula I, as described above.

Many aspects and embodiments have been described above and are merely exemplary and not limiting. After reading this specification, skilled artisans appreciate that other aspects and embodiments are possible without departing from the scope of the invention.

Other features and benefits of any one or more of the embodiments will be apparent from the following detailed description and from the claims. The detailed description first addresses Definitions and Clarification of Terms, followed by the Compound, the Electronic Device, and finally Examples.

1. Definitions and Clarification of Terms

Before addressing details of embodiments described below, some terms are defined or clarified.

As used in the "Definitions and Clarification of Terms", R, R' and R" and any other variables are generic designations and may be the same as or different from those defined in the formulas.

As used herein, the term "adjacent" as it refers to substituent groups refers to groups that are bonded to carbons that are joined together with a single or multiple bond. Exemplary adjacent R groups are shown below:

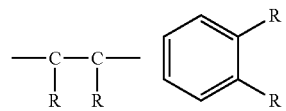

The term "alkoxy" is intended to mean the group RO-x, where R is an alkyl group.

The term "alkyl" includes branched and straight-chain saturated aliphatic hydrocarbon groups. Unless otherwise indicated, the term is also intended to include cyclic groups.

Examples of alkyl groups include methyl, ethyl, propyl, isopropyl, isobutyl, secbutyl, tertbutyl, pentyl, isopentyl, neopentyl, cyclopentyl, hexyl, cyclohexyl, isohexyl and the like. The term "alkyl" further includes both substituted and unsubstituted hydrocarbon groups. In some embodiments, the alkyl group may be mono-, di- and tri-substituted. One example of a substituted alkyl group is trifluoromethyl. Other substituted alkyl groups are formed from one or more of the substituents described herein. In certain embodiments alkyl groups have 1 to 20 carbon atoms. In other embodiments, the group has 1 to 6 carbon atoms. The term is intended to include heteroalkyl groups. Heteroalkyl groups may have from 1-20 carbon atoms.

The term "amino group" is intended to mean the group —$NR_2$, where R is the same or different at each occurrence and can be an alkyl group, an aryl group, or deuterated analogs thereof.

The term "aromatic compound" is intended to mean an organic compound comprising at least one unsaturated cyclic group having 4n+2 delocalized pi electrons. The term is intended to encompass both hydrocarbon aromatic compounds having only carbon ring atoms, and heteroaromatic compounds wherein one or more of the carbon atoms within the cyclic group has been replaced by another atom, such as nitrogen, oxygen, sulfur, or the like.

The term "aryl" or "aryl group" means a moiety derived from an aromatic compound. A group "derived from" a compound, indicates the radical formed by removal of one or more H or D. The aryl group may be a single ring (monocyclic) or multiple rings (bicyclic, or more) fused together or linked covalently. Examples of aryl moieties include, but are not limited to, phenyl, 1-naphthyl, 2-naphthyl, dihydronaphthyl, tetrahydronaphthyl, biphenyl, anthryl, phenanthryl, fluorenyl, indanyl, biphenylenyl, acenaphthenyl, acenaphthylenyl, and the like. As used herein, the terms "aryl", "phenyl", "naphthyl", etc., refer to groups having one or more points of attachment. In some embodiments, aryl groups have 6 to 60 ring carbon atoms; in some embodiments, 6 to 30 ring carbon atoms. The term is intended to include hydrocarbon aryls, having only carbon atoms and hydrogen atoms; and heteroaryls, having at least one heteroatom in one or more of the rings. Heteroaryl groups may have from 3-50 ring carbon atoms; in some embodiments, 4-30 ring carbon atoms.

The term "aryloxy" is intended to mean the group —OR, where R is aryl.

The term "charge transport," when referring to a layer, material, member, or structure is intended to mean such layer, material, member, or structure facilitates migration of such charge through the thickness of such layer, material, member, or structure with relative efficiency and small loss of charge. Hole transport materials facilitate positive charge; electron transport materials facilitate negative charge. Although light-emitting materials may also have some charge transport properties, the term "charge transport layer, material, member, or structure" is not intended to include a layer, material, member, or structure whose primary function is light emission.

The term "compound" is intended to mean an electrically uncharged substance made up of molecules that further include atoms, wherein the atoms cannot be separated from their corresponding molecules by physical means without breaking chemical bonds. The term is intended to include oligomers and polymers.

The term "crosslinkable group" or "crosslinking group" is intended to mean a group on a compound or polymer chain than can link to another compound or polymer chain via thermal treatment, use of an initiator, or exposure to radiation, where the link is a covalent bond. In some embodiments, the radiation is UV or visible. Examples of crosslinkable groups include, but are not limited to vinyl, acrylate, perfluorovinylether, 1-benzo-3,4-cyclobutane, o-quinodimethane groups, siloxane, cyanate groups, cyclic ethers (epoxides), internal alkenes (e.g., stillbene) cycloalkenes, and acetylenic groups.

The term "electroactive" as it refers to a layer or a material, is intended to indicate a layer or material which electronically facilitates the operation of the device. Examples of electroactive materials include, but are not limited to, materials which conduct, inject, transport, or block a charge, where the charge can be either an electron or a hole, or materials which emit radiation or exhibit a change in concentration of electron-hole pairs when receiving radiation. Examples of inactive materials include, but are not limited to, planarization materials, insulating materials, and environmental barrier materials.

The prefix "fluoro" is intended to indicate that one or more hydrogens in a group has been replaced with fluorine.

The term "germyl" refers to the group $R_3Ge$—, where R is the same or different at each occurrence and is H, D, $C_{1-20}$ alkyl, deuterated alkyl, fluoroalkyl, deuterated partially-fluorinated alkyl, aryl, or deuterated aryl.

The prefix "hetero" indicates that one or more carbon atoms has been replaced with a different atom. In some embodiments, the heteroatom is O, N, S, or combinations thereof.

The term "liquid composition" is intended to mean a liquid medium in which a material is dissolved to form a solution, a liquid medium in which a material is dispersed to form a dispersion, or a liquid medium in which a material is suspended to form a suspension or an emulsion.

The term "mole fraction" is intended to mean the ratio of the number of moles of a given component to the total number of moles of all the components.

The term "molecular weight" (of polymer with "n" repeat units) is intended to mean the total mass of a polymeric molecule and is calculated as the sum of the mass of each constituent atom multiplied by the number of atoms of that element in the polymeric formula. The practical upper limit of n is determined in part by the desired solubility of a compound in a particular solvent or class of solvents. As the value of n increases, the molecular weight of the compound increases.

The term "monomeric unit" is intended to mean a repeating unit in a polymer or copolymer.

The term "photoactive" refers to a material or layer that emits light when activated by an applied voltage (such as in a light emitting diode or chemical cell), that emits light after the absorption of photons (such as in down-converting phosphor devices), or that responds to radiant energy and generates a signal with or without an applied bias voltage (such as in a photodetector or a photovoltaic cell).

The term "polymer" is intended to mean a material having at least one repeating monomeric unit. The term includes homopolymers having only one kind of monomeric unit, and copolymers having two or more different monomeric units. Copolymers are a subset of polymers.

The term "siloxane" refers to the group $R_3SiOR_2Si$—, where R is the same or different at each occurrence and is H, D, $C_{1-20}$ alkyl, deuterated alkyl, fluoroalkyl, aryl, or deuterated aryl. In some embodiments, one or more carbons in an R alkyl group are replaced with Si.

The term "siloxy" refers to the group $R_3SiO-$, where R is the same or different at each occurrence and is H, D, $C_{1-20}$ alkyl, deuterated alkyl, fluoroalkyl, aryl, or deuterated aryl.

The term "silyl" refers to the group $R_3Si-$, where R is the same or different at each occurrence and is H, D, $C_{1-20}$ alkyl, deuterated alkyl, fluoroalkyl, aryl, or deuterated aryl. In some embodiments, one or more carbons in an R alkyl group are replaced with Si.

Unless otherwise indicated, all groups can be substituted or unsubstituted. An optionally substituted group, such as, but not limited to, alkyl or aryl, may be substituted with one or more substituents which may be the same or different. Suitable substituents include D, alkyl, aryl, nitro, cyano, —N(R')(R"), halo, hydroxy, carboxy, alkenyl, alkynyl, cycloalkyl, heteroaryl, alkoxy, aryloxy, heteroaryloxy, alkoxycarbonyl, perfluoroalkyl, perfluoroalkoxy, arylalkyl, silyl, siloxane, thioalkoxy, —S(O)$_2$—N(R')(R"), —C(=O)—N(R')(R"), (R')(R")N-alkyl, (R')(R")N-alkoxyalkyl, (R')(R")N-alkylaryloxyalkyl, —S(O)$_s$-aryl (where s=0-2) or —S(O)$_s$-heteroaryl (where s=0-2). Each R' and R" is independently an optionally substituted alkyl, cycloalkyl, or aryl group. R' and R", together with the nitrogen atom to which they are bound, can form a ring system in certain embodiments. Substituents may also be crosslinking groups.

In a structure where a substituent bond passes through one or more rings as shown below,

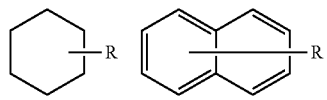

it is meant that the substituent R may be bonded at any available position on the one or more rings.

In this specification, unless explicitly stated otherwise or indicated to the contrary by the context of usage, where an embodiment of the subject matter hereof is stated or described as comprising, including, containing, having, being composed of or being constituted by or of certain features or elements, one or more features or elements in addition to those explicitly stated or described may be present in the embodiment. An alternative embodiment of the disclosed subject matter hereof, is described as consisting essentially of certain features or elements, in which embodiment features or elements that would materially alter the principle of operation or the distinguishing characteristics of the embodiment are not present therein. A further alternative embodiment of the described subject matter hereof is described as consisting of certain features or elements, in which embodiment, or in insubstantial variations thereof, only the features or elements specifically stated or described are present.

Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Also, use of "a" or "an" are employed to describe elements and components described herein. This is done merely for convenience and to give a general sense of the scope of the invention. This description should be read to include one or at least one and the singular also includes the plural unless it is obvious that it is meant otherwise.

Group numbers corresponding to columns within the Periodic Table of the elements use the "New Notation" convention as seen in the *CRC Handbook of Chemistry and Physics,* 81$^{st}$ Edition (2000-2001).

In this specification, unless explicitly stated otherwise or indicated to the contrary by the context of usage, chemical and structural formulae may be depicted using the line-angle formula convention. In a line-angle formula, bonds are represented by lines, and carbon atoms are assumed to be present wherever two lines meet or a line begins or ends. Nitrogen, oxygen, halogens, and other heteroatoms are shown; but hydrogen atoms are not usually drawn when bonded to carbon. Each sp$^3$ carbon atom is assumed to have enough bonded hydrogen atoms in order to give it a total of four bonds; each sp$^2$ carbon, three bonds; each sp carbon, two bonds. The depiction of Formula II herein is an example of the use of the line-angle formula convention.

Unless otherwise defined, all technical and scientific terms used herein have the same meaning as commonly understood by one of ordinary skill in the art to which this invention belongs. Although methods and materials similar or equivalent to those described herein can be used in the practice or testing of embodiments of the present invention, suitable methods and materials are described below. All publications, patent applications, patents, and other references mentioned herein are incorporated by reference in their entirety, unless a particular passage is cited. In case of conflict, the present specification, including definitions, will control. In addition, the materials, methods, and examples are illustrative only and not intended to be limiting.

To the extent not described herein, many details regarding specific materials, processing acts, and circuits are conventional and may be found in textbooks and other sources within the organic light-emitting diode display, photodetector, photovoltaic, and semiconductive member arts.

2. Hole Transport Copolymer

The hole transport copolymer described herein has Formula I

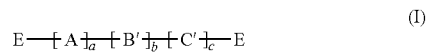

wherein:
  A is a monomeric unit containing at least one triarylamine group;
  B' is a monomeric unit having at least three points of attachment in the copolymer;
  C' is an aromatic monomeric unit or a deuterated analog thereof;
  E is the same or different at each occurrence and is selected from the group consisting of H, D, halide, alkyl, silyl, germyl, aryl, arylamino, siloxane, crosslinkable groups, deuterated alkyl, deuterated silyl, deuterated germyl, deuterated aryl, deuterated arylamino, deuterated siloxane, and deuterated crosslinkable groups;
  a, b, and c are the same or different and are mole fractions, such that a+b+c=1, and a and b are non-zero.

Alternatively, Formula I may be written in a format shown as Formula I', below

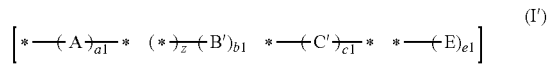

where
- a1, b1, c1, and e1 are mole fractions of reactant monomers, such that a1+b1+c1+e1=1, and a1 and b1 are non-zero;
- z is an integer equal to or greater than 3;
- * indicates a point of attachment in the copolymer; and
- A, B', C', and E are as defined above.

The A, B', and C' monomeric units are all different.

Any of A, B' and C' monomeric units may have substituents selected from the group consisting of D, F, CN, alkyl, fluoroalkyl, aryl, heteroaryl, amino, silyl, germyl, alkoxy, aryloxy, fluoroalkoxy, siloxane, siloxy, crosslinking groups, deuterated alkyl, deuterated partially-fluorinated alkyl, deuterated aryl, deuterated heteroaryl, deuterated amino, deuterated silyl, deuterated germyl, deuterated alkoxy, deuterated aryloxy, deuterated fluoroalkoxy, deuterated siloxane, deuterated siloxy, deuterated crosslinking groups, and combinations thereof.

When the E unit is not H, D, or halide, the unit may also have substituents selected from the group consisting of D, F, CN, alkyl, fluoroalkyl, aryl, heteroaryl, amino, silyl, germyl, alkoxy, aryloxy, fluoroalkoxy, siloxane, siloxy, crosslinking groups, deuterated alkyl, deuterated partially-fluorinated alkyl, deuterated aryl, deuterated heteroaryl, deuterated amino, deuterated silyl, deuterated germyl, deuterated alkoxy, deuterated aryloxy, deuterated fluoroalkoxy, deuterated siloxane, deuterated siloxy, deuterated crosslinking groups, and combinations thereof.

All of the embodiments for A, B', C', and E described below for Formula I, apply equally to Formula I'.

In some embodiments of Formula I, the A, B', and optional C' units are ordered in a regular alternating pattern.

In some embodiments of Formula I, the A, B', and optional C' units are ordered in blocks of like monomers.

In some embodiments of Formula I, A, B', and optional C' units are randomly arranged.

In some embodiments, the distribution of monomeric segments can be manipulated so as to optimize properties of compounds having Formula I for use in electronic devices. In some embodiments, the different distribution can result in differential degrees of non-associative packing that ultimately determines the associated film-forming properties.

In some embodiments, the copolymer having Formula I is deuterated. The term "deuterated" is intended to mean that at least one hydrogen ("H") has been replaced by deuterium ("D"). The term "deuterated analog" refers to a structural analog of a compound or group in which one or more available hydrogens have been replaced with deuterium. In a deuterated copolymer or deuterated analog, the deuterium is present in at least 100 times the natural abundance level. In some embodiments, the copolymer is at least 10% deuterated. By "% deuterated" or "% deuteration" is meant the ratio of deuterons to the sum of protons plus deuterons, expressed as a percentage. In some embodiments, the copolymer is at least 10% deuterated; in some embodiments, at least 20% deuterated; in some embodiments, at least 30% deuterated; in some embodiments, at least 40% deuterated; in some embodiments, at least 50% deuterated; in some embodiments, at least 60% deuterated; in some embodiments, at least 70% deuterated; in some embodiments, at least 80% deuterated; in some embodiments, at least 90% deuterated; in some embodiments, 100% deuterated.

The deuteration can be present on one or more of monomeric units A, B', and C'. The deuteration can be present on the copolymer backbone, on pendant groups, or both.

In some embodiments of Formula I, the copolymer has a $M_n>10,000$. In some embodiments, the copolymer has a $M_n>20,000$; in some embodiments, $M_n>50,000$; in some embodiments, $M_n>100,000$; in some embodiments, $M_n>150,000$.

In some embodiments of Formula I, the copolymer has a $M_w>10,000$. In some embodiments, the copolymer has a $M_w>20,000$; in some embodiments, $M_w>50,000$; in some embodiments, $M_w>100,000$; in some embodiments, $M_w>150,000$. In some embodiments of Formula I, the copolymer has a $M_w$ in the range of $10,000-2\times10^6$; in some embodiments, 10,000-500,000; in some embodiments, 10,000-200,000; in some embodiments, 10,000-150,000; in some embodiments, 20,000-100,000.

Monomeric unit A is an aromatic monomeric unit that contains at least one triarylamino group.

Monomeric unit A is a difunctional monomeric unit and has only two points of attachment in the copolymer.

In some embodiments, monomeric unit A has Formula II

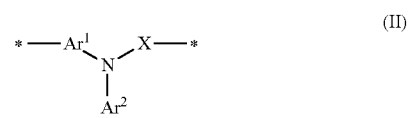

wherein:
- $Ar^1$ is the same or different at each occurrence and is an aryl or deuterated aryl group;
- $Ar^2$ is the same or different at each occurrence and is an aryl or deuterated aryl group;
- X is the same or different at each occurrence and is selected from the group consisting of a single bond, an aryl group, and a deuterated aryl group; and
- * represents a point of attachment in the copolymer.

In some embodiments, monomeric unit A has Formula III

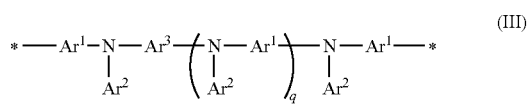

wherein:
- $Ar^1$ is the same or different at each occurrence and is an aryl or deuterated aryl group;
- $Ar^2$ is the same or different at each occurrence and is an aryl or deuterated aryl group;
- $Ar^3$ is the same or different at each occurrence and is an aryl or deuterated aryl group;
- q is an integer of 0 or greater; and
- * represents a point of attachment in the copolymer.

In some embodiments, monomeric unit A has Formula III-a

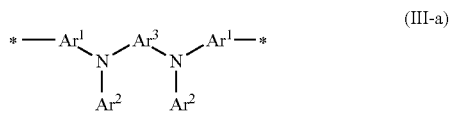

where $Ar^1$, $Ar^2$, $Ar^3$, and * are as defined above for Formula III.

In some embodiments, monomeric unit A has Formula III-b

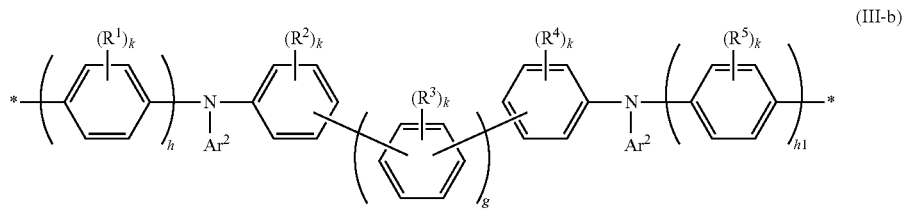

wherein:
- $Ar^2$ is the same or different at each occurrence and is an aryl or deuterated aryl group;
- $R^1$ through $R^5$ are independently the same or different at each occurrence and are selected from the group consisting of D, F, CN, alkyl, fluoroalkyl, aryl, heteroaryl, amino, silyl, germyl, alkoxy, aryloxy, fluoroalkoxy, siloxane, siloxy, deuterated alkyl, deuterated partially-fluorinated alkyl, deuterated aryl, deuterated heteroaryl, deuterated amino, deuterated silyl, deuterated germyl, deuterated alkoxy, deuterated aryloxy, deuterated fluoroalkoxy, deuterated siloxane, deuterated siloxy, and crosslinking groups, wherein adjacent $R^1$ or $R^5$ groups can be joined together to form a fused 5- or 6-membered aromatic ring;
- k is the same or different at each occurrence and is an integer from 0 to 4;
- g is an integer from 0 to 3;
- h and h1 are the same or different and are 1 or 2; and
- * represents a point of attachment in the copolymer.

In some embodiments, monomeric unit A has Formula IV

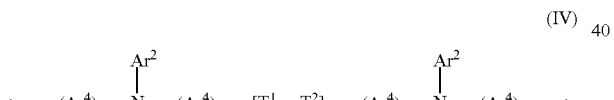

wherein:
- $Ar^2$ is the same or different at each occurrence and is an aryl group or deuterated aryl group;
- $Ar^4$ is the same or different at each occurrence and is selected from the group consisting of phenylene, substituted phenylene, naphthylene, substituted naphthylene, and deuterated analogs thereof;
- $T^1$ and $T^2$ are independently the same or different at each occurrence and are conjugated moieties which are connected in a non-planar configuration, or a deuterated analog thereof;
- d is the same or different at each occurrence and is an integer from 1 to 6;
- e is the same or different at each occurrence and is an integer from 1 to 6; and
- * represents a point of attachment in the copolymer.

In some embodiments, monomeric unit A has Formula V-a or Formula V-b

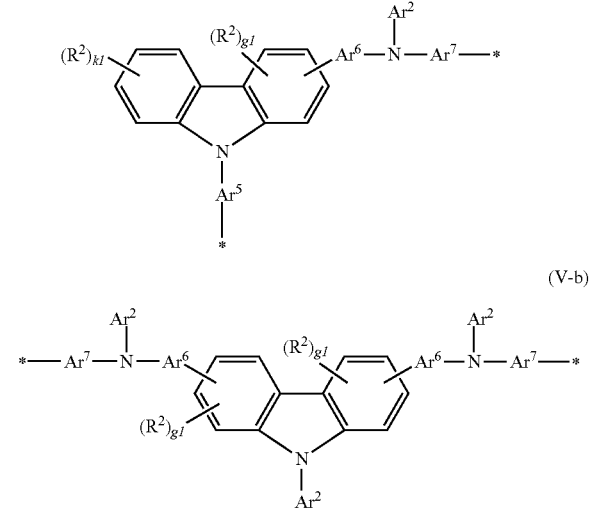

wherein:
- $Ar^2$ is an aryl group or deuterated aryl group;
- $Ar^5$, $Ar^6$, and $Ar^7$ are the same or different at each occurrence and are aryl groups or deuterated aryl groups;
- $R^1$ and $R^2$ are the same or different at each occurrence and are selected from the group consisting of D, F, CN, alkyl, fluoroalkyl, aryl, heteroaryl, amino, silyl, germyl, alkoxy, aryloxy, fluoroalkoxy, siloxane, siloxy, deuterated alkyl, deuterated partially-fluorinated alkyl, deuterated aryl, deuterated heteroaryl, deuterated amino, deuterated silyl, deuterated germyl, deuterated alkoxy, deuterated aryloxy, deuterated fluoroalkoxy, deuterated siloxane, deuterated siloxy, and crosslinking groups, wherein adjacent groups selected from $R^1$ and $R^2$ can be joined together to form a fused ring;
- k1 is an integer from 0-4;
- g1 is the same or different at each occurrence and is an integer from 0-3; and
- * represents a point of attachment in the copolymer.

In some embodiments of the above formulae, $Ar^1$ is an aryl group having at least one fused ring.

In some embodiments of the above formulae, $Ar^1$ is selected from the group consisting of naphthyl, anthracenyl, naphthylphenyl, phenylnaphthyl, fluorenyl, substituted derivatives thereof, and deuterated analogs thereof.

In some embodiments of the above formulae, $Ar^1$ is an aryl group having no fused rings.

In some embodiments of the above formulae, $Ar^1$ is an aryl group or substituted aryl group.

In some embodiments of the above formulae, $Ar^1$ is a substituted aryl group having at least one substituent selected from the group consisting of D, F, CN, alkyl, fluoroalkyl, aryl, heteroaryl, amino, silyl, germyl, alkoxy, aryloxy, fluoroalkoxy, siloxane, siloxy, crosslinking groups, deuterated alkyl, deuterated partially-fluorinated alkyl, deuterated aryl, deuterated heteroaryl, deuterated amino, deuterated silyl, deuterated germyl, deuterated alkoxy, deuterated aryloxy, deuterated fluoroalkoxy, deuterated siloxane, deuterated siloxy, and deuterated crosslinking groups. In some embodiments, the substituent is selected from the group consisting of D, alkyl, arylamino, hydrocarbon aryl, deuterated alkyl, deuterated arylamino, and deuterated hydrocarbon aryl.

In some embodiments of the above formulae, $Ar^1$ is a hydrocarbon aryl group.

In some embodiments of the above formulae, $Ar^1$ is a heteroaryl group.

In some embodiments of the above formulae, $Ar^1$ has Formula a

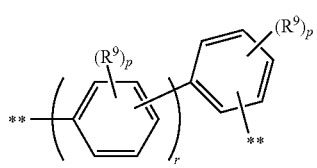

Formula a where:
R$^9$ is the same or different at each occurrence and is selected from the group consisting of D, alkyl, alkoxy, siloxane, silyl, germyl, substituted derivatives thereof, and deuterated analogs thereof, wherein adjacent R$^9$ groups can be joined together to form a fused ring;
p is the same or different at each occurrence and is an integer from 0-4;
r is an integer from 1 to 5; and
** represents a point of attachment.

In some embodiments of the above formulae, $Ar^1$ has Formula b

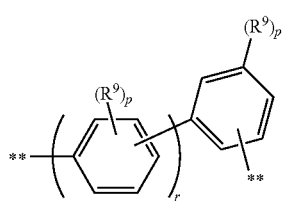

Formula b where R$^9$, p, r and ** are as defined in Formula a.

In some embodiments of the above formulae, $Ar^1$ has Formula c

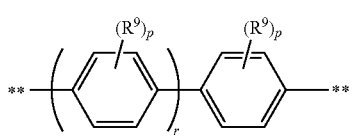

Formula c where R$^9$, p, r and ** are as defined in Formula a.

In some embodiments of the above formulae, $Ar^1$ is selected from the group consisting of phenyl, biphenyl, terphenyl, 1-naphthyl, 2-naphthyl, anthracenyl, fluorenyl, deuterated analogs thereof, and derivatives thereof having one or more substituents selected from the group consisting of fluoro, alkyl, alkoxy, silyl, germyl, siloxy, a substituent with a crosslinking group, and deuterated analogs thereof.

All of the above-described embodiments for $Ar^1$ apply equally to $Ar^3$, $Ar^5$, $Ar^6$, and $Ar^7$.

In some embodiments of the above formulae, $Ar^2$ is an aryl group having at least one fused ring.

In some embodiments of the above formulae, $Ar^2$ is selected from the group consisting of naphthyl, anthracenyl, naphthylphenyl, phenylnaphthyl, fluorenyl, substituted derivatives thereof, and deuterated analogs thereof.

In some embodiments of the above formulae, $Ar^2$ is an aryl group having no fused rings.

In some embodiments of the above formulae, $Ar^2$ is an aryl group or substituted aryl group.

In some embodiments of the above formulae, $Ar^2$ is a hydrocarbon aryl group.

In some embodiments of the above formulae, $Ar^2$ is a heteroaryl group.

In some embodiments of the above formulae, $Ar^2$ has Formula d

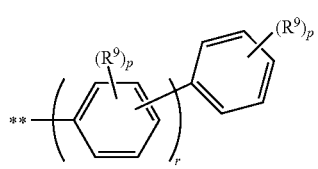

Formula d where:
R$^9$ is the same or different at each occurrence and is selected from the group consisting of D, alkyl, alkoxy, siloxane, silyl, germyl, substituted derivatives thereof, and deuterated analogs thereof, wherein adjacent R$^9$ groups can be joined together to form a fused ring;
p is the same or different at each occurrence and is an integer from 0-4;
q is an integer from 0-5;
r is an integer from 1 to 5; and
** represents a point of attachment.

In some embodiments of Formula I, $Ar^2$ has Formula e

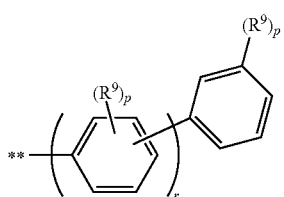

Formula e where R$^9$, p, r and ** are as defined in Formula d.

In some embodiments of Formula I, $Ar^2$ has Formula f

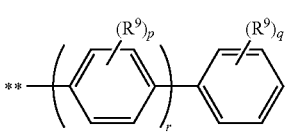

Formula f where R$^9$, p, q, r, and ** are as defined in Formula d.

In some embodiments of the above formulae, $Ar^2$ is selected from the group consisting of phenyl, biphenyl, terphenyl, 1-naphthyl, 2-naphthyl, anthracenyl, fluorenyl, deuterated analogs thereof, and derivatives thereof having one or more substituents selected from the group consisting of fluoro, alkyl, alkoxy, silyl, germyl, siloxy, a substituent with a crosslinking group, and deuterated analogs thereof.

In some embodiments of the above formulae, g=0.
In some embodiments of the above formulae, g=1.
In some embodiments of the above formulae, g>0.
In some embodiments of the above formulae, g1=0.
In some embodiments of the above formulae, g1=1.
In some embodiments of the above formulae, g1>0.
In some embodiments of the above formulae, k=0.
In some embodiments of the above formulae, k=1.
In some embodiments of the above formulae, k>0.
In some embodiments of the above formulae, k1=0.
In some embodiments of the above formulae, k1=1.
In some embodiments of the above formulae, k1>0.
In some embodiments of the above formulae, p=0.
In some embodiments of the above formulae, p=1.
In some embodiments of the above formulae, p>0.
In some embodiments of the above formulae, q=0.
In some embodiments of the above formulae, q=1.
In some embodiments of the above formulae, q>0.
In some embodiments of the above formulae, r=1.
In some embodiments of the above formulae, r=2.
In some embodiments of the above formulae, r=3.

In some embodiments of the above formulae, $R^1$ is D or $C_{1-10}$ alkyl. In some embodiments, the alkyl group is deuterated.

In some embodiments of the above formulae, $R^1$ is $C_{1-10}$ silyl. In some embodiments, the silyl group is deuterated.

In some embodiments of the above formulae, $R^1$ is $C_{6-20}$ aryl or $C_{6-20}$ deuterated aryl. In some embodiments, the aryl group is a hydrocarbon aryl. In some embodiments, the aryl is a $C_{3-20}$ heteroaryl.

In some embodiments of the above formulae, $R^1$ is an amino group. In some embodiments, the amino group is deuterated.

All of the above-described embodiments for $R^1$ apply equally to $R^2$, $R^3$, $R^4$, $R^5$, and $R^9$.

Any of the above embodiments for the above formulae can be combined with one or more of the other embodiments, so long as they are not mutually exclusive. The skilled person would understand which embodiments were mutually exclusive and would thus readily be able to determine the combinations of embodiments that are contemplated by the present application.

Some non-limiting examples of monomeric unit A are shown below.

A1

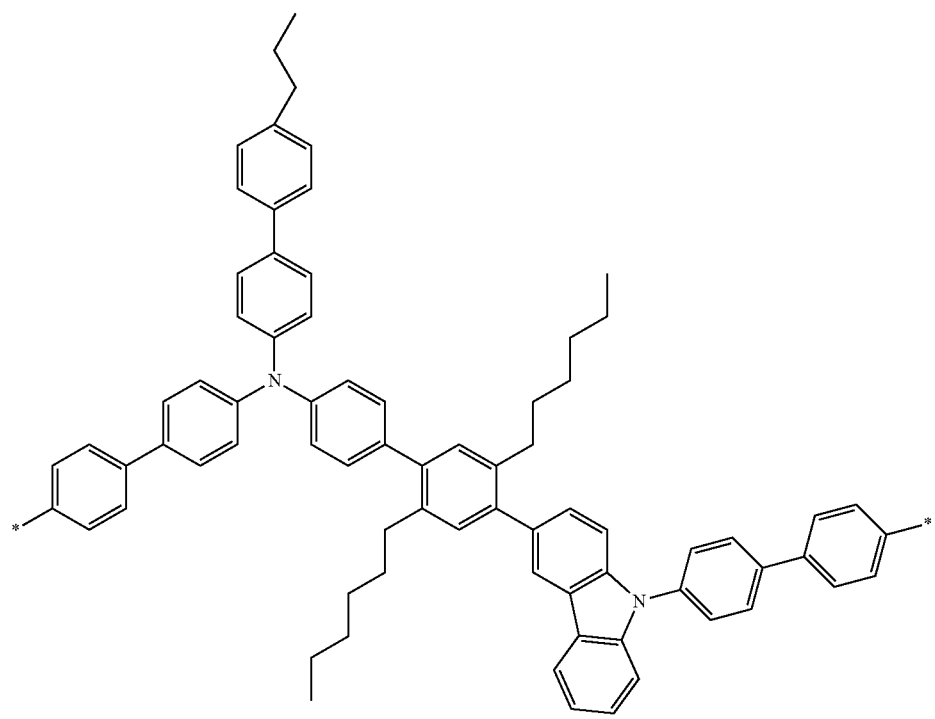
A2
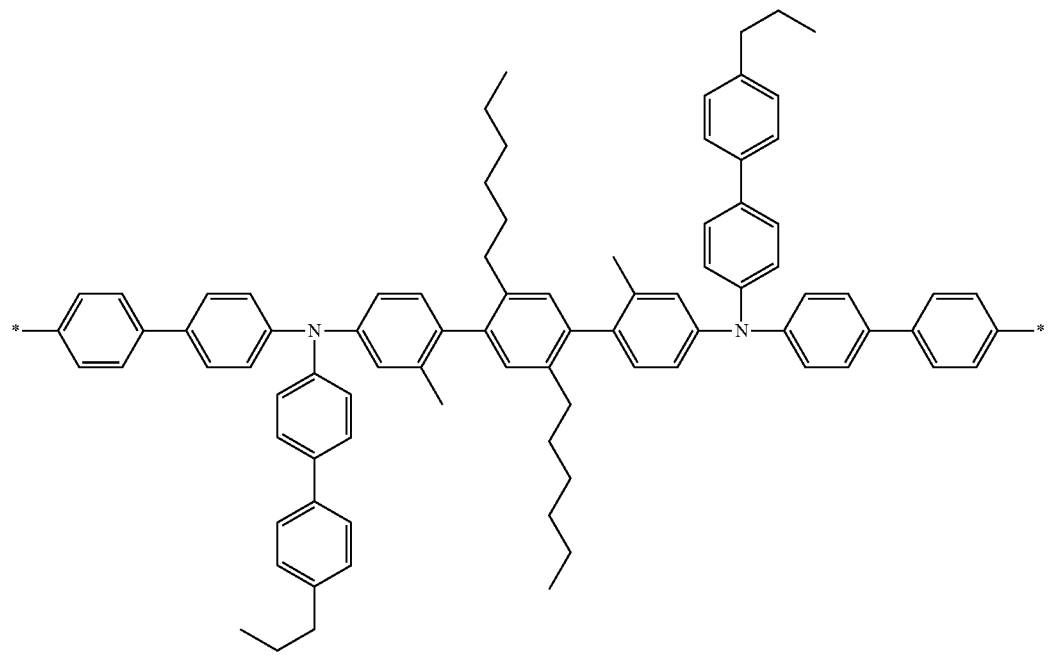
A3

-continued
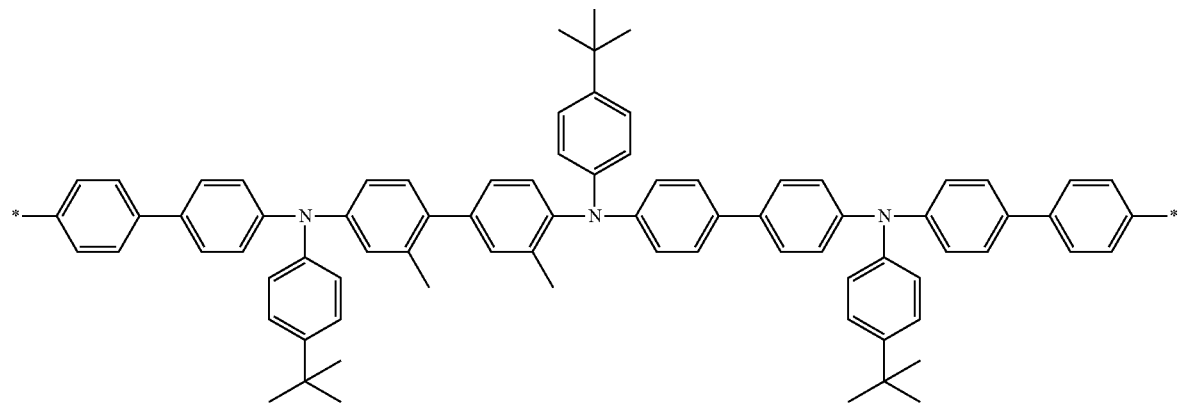
A4
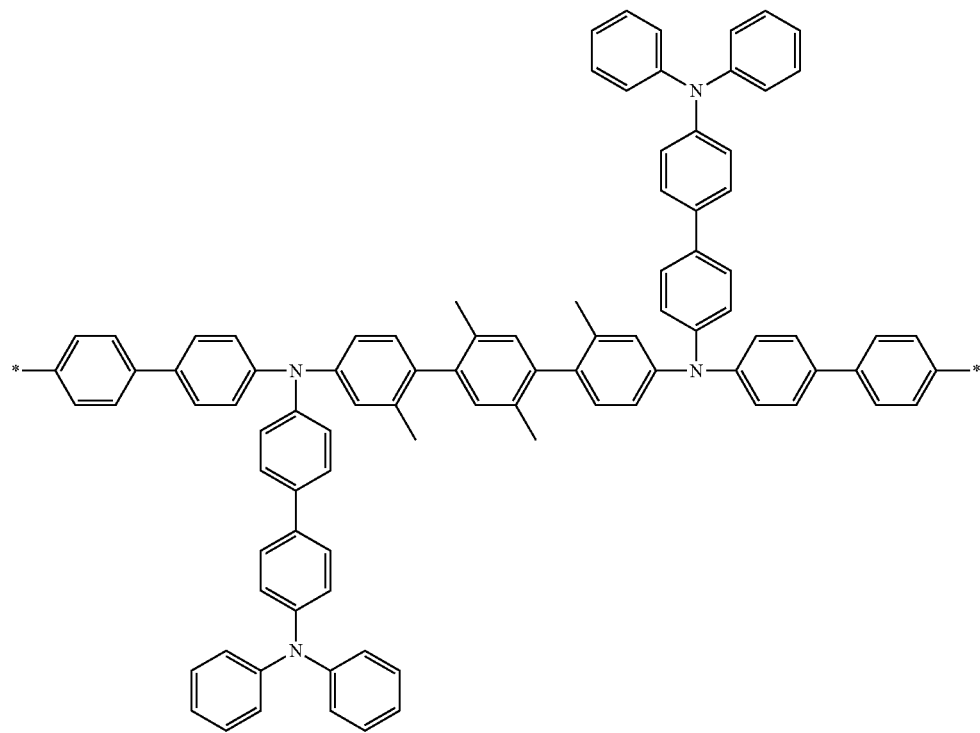
A5

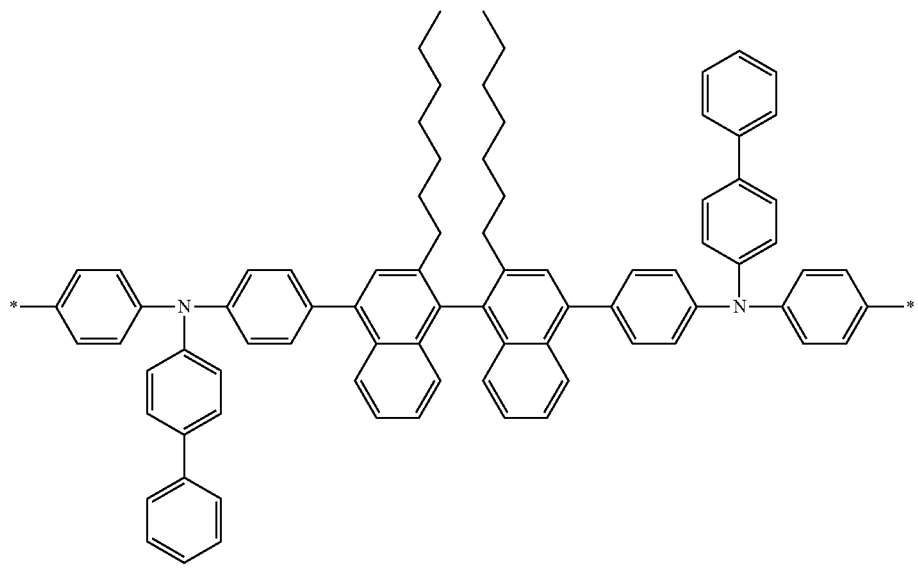

A6

Monomeric unit B' is a multifunctional branching monomeric unit having at least three points of attachment in the copolymer.

In some embodiments, monomeric unit B' has 3-6 points of attachment.

In some embodiments, monomeric unit B' has three points of attachment.

In some embodiments, monomeric unit B' has four points of attachment.

In some embodiments, monomeric unit B' has five points of attachment.

In some embodiments, monomeric unit B' has six points of attachment.

In some embodiments, monomeric unit B' is aromatic.

In some embodiments, monomeric unit B' has no ring heteroatoms.

In some embodiments, monomeric unit B' is aromatic with alkyl branching groups.

In some embodiments, monomeric unit B' is aromatic with aromatic branching groups.

In some embodiments, monomeric unit B' is a triarylamine group.

In some embodiments, monomeric unit B' has Formula VI

(VI)

wherein:
- Z is selected from the group consisting of C, Si, Ge, N, a cyclic aliphatic moiety, an aromatic moiety, a deuterated cyclic aliphatic moiety, or a deuterated aromatic moiety having at least three bonding positions;
- Y is a single bond, an alkyl, an aromatic moiety, a deuterated alkyl, or a deuterated aromatic moiety, provided that when Y is a single bond, alkyl, or deuterated alkyl, Z is an aromatic or deuterated aromatic moiety;
- s is an integer from 3 to the maximum number of bonding positions available on Z; and
- * represents a point of attachment in the copolymer.

In some embodiments, monomeric unit B' has one of Formula VII, Formula VIII, Formula IX, Formula X, and Formula XI

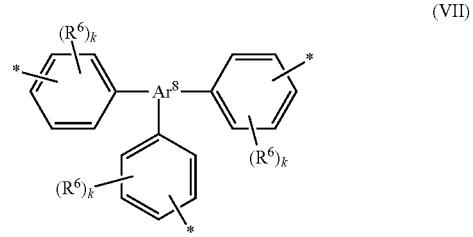

(VII)

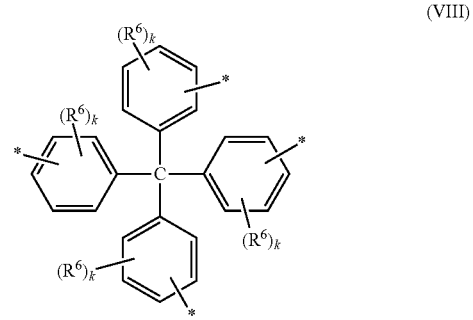

(VIII)

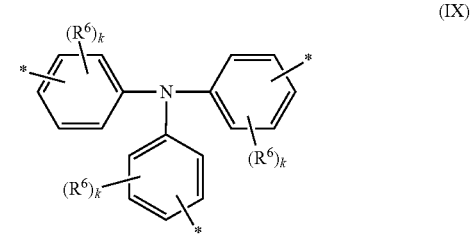

(IX)

-continued

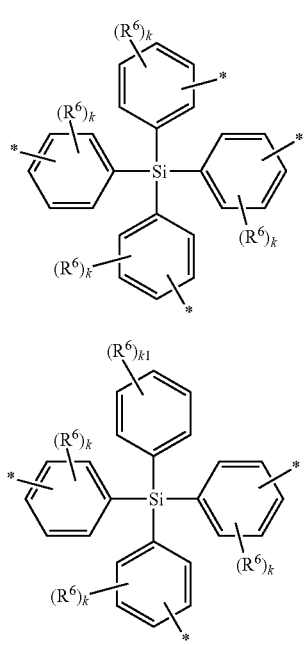

(X)

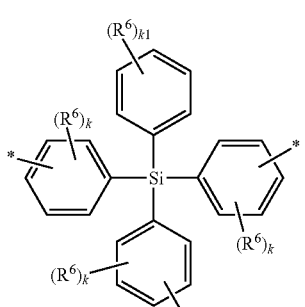

(XI)

wherein:
Ar⁸ is an aromatic moiety or a deuterated aromatic moiety having at least three bonding positions;
R⁶ is independently the same or different at each occurrence and is selected from the group consisting of D, F, CN, alkyl, fluoroalkyl, aryl, heteroaryl, amino, silyl, germyl, alkoxy, aryloxy, fluoroalkoxy, siloxane, siloxy, deuterated alkyl, deuterated partially-fluorinated alkyl, deuterated aryl, deuterated heteroaryl, deuterated amino, deuterated silyl, deuterated germyl, deuterated alkoxy, deuterated aryloxy, deuterated fluoroalkoxy, deuterated siloxane, deuterated siloxy, and crosslinking groups, wherein adjacent R⁶ groups can be joined together to form a fused 5- or 6-membered aromatic ring;
k is the same or different at each occurrence and is an integer from 0 to 4;
k1 is an integer from 0 to 5; and
* represents a point of attachment in the copolymer.

In some embodiments of Formula VI Z is an aromatic moiety derived from a compound selected from benzene, naphthalene, anthracene, phenanthrene, substituted derivatives thereof, and deuterated analogs thereof.

Some non-limiting examples of monomeric unit B' are shown below.

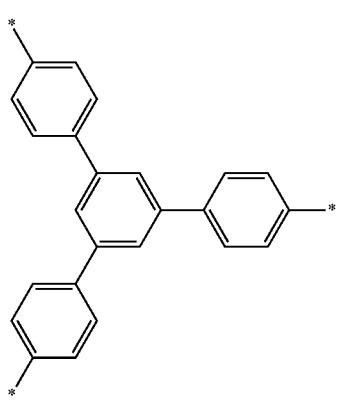

B1

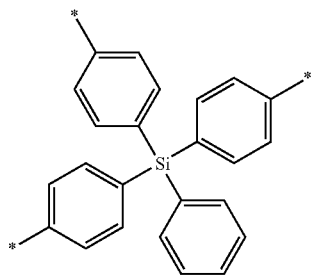

B2

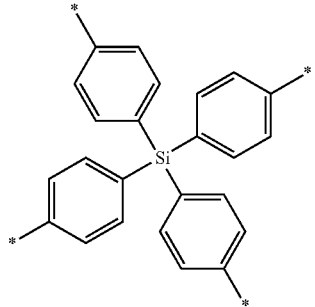

B3

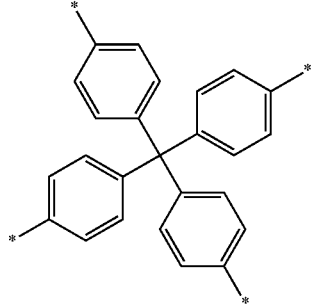

B4

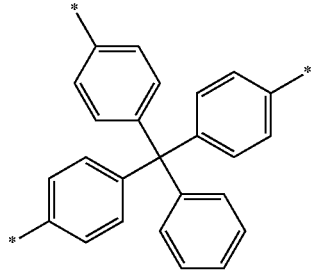

B5

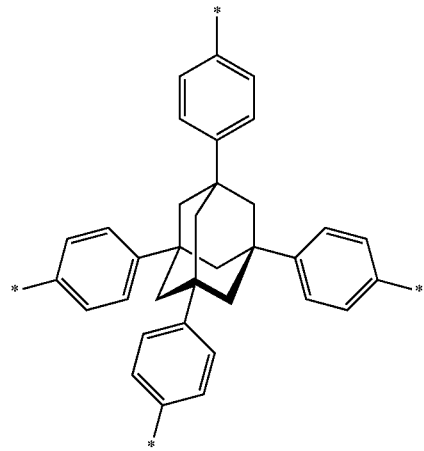

B6

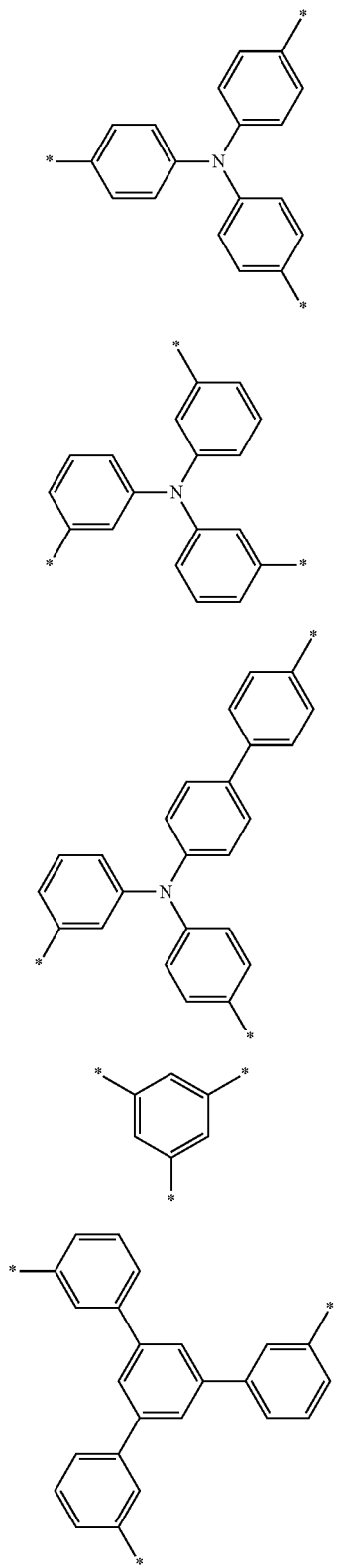
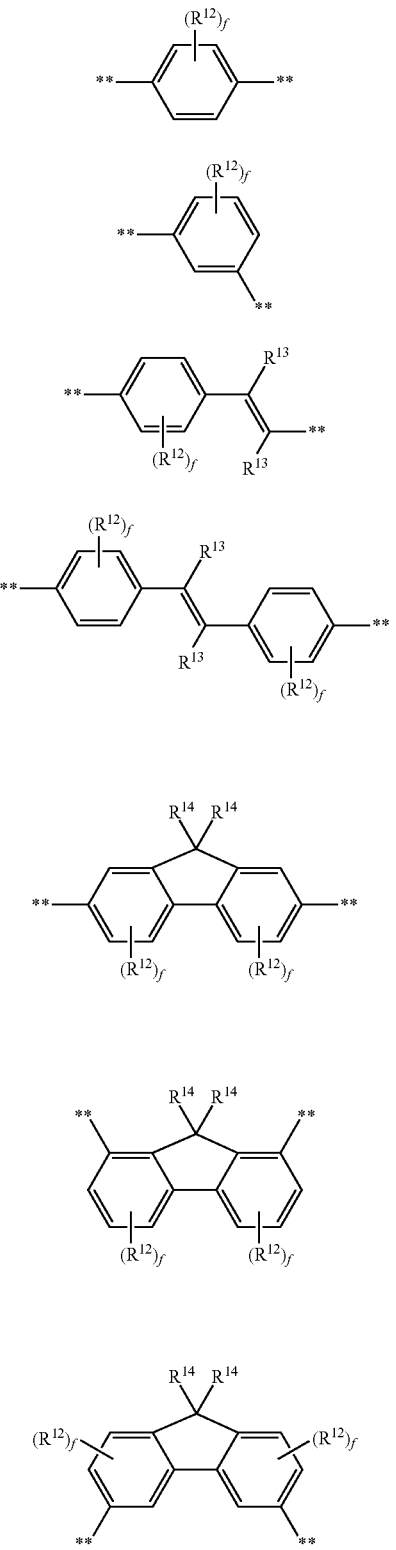
Monomeric unit C' is an optional monomeric unit that is aromatic.
Monomeric unit C' is a difunctional monomeric unit having only two points of attachment.
In some embodiments, monomeric unit C' includes a crosslinking group or deuterated crosslinking group.
In some embodiments, C' has one of the formulae given below.

-continued
M8
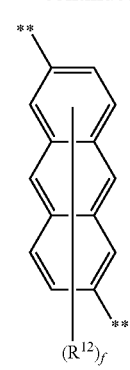
M9
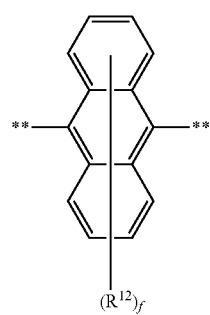
M10
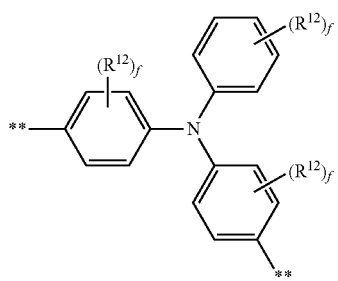
M11
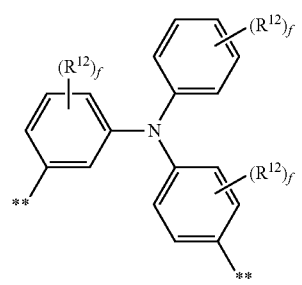
M12
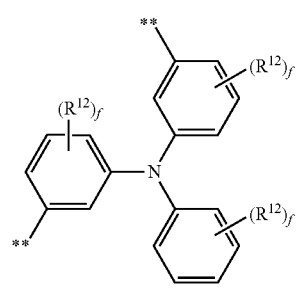
M13
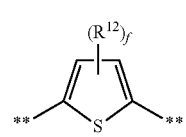
-continued
M14
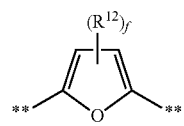
M15
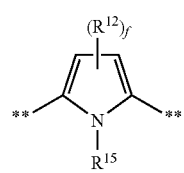
M16
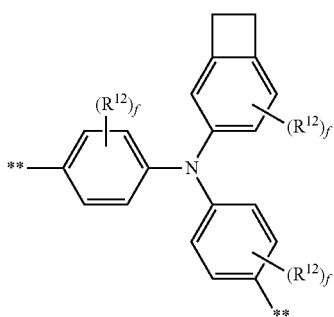
M17
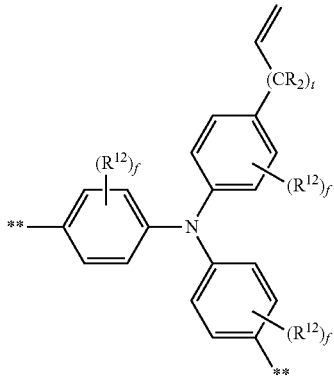
M18
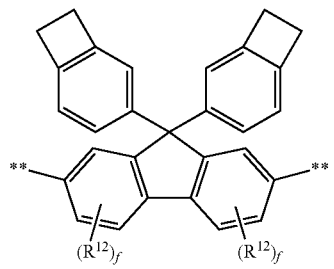
M19
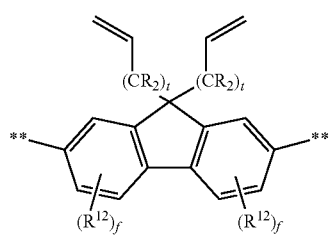
In M1 through M19:
$R^{12}$ is the same or different at each occurrence and is selected from the group consisting of D, alkyl, silyl, germyl, aryl, deuterated alkyl, deuterated silyl, deuterated germyl, and deuterated aryl;

$R^{13}$ is the same or different at each occurrence and is selected from the group consisting of H, D, alkyl, and deuterated alkyl;

$R^{14}$ is the same or different at each occurrence and is selected from the group consisting of alkyl, aryl, and deuterated analogs thereof;

$R^{15}$ is the same or different at each occurrence and is selected from the group consisting of aryl and deuterated aryl;

f is the same or different at each occurrence and is an integer from 0 to the maximum number of positions available for substituents;

t is an integer of 0-20; and

** represents a point of attachment.

In some embodiments of M1 through M19, f is 0-2.

In some embodiments of M1 through M19, t is 1-3.

Some non-limiting examples of optional monomeric unit C' are shown below.

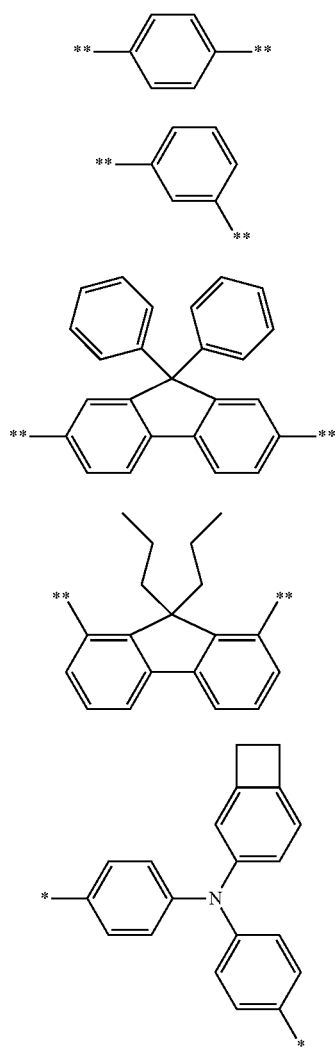

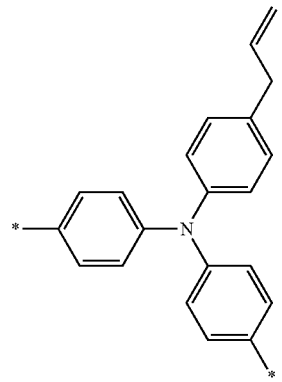

Unit E is an end-capping unit for the copolymer.

Unit E is a monofunctional unit having only one point of attachment.

In some embodiments of Formula I, E is H or D.

In some embodiments of Formula I, E is a monofunctional monomeric unit.

In some embodiments of Formula I, E is a crosslinking group or deuterated crosslinking group.

In some embodiments of Formula I, E is a hydrocarbon aryl group or deuterated hydrocarbon aryl group.

In some embodiments of Formula I, E is selected from aryl, arylamino, crosslinking groups, and deuterated analogs thereof.

In some embodiments of Formula I, E is selected from the group consisting of phenyl, biphenyl, diphenylamino, substituted derivatives thereof, and deuterated analogs thereof. In some embodiments, the substituent is a $C_{1-10}$ alkyl group, crosslinking group, or deuterated analog thereof.

Some non-limiting examples of E are shown below.

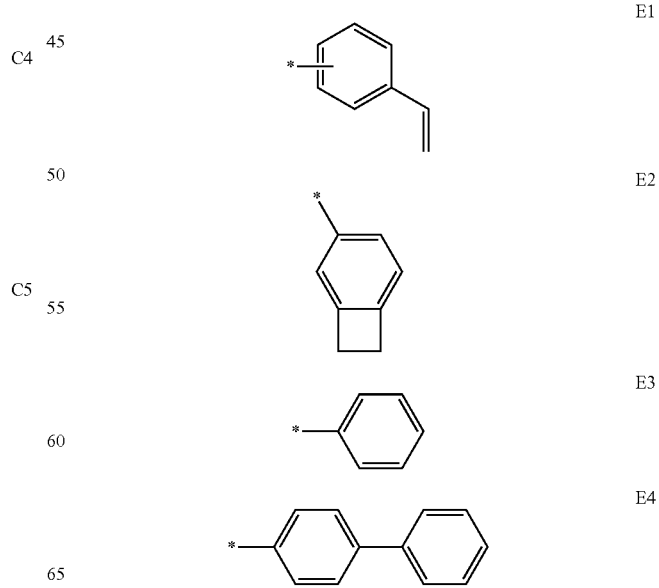

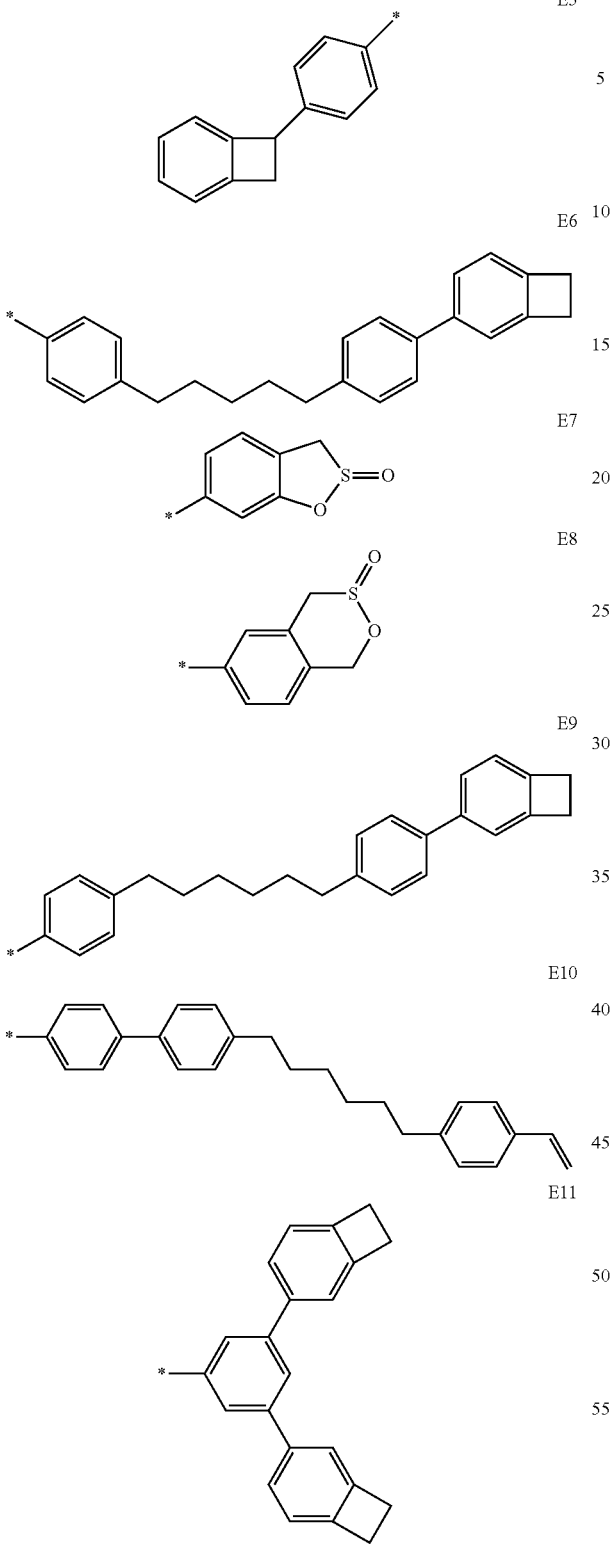

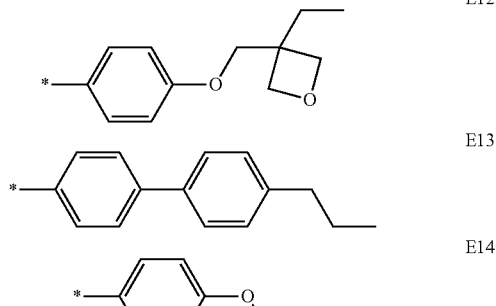

where * represents a point of attachment in the copolymer.

In some embodiments of Formula I, a≥0.50.
In some embodiments of Formula I, a=0.50-0.99.
In some embodiments of Formula I, a=0.60-0.90.
In some embodiments of Formula I, a=0.65-0.80.
In some embodiments of Formula I, b≥0.05; in some embodiments b≥0.10.
In some embodiments of Formula I, b=0.01-0.50.
In some embodiments of Formula I, b=0.05-0.45.
In some embodiments of Formula I, b=0.10-0.40.
In some embodiments of Formula I, b=0.20-0.35.
In some embodiments of Formula I, c=0.
In some embodiments of Formula I, c=0-0.20.
In some embodiments of Formula I, c=0.01-0.20.
In some embodiments of Formula I, c=0.05-0.15

In some embodiments of Formula I, the molar ratio of A+B' to E is in the range of 40:60 to 98:2; in some embodiments, 50:50 to 90:10; in some embodiments, 60:40 to 80:20.

In some embodiments of Formula I', a1=0.30-0.90.
In some embodiments of Formula I', a1=0.40-0.80.
In some embodiments of Formula I', a1=0.50-0.80.
In some embodiments of Formula I', b1=0.05-0.40.
In some embodiments of Formula I', b1=0.10-0.30.
In some embodiments of Formula I', b1=0.10-0.20.
In some embodiments of Formula I', c1=0.
In some embodiments of Formula I', c1=0-0.15.
In some embodiments of Formula I', c1=0.01-0.15.
In some embodiments of Formula I', c1=0.05-0.12.
In some embodiments of Formula I', e1=0.05-0.60.
In some embodiments of Formula I', e1=0.10-0.50.
In some embodiments of Formula I', e1=0.15-0.35.

Some non-limiting examples of copolymers having Formula I are shown below, using Formula I' format.

Copolymer Type 1

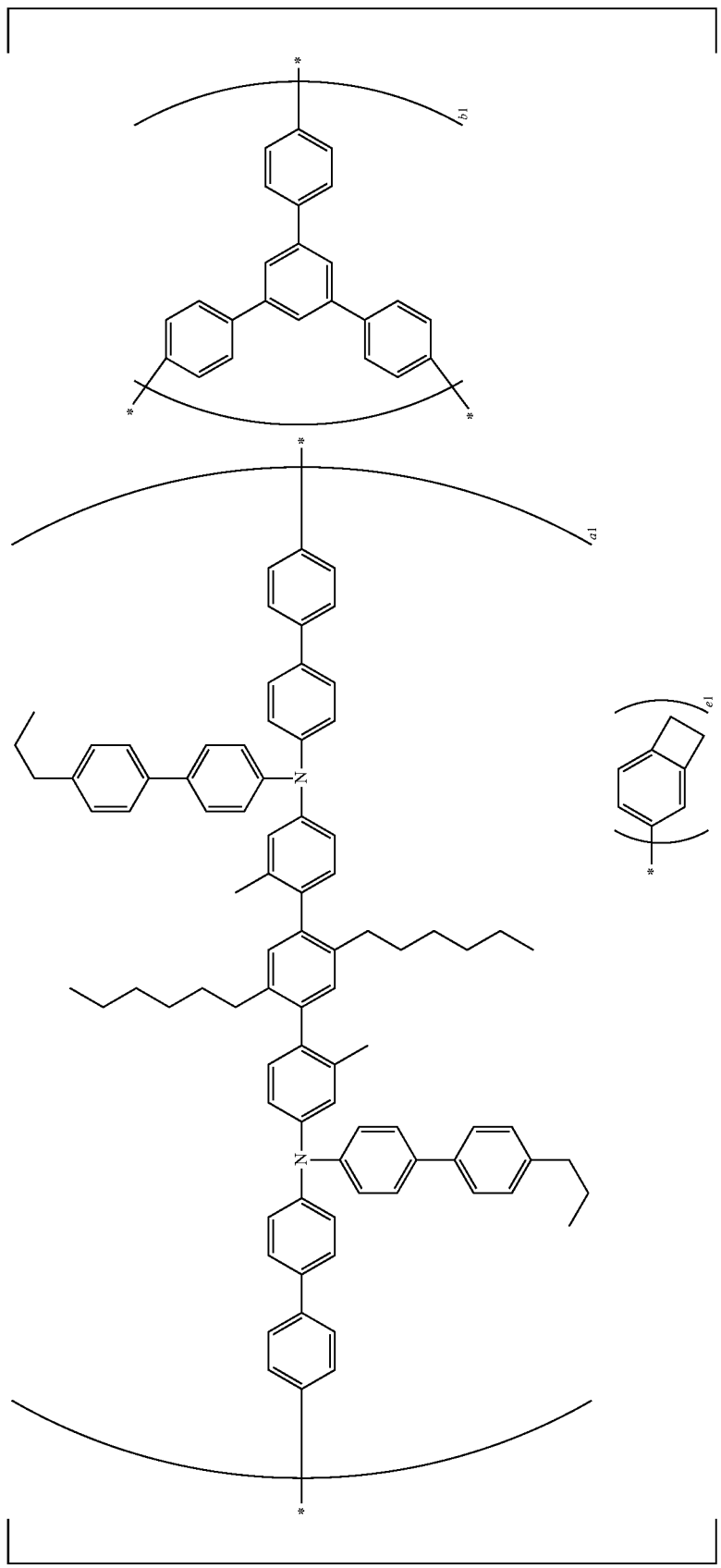

In Copolymer Type 1, c1=0 and no monomeric unit C' is present. The end-capping unit E is a crosslinking group.

Copolymer Type 2

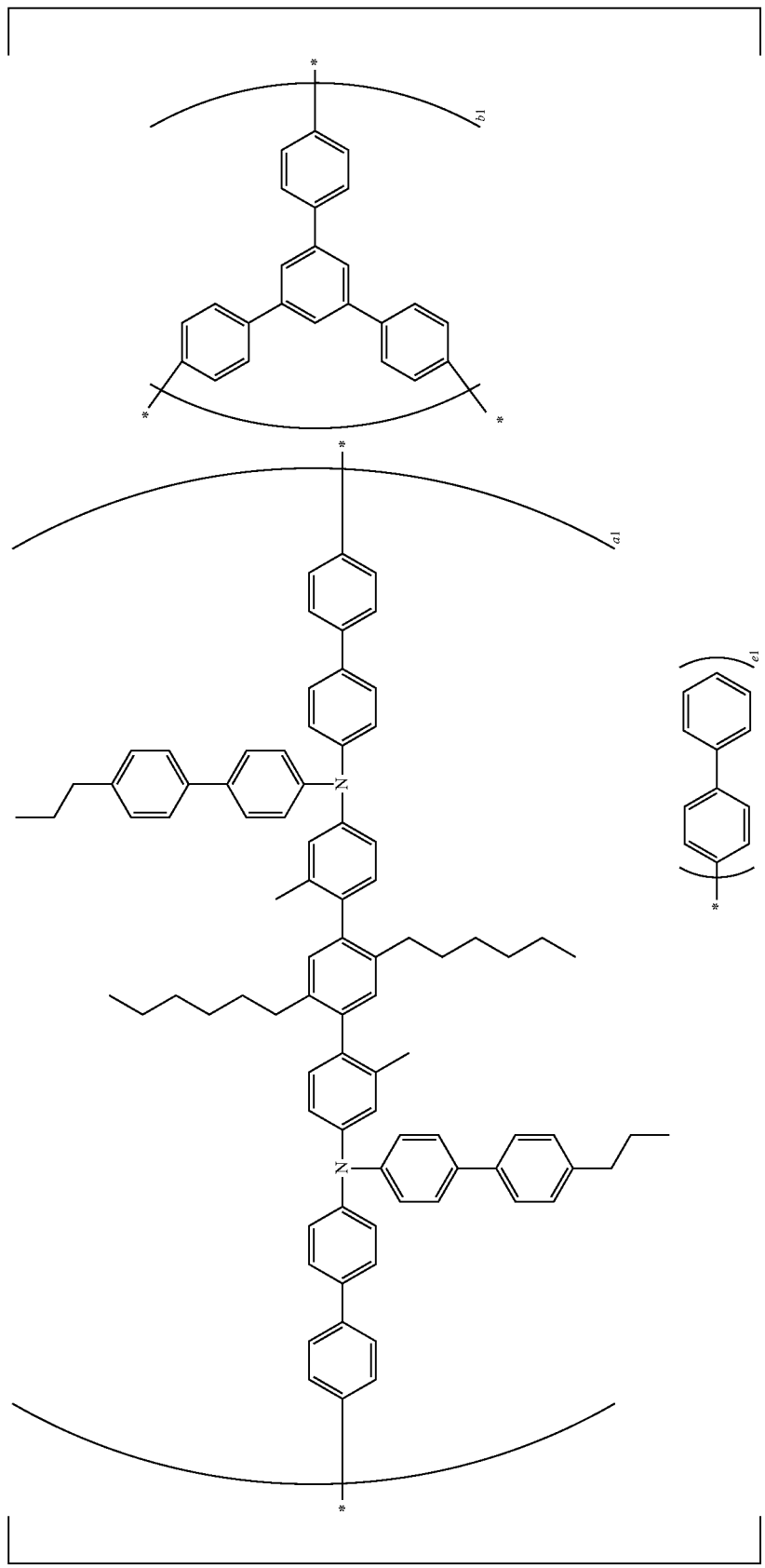

In Copolymer Type 2, c1=0 and no monomeric unit C' is present. The end-capping unit E is an aryl group.

Copolymer Type 3

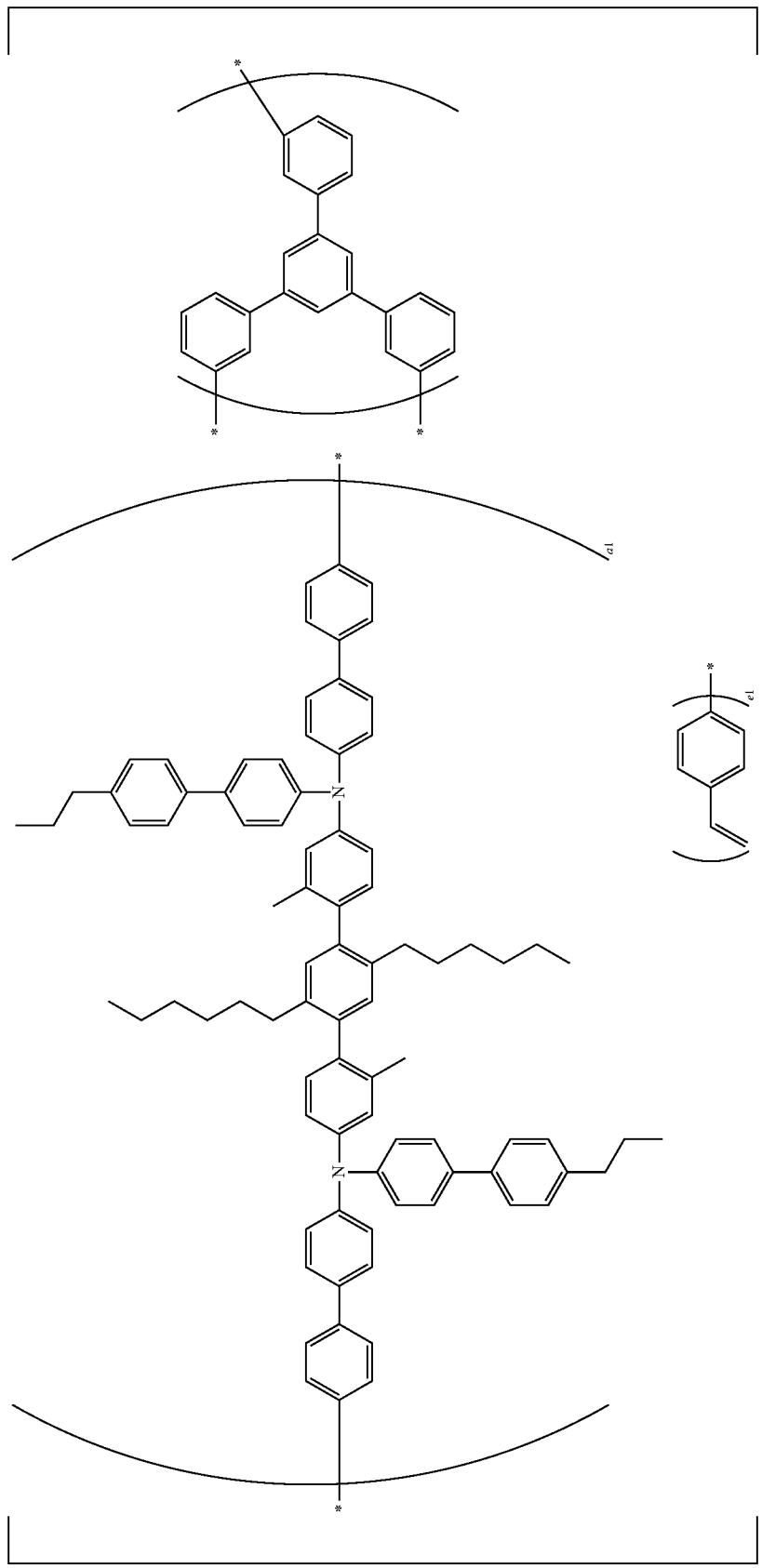

In Copolymer Type 3, c1=0 and no monomeric unit C' is present. The end-capping unit E is a crosslinking group.

Copolymer Type 4

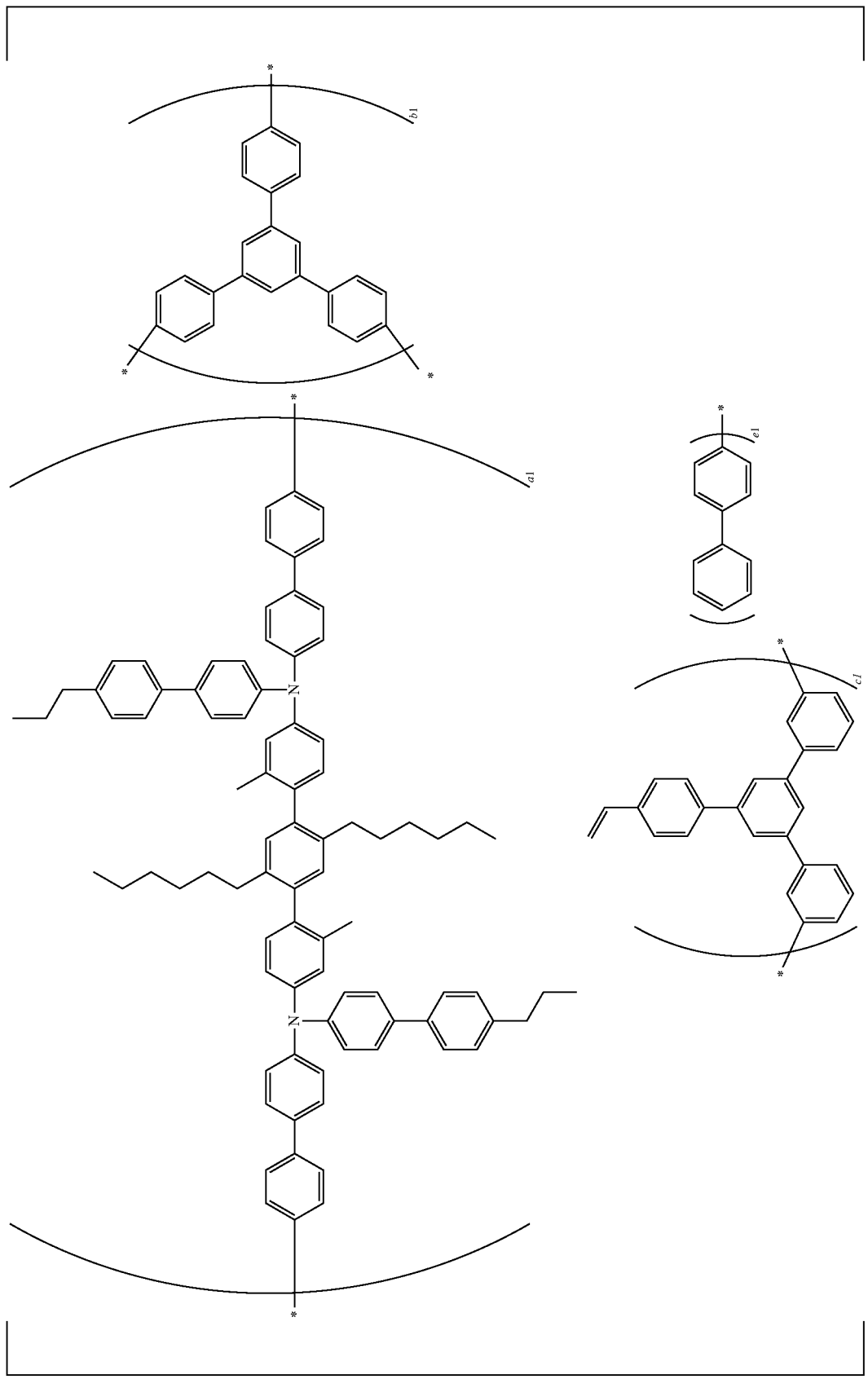

In Copolymer Type 4, monomeric unit C' is present and includes a crosslinking group. The end-capping unit E is an aryl group.
Copolymer Type 5

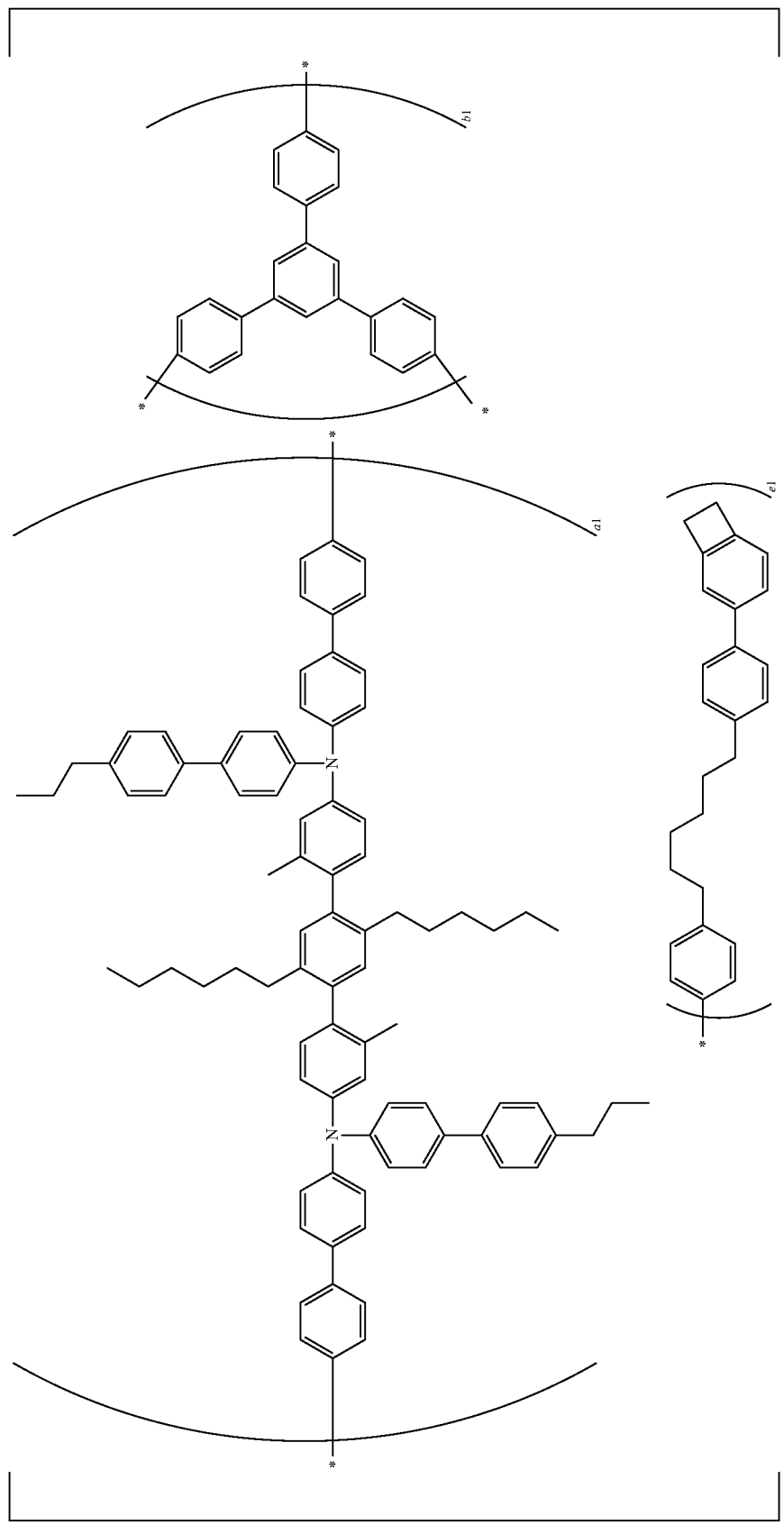

In Copolymer Type 5, c1=0 and no monomeric unit C' is present. The end-capping unit E is a crosslinking group.

Copolymer Type 6

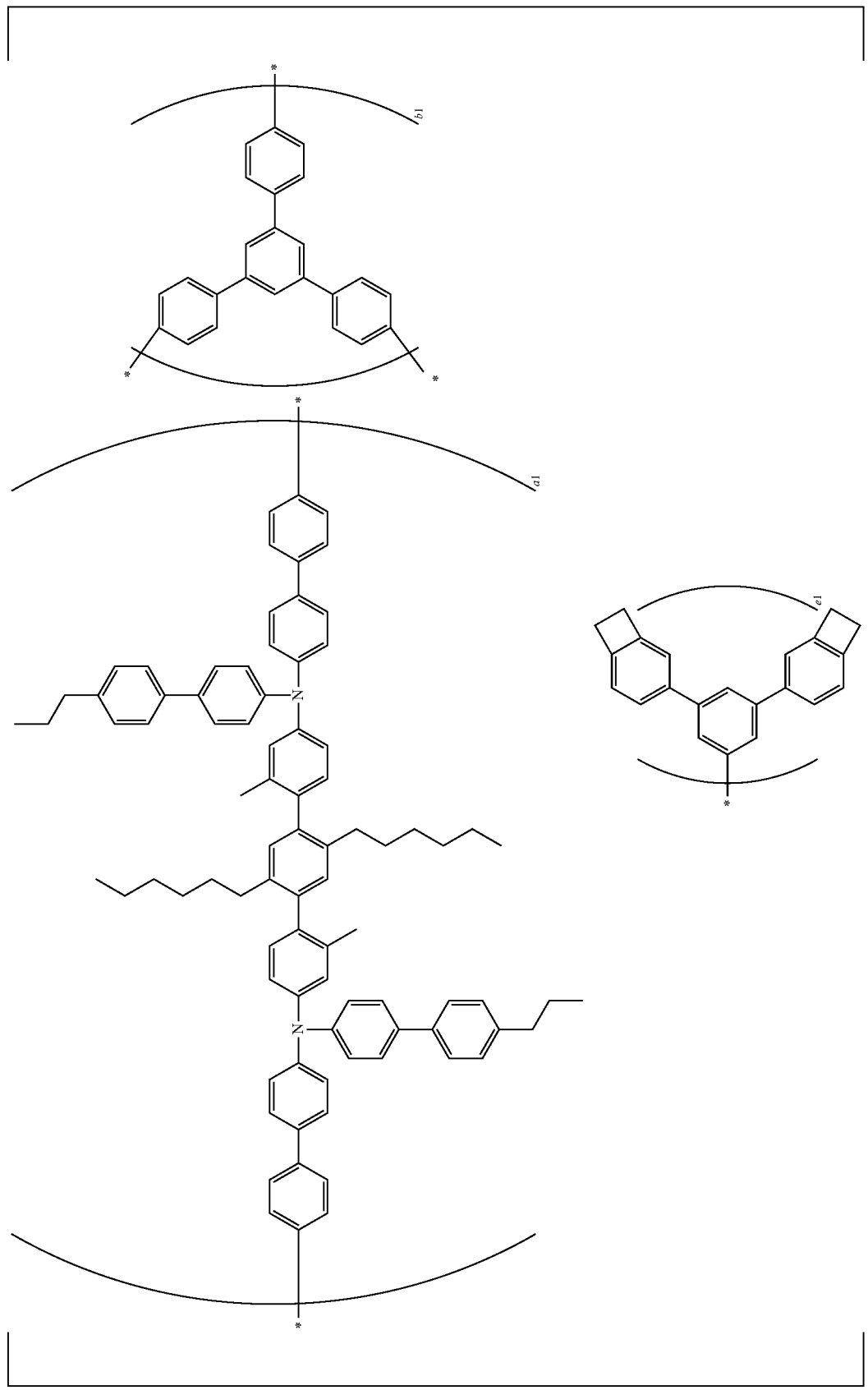

In Copolymer Type 6, c1=0 and no monomeric unit C' is present. The end-capping unit E is a crosslinking group.
Copolymer Type 7

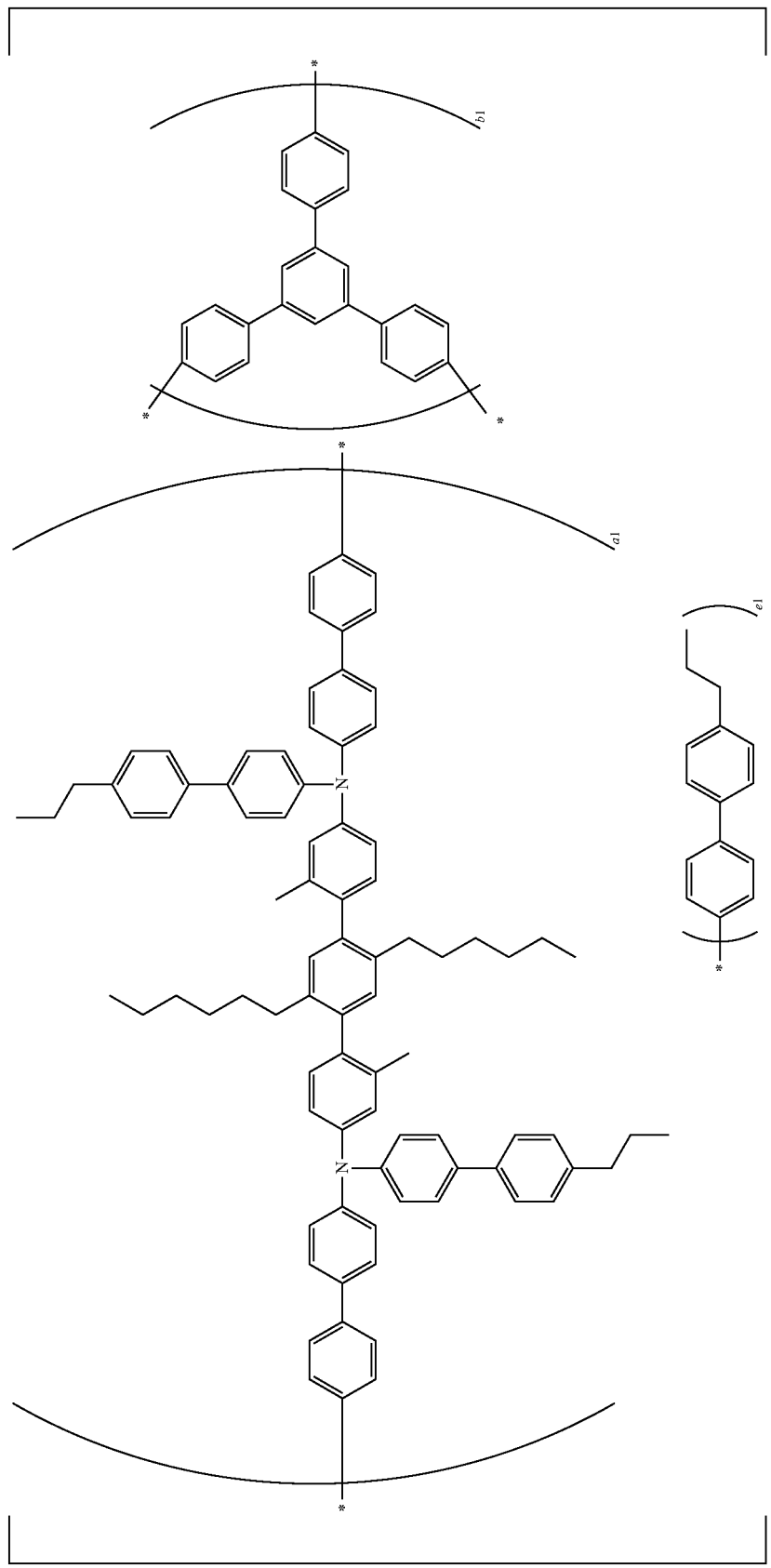

In Copolymer Type 7, c1=0 and no monomeric unit C' is present. The end-capping unit E is an aryl group.

Copolymer Type 8

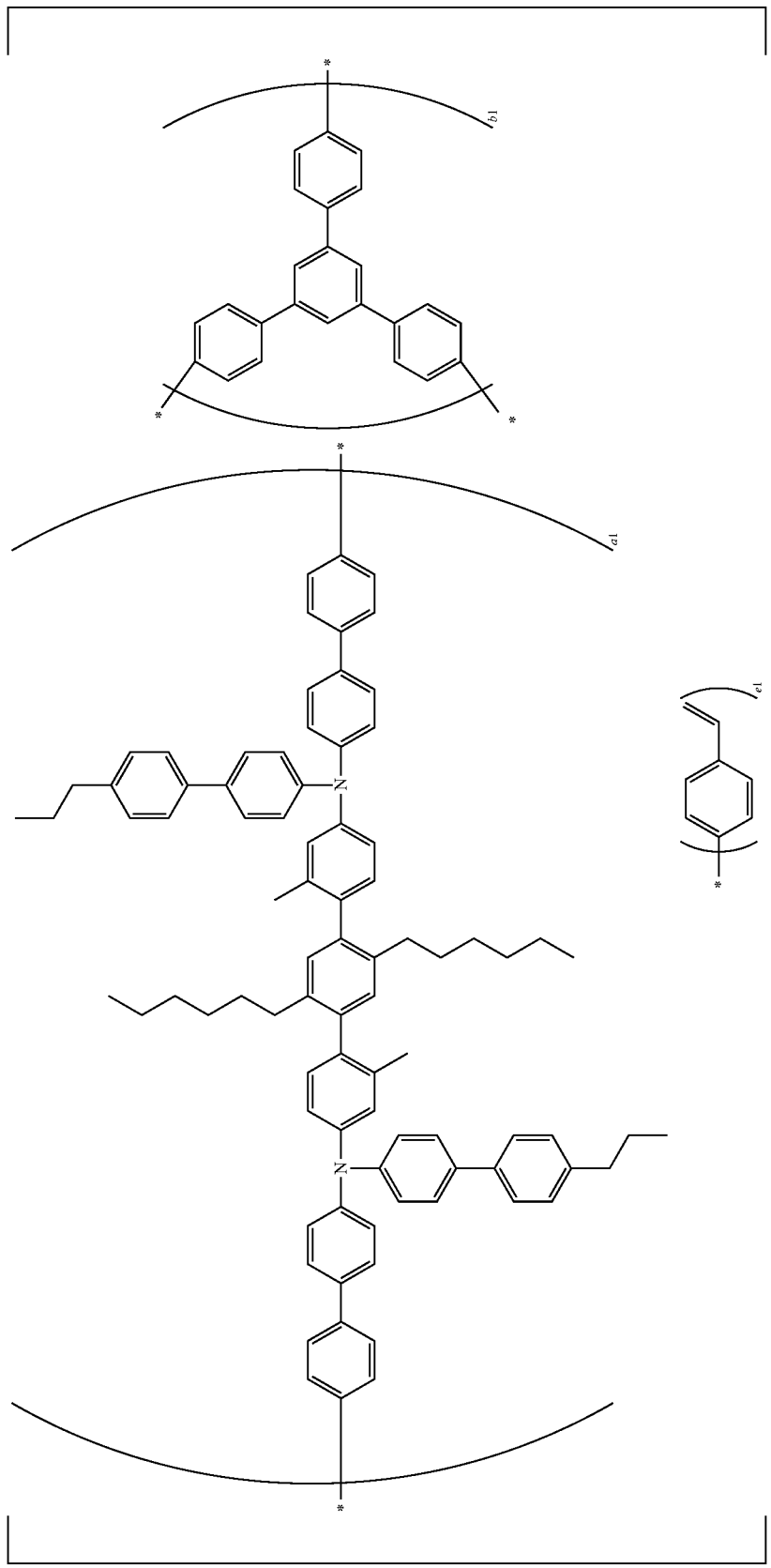

In Copolymer Type 8, c1=0 and no monomeric unit C' is present. The end-capping unit E is a crosslinking group.

Copolymer Type 9

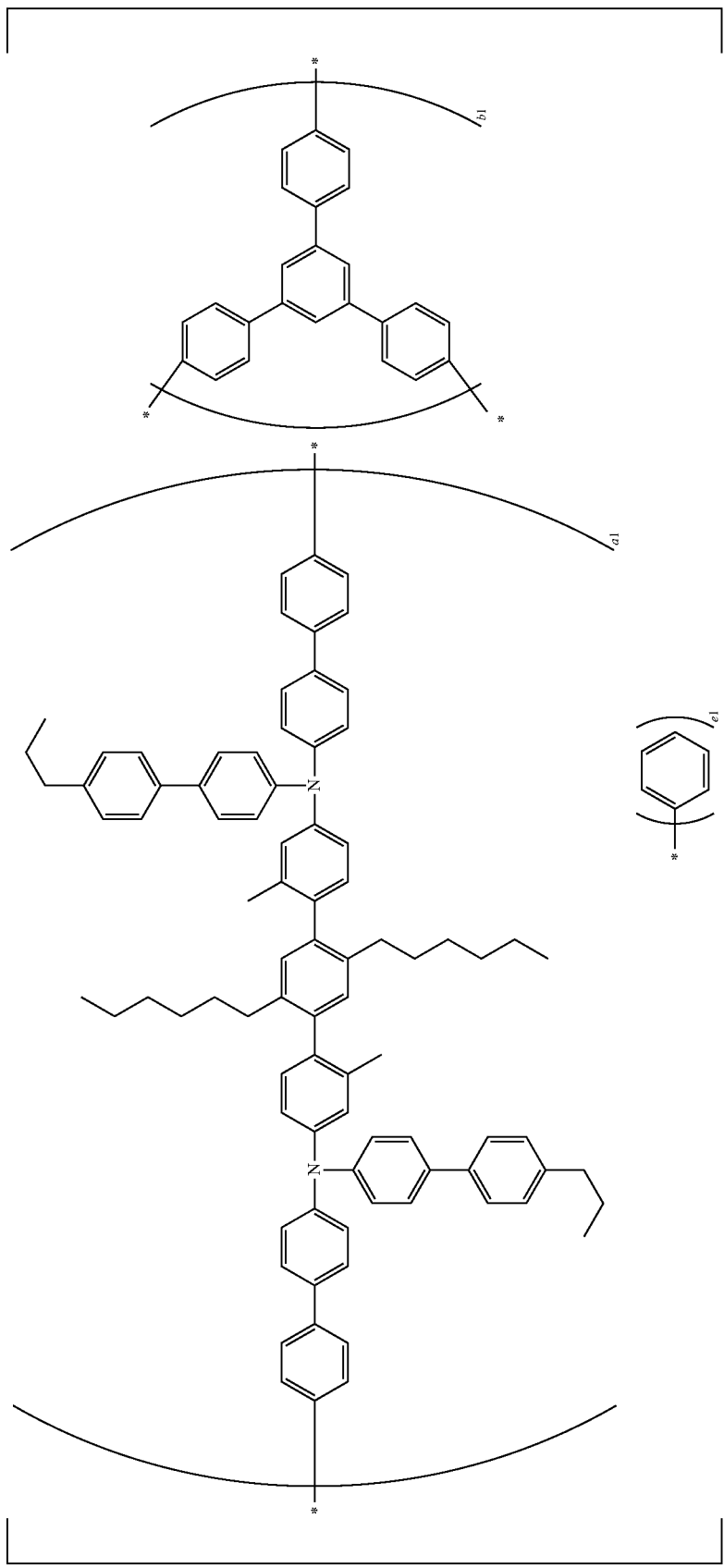

In Copolymer Type 9, $c1=0$ and no monomeric unit C' is present. The end-capping unit E is an aryl group.
Copolymer Type 10

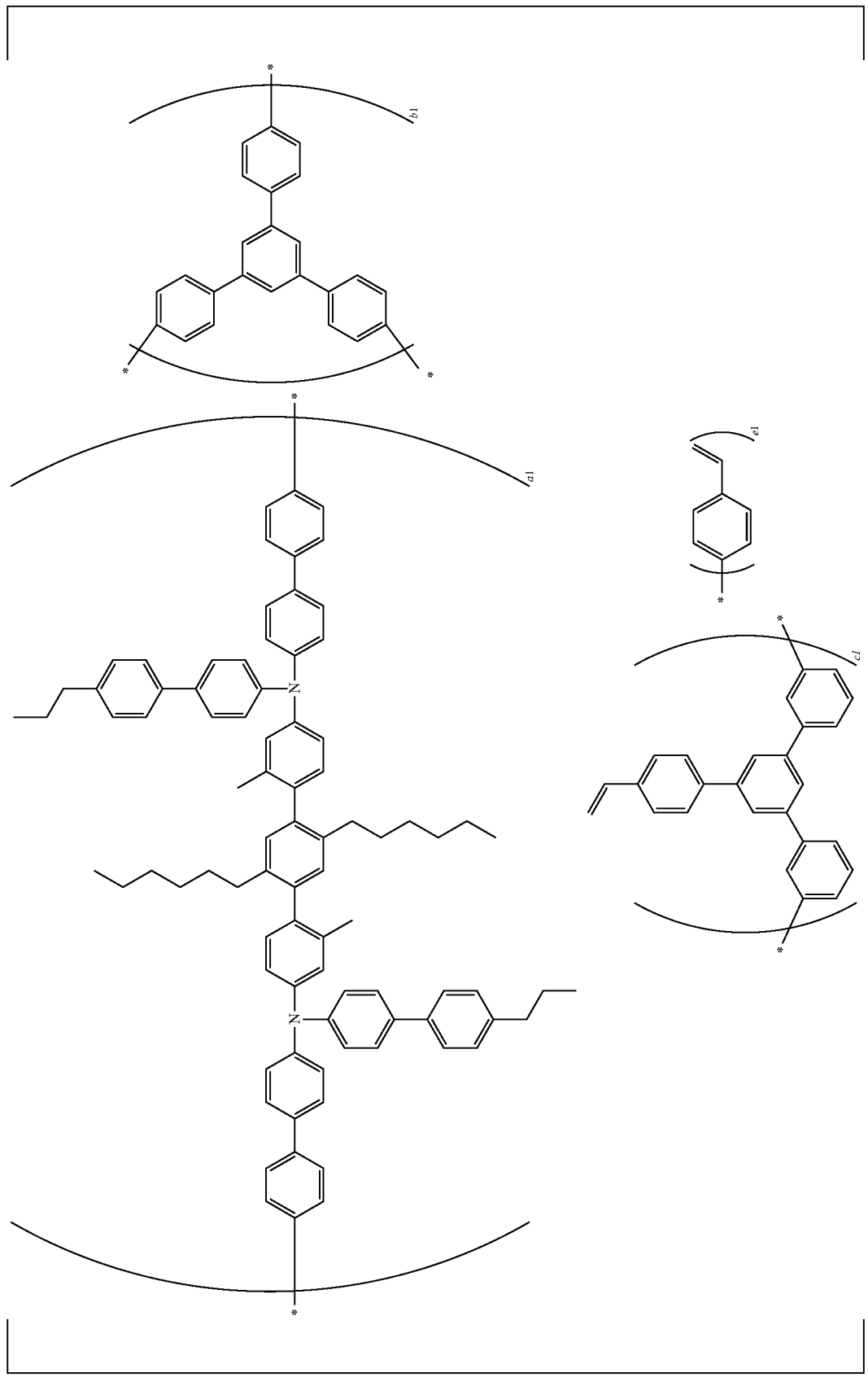

In Copolymer Type 10, monomeric unit C' is present and includes a crosslinking group. The end-capping unit E is a crosslinking group.
Copolymer Type 11

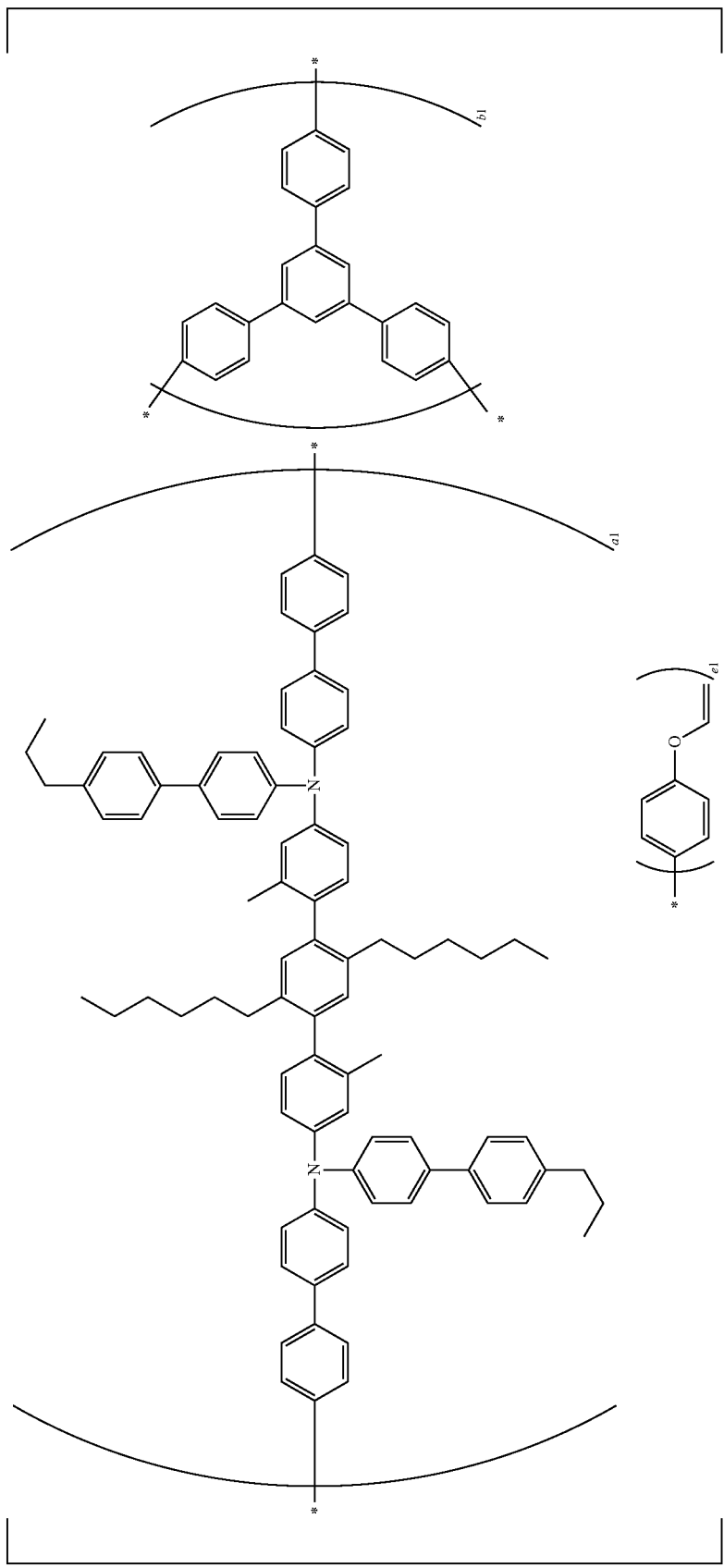

In Copolymer Type 11, c1=0 and no monomeric unit C' is present. The end-capping unit E is a crosslinking group.

Copolymer Type 12

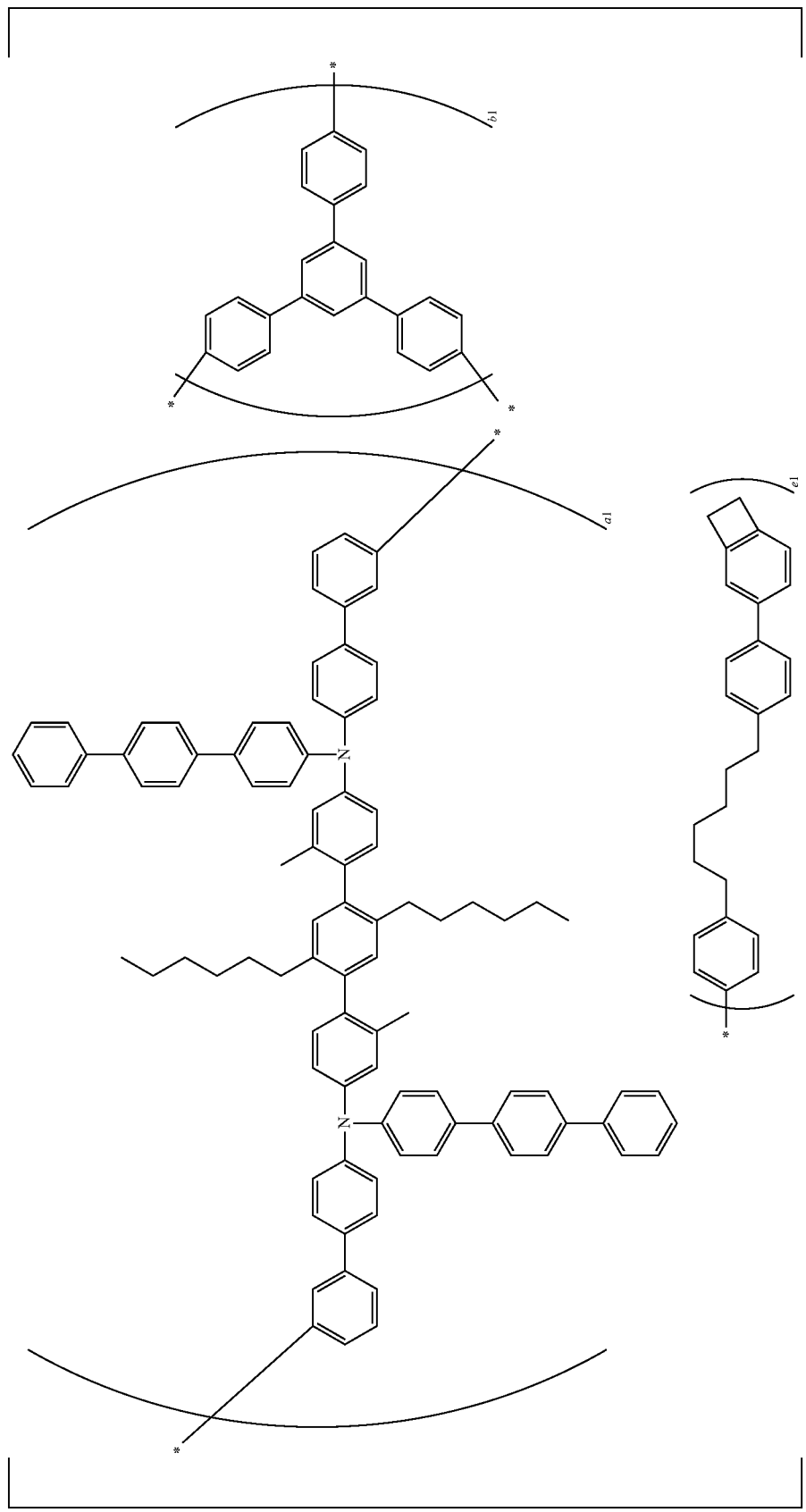

In Copolymer Type 12, c1=0 and no monomeric unit C' is present. The end-capping unit E includes a crosslinking group.

Copolymer Type 13

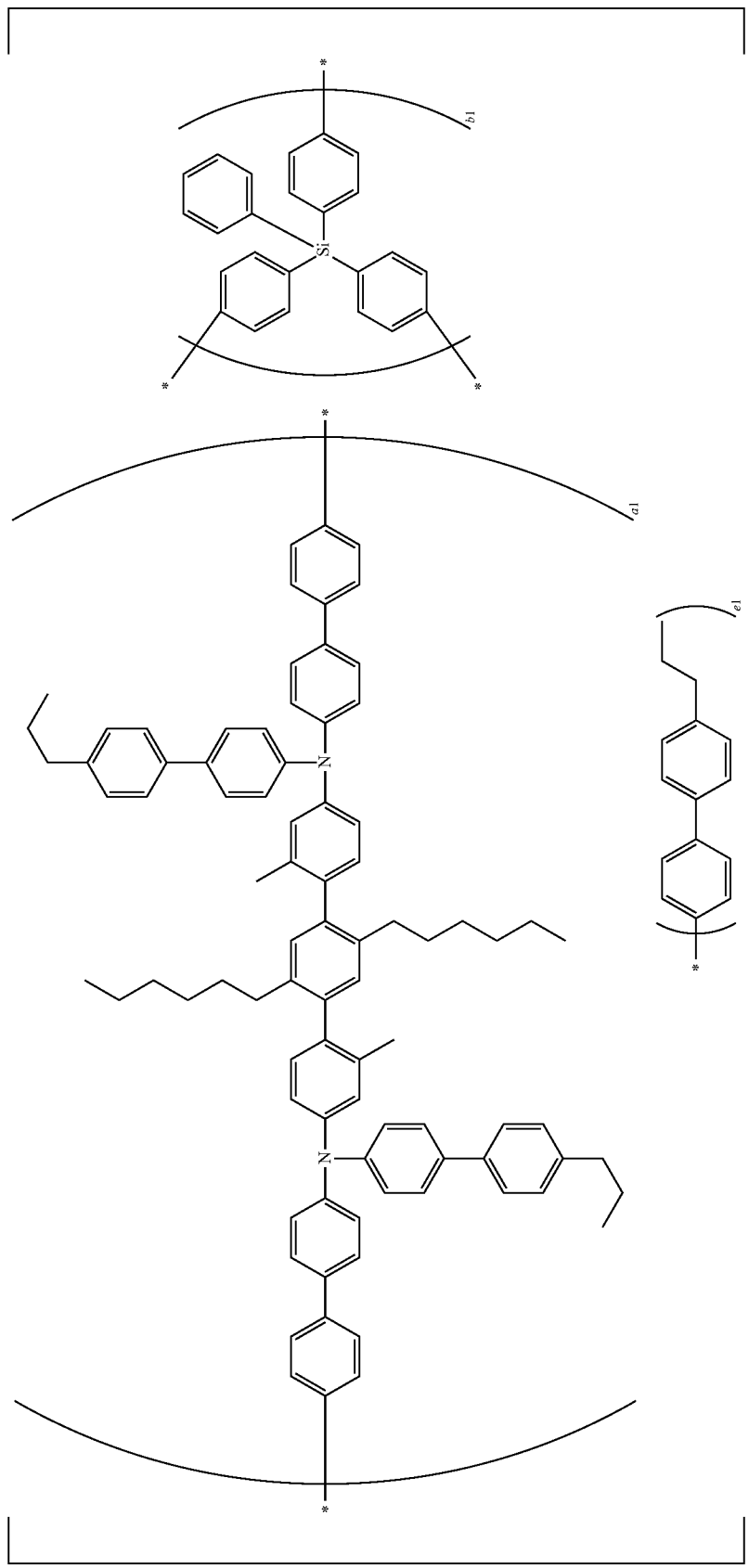

In Copolymer Type 13, c1=0 and no monomeric unit C' is present. The end-capping unit E is an aryl group.
Copolymer Type 14
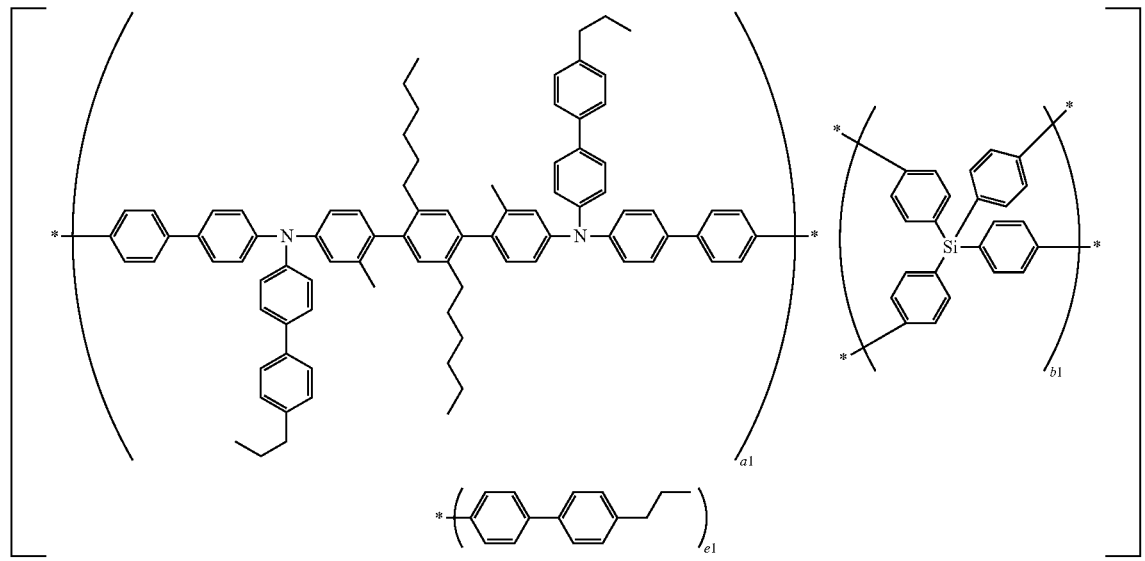
In Copolymer Type 14, c1=0 and no monomeric unit C' is present. Monomeric unit B' is tetra-functional. The end-capping unit E is an aryl group.
Copolymer Type 15
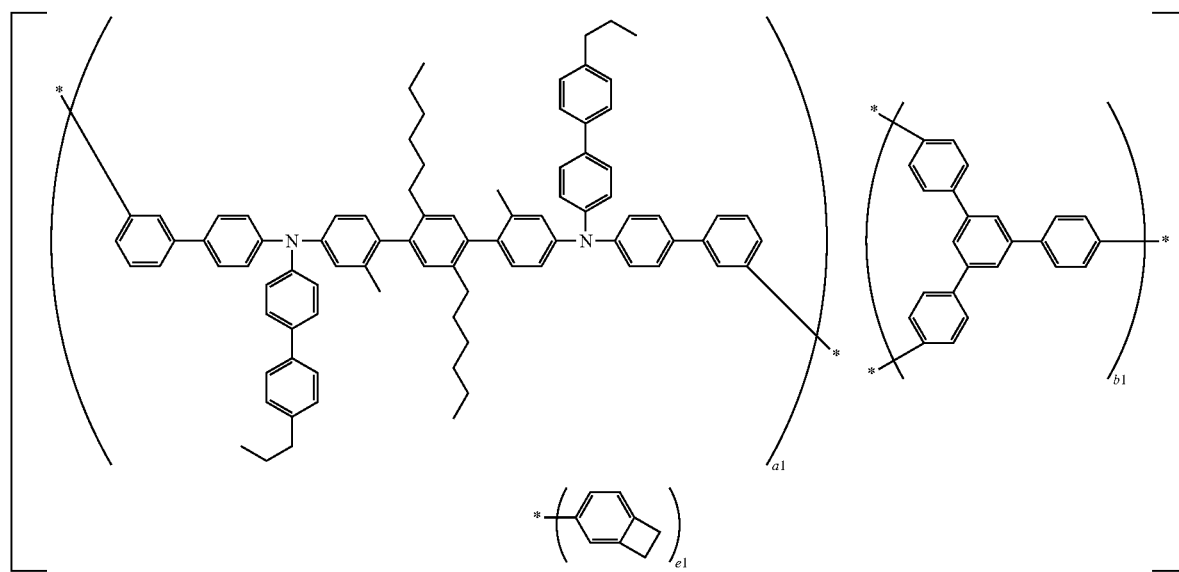
In Copolymer Type 15, c1=0 and no monomeric unit C' is present. The end-capping unit E is a crosslinking group.

Copolymer Type 16
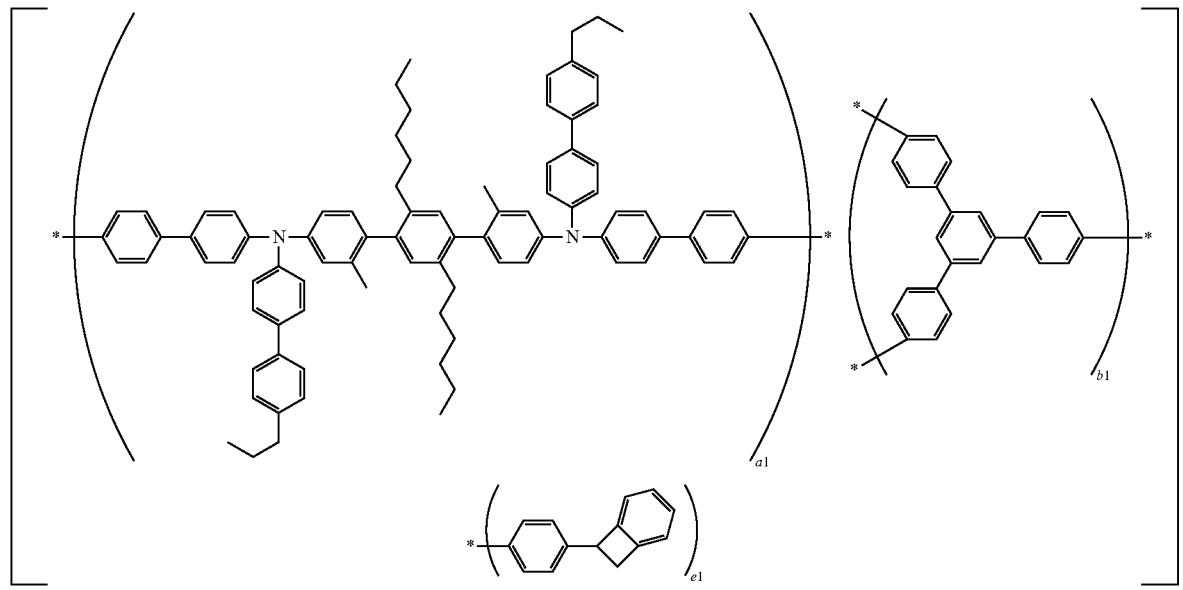
In Copolymer Type 16, c1=0 and no monomeric unit C' is present. The end-capping unit E is a crosslinking group.
Copolymer Type 17
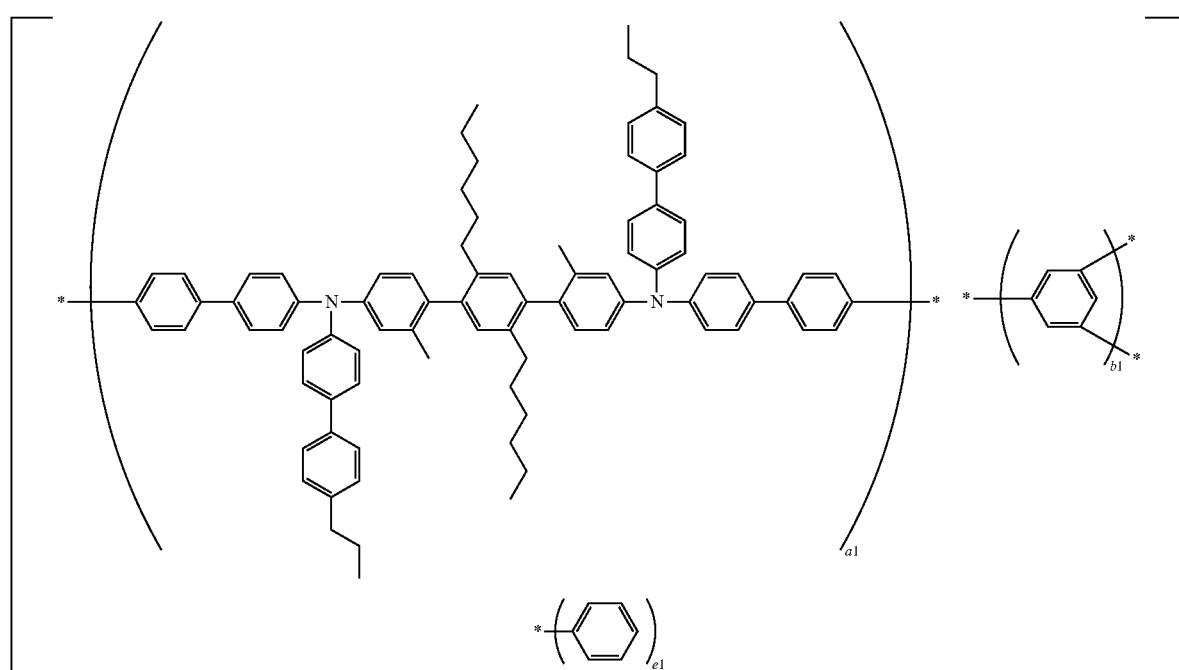
In Copolymer Type 17, c1=0 and no monomeric unit C' is present. The end-capping unit E is an aryl group.

Copolymer Type 18
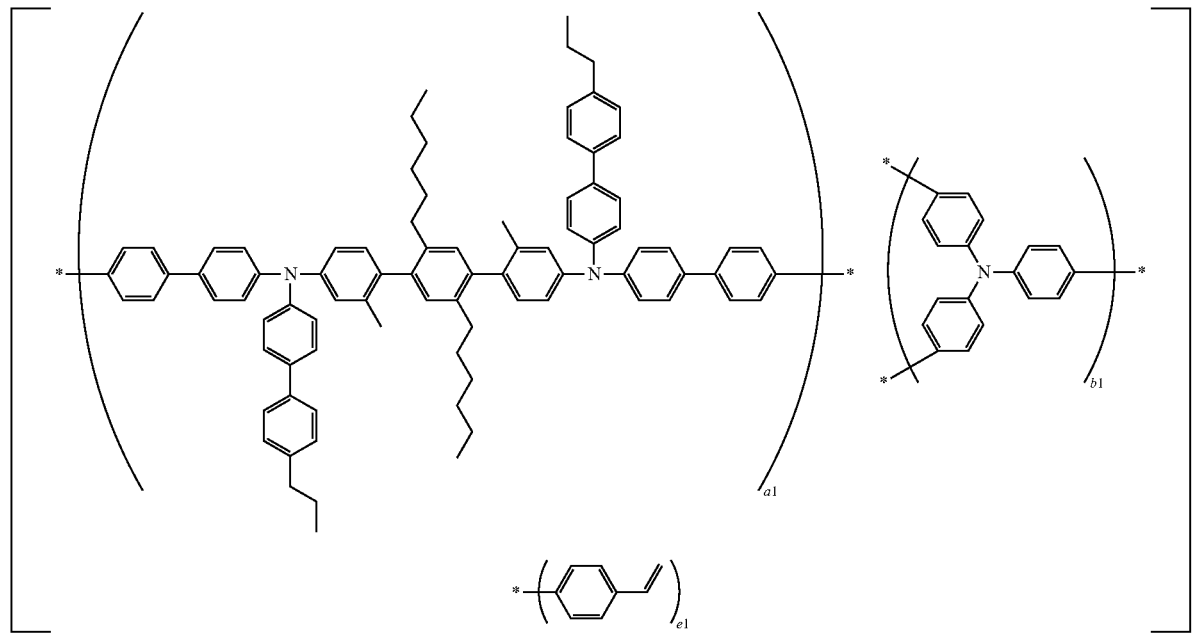
In Copolymer Type 18, c1=0 and no monomeric unit C' is present. The end-capping unit E is a crosslinking group.
Copolymer Type 19
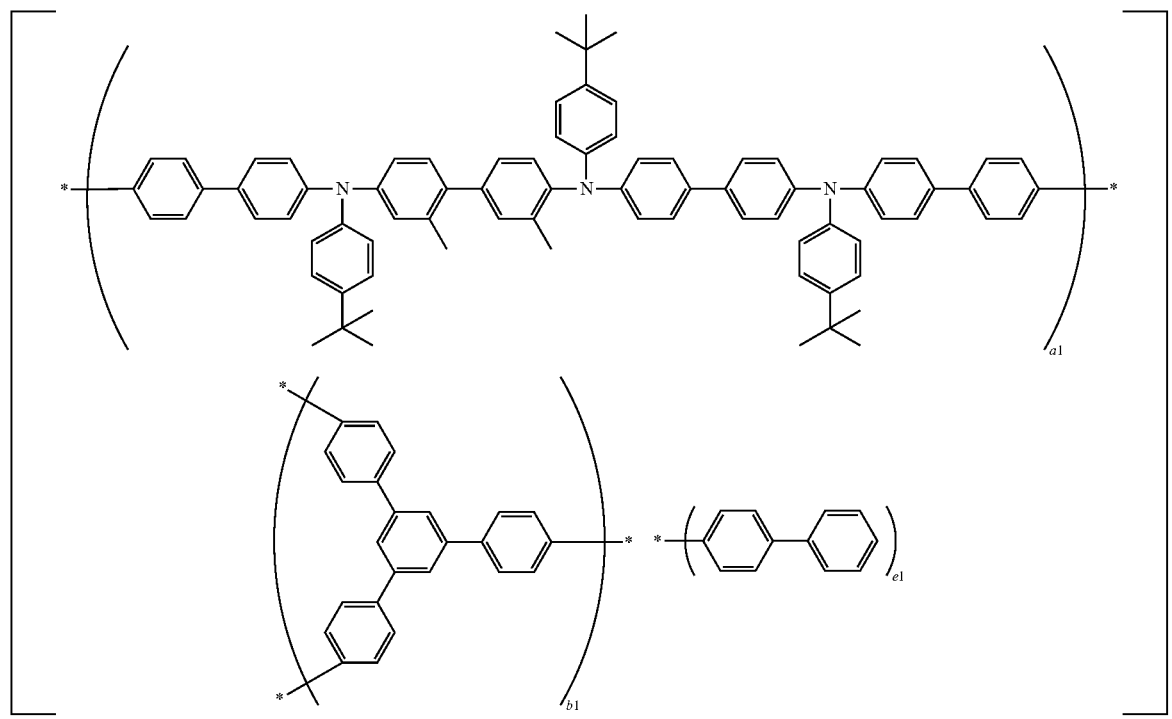
In Copolymer Type 19, c1=0 and no monomeric unit C' is present. The end-capping unit E is an aryl group.

Copolymer Type 20
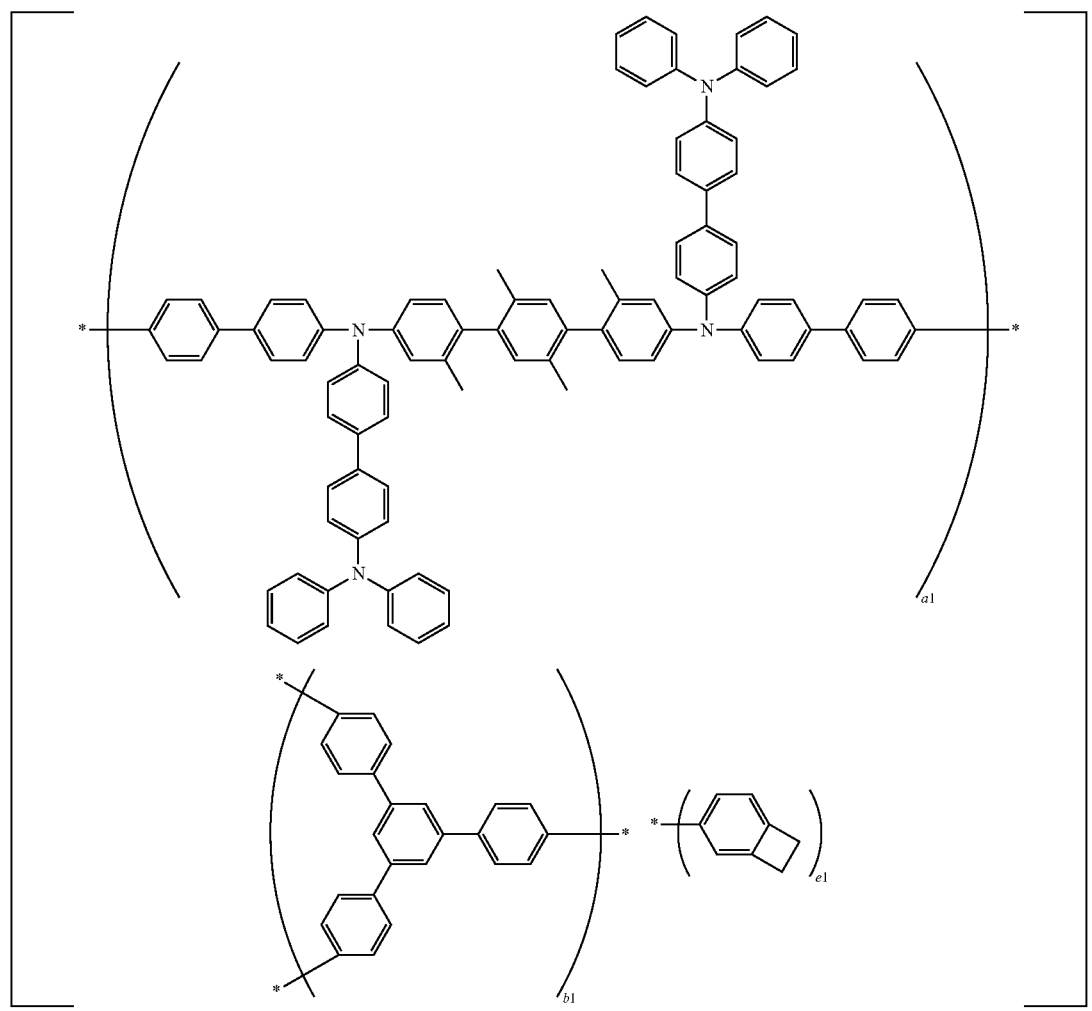
In Copolymer Type 20, c1=0 and no monomeric unit C' is present. The end-capping unit E is a crosslinking group.
Copolymer Type 21
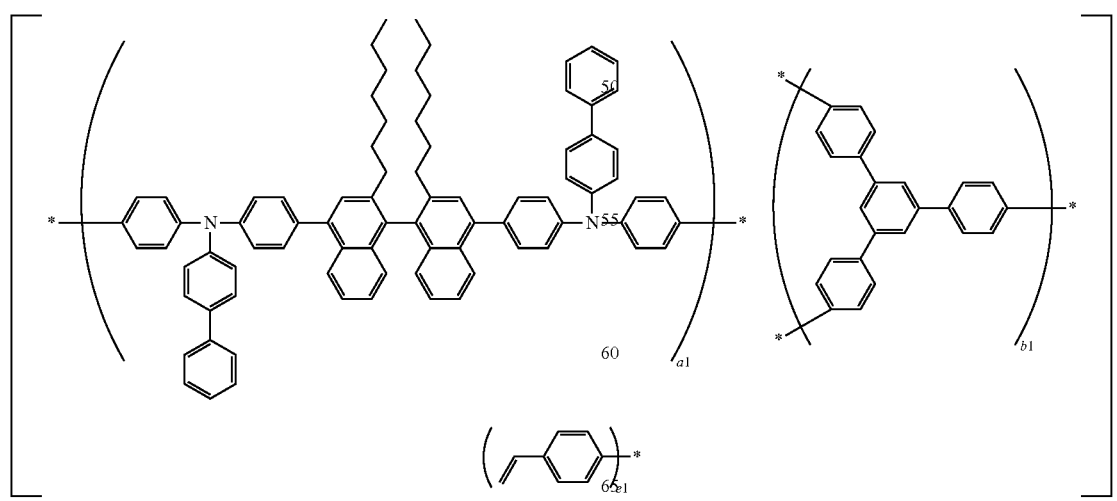

In Copolymer Type 21, c1=0 and no monomeric unit C' is present. The end-capping unit E is a crosslinking group.

The copolymers of Formula I can be made using any technique that will yield a C—C or C—N bond and known polymerization techniques. A variety of such techniques are known, such as Suzuki, Yamamoto, Stille, and metal-catalyzed C—N couplings, as well as metal catalyzed oxidative direct arylation.

Deuterated compounds can be prepared in a similar manner using deuterated precursor materials or, more generally, by treating the non-deuterated compound with deuterated solvent, such as benzene-d6, in the presence of a Lewis acid H/D exchange catalyst, such as trifluoromethanesulfonic acid, aluminum trichloride or ethyl aluminum dichloride.

Techniques for controlling the molecular weight of polymers and copolymers are well known in the art. The molecular weight of the copolymers described herein can generally be controlled by the ratio of monomers in the polymerization reaction. In some embodiments, the molecular weight can be controlled with quenching reactions.

The copolymers can be formed into layers using solution processing techniques. The term "layer" is used interchangeably with the term "film" and refers to a coating covering a desired area. The term is not limited by size. The area can be as large as an entire device or as small as a specific functional area such as the actual visual display, or as small as a single sub-pixel. Layers and films can be formed by any conventional deposition technique, including vapor deposition, liquid deposition (continuous and discontinuous techniques), and thermal transfer. Continuous deposition techniques, include but are not limited to, spin coating, gravure coating, curtain coating, dip coating, slot-die coating, spray coating, and continuous nozzle coating. Discontinuous deposition techniques include, but are not limited to, inkjet printing, gravure printing, and screen printing.

In some embodiments, the new copolymers described herein have an intrinsic viscosity less than 60 mL/g. This is particularly useful for inkjet printing applications where a lower viscosity can allow for more concentrated solutions to be jetted. In some embodiments, the new copolymers described herein have an intrinsic viscosity less than 50 mL/g; in some embodiments, less than 40 mL/g; in some embodiments, less than 30 mL/g. In some embodiments, the intrinsic viscosity of in the range of 20-60 mL/g; in some embodiments, 20-50 mL/g; in some embodiments, 20-40 mL/g.

The new copolymers described herein can be used as hole transport materials and as hosts for electroluminescent materials. The new copolymers also have utility in one or more layers between the hole injection layer and the hole transport layer.

3. Electronic Devices

Organic electronic devices that may benefit from having one or more layers including at least one compound as described herein include, but are not limited to, (1) devices that convert electrical energy into radiation (e.g., a light-emitting diode, light emitting diode display, lighting device, luminaire, or diode laser), (2) devices that detect signals through electronics processes (e.g., photodetectors, photoconductive cells, photoresistors, photoswitches, phototransistors, phototubes, IR detectors, biosensors), (3) devices that convert radiation into electrical energy, (e.g., a photovoltaic device or solar cell), (4) devices that convert light of one wavelength to light of a longer wavelength, (e.g., a down-converting phosphor device); and (5) devices that include one or more electronic components that include one or more organic semi-conductor layers (e.g., a transistor or diode). Other uses for the compositions according to the present invention include coating materials for memory storage devices, antistatic films, biosensors, electrochromic devices, solid electrolyte capacitors, energy storage devices such as a rechargeable battery, and electromagnetic shielding applications.

One illustration of an organic electronic device structure is shown in FIG. 1. The device 100 has a first electrical contact layer, an anode layer 110 and a second electrical contact layer, a cathode layer 160, and a photoactive layer 140 between them. Additional layers may optionally be present. Adjacent to the anode may be a hole injection layer 120, sometimes referred to as a buffer layer. Adjacent to the hole injection layer may be a hole transport layer 130, including hole transport material. Adjacent to the cathode may be an electron transport layer 150, including an electron transport material. As an option, devices may use one or more additional hole injection or hole transport layers (not shown) next to the anode 110 and/or one or more additional electron injection or electron transport layers (not shown) next to the cathode 160. Layers 120 through 150 are individually and collectively referred to as the organic active layers.

Figure 2:
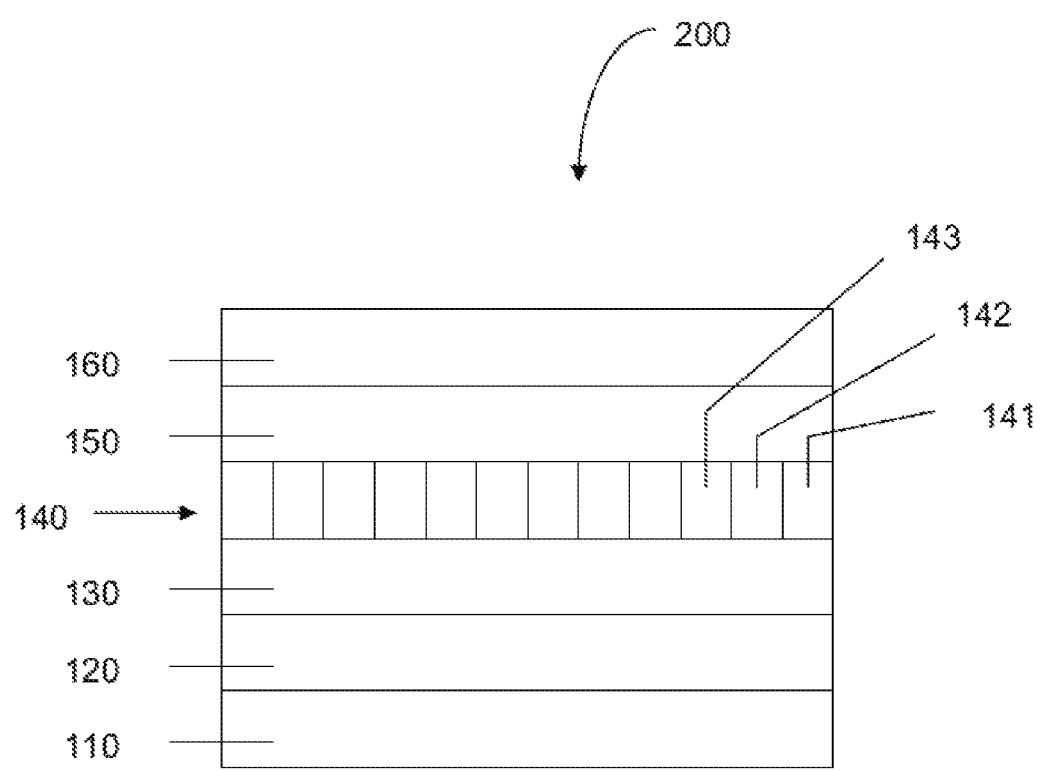
FIG. 2 includes an illustration of another example of an organic electronic device including the new hole transport copolymer described herein.

In some embodiments, in order to achieve full color, the light-emitting layer is pixellated, with subpixel units for each of the different colors. An illustration of a pixellated device is shown in FIG. 2. The device 200 has anode 110, hole injection layer 120, hole transport layer 130, electroluminescent layer 140, electron transport layer 150, and cathode 160. The electroluminescent layer is divided into subpixels 141, 142, 143, which are repeated across the layer. In some embodiments, the subpixels represent red, blue and green color emission. Although three different subpixel units are depicted in FIG. 2, two or more than three subpixel units may be used.

The different layers will be discussed further herein with reference to FIG. 1. However, the discussion applies to FIG. 2 and other configurations as well.

In some embodiments, the different layers have the following range of thicknesses: anode 110, 500-5000 Å, in some embodiments, 1000-2000 Å; hole injection layer 120, 50-2000 Å, in some embodiments, 200-1000 Å; hole transport layer 130, 50-3000 Å, in some embodiments, 200-2000 Å; photoactive layer 140, 10-2000 Å, in some embodiments, 100-1000 Å; electron transport layer 150, 50-2000 Å, in some embodiments, 100-1000 Å; cathode 160, 200-10000 Å, in some embodiments, 300-5000 Å. The desired ratio of layer thicknesses will depend on the exact nature of the materials used.

One or more of the new copolymers having Formula I described herein may be present in one or more of the electroactive layers of a device. In some embodiments, the new copolymers are useful as hole transport materials in layer 130. In some embodiments, the new copolymers are useful as host materials for photoactive dopant materials in photoactive layer 140. The term "dopant" is intended to mean a material, within a layer including a host material, that changes the electronic characteristic(s) or the targeted wavelength(s) of radiation emission, reception, or filtering of the layer compared to the electronic characteristic(s) or the wavelength(s) of radiation emission, reception, or filtering of the layer in the absence of such material. The term "host material" is intended to mean a material to which a dopant is added. The host material may or may not have electronic characteristic(s) or the ability to emit, receive, or filter radiation. In some embodiments, the host material is present in higher concentration.

In some embodiments, an organic electronic device includes an anode, a cathode, and at least one organic active layer therebetween, where the organic active layer includes a copolymer of Formula I.

In some embodiments, an organic electronic device includes an anode, a cathode, and a photoactive layer therebetween, and further includes an additional organic active layer including a copolymer of Formula I. In some embodiments, the additional organic active layer is a hole transport layer.

In some embodiments, an organic electronic device includes, in order, an anode, a hole transport layer, a photoactive layer, and a cathode, where one or both of the hole transport layer and the photoactive layer include a copolymer of Formula I.

The anode 110 is an electrode that is particularly efficient for injecting positive charge carriers. It can be made of, for example materials containing a metal, mixed metal, alloy, metal oxide or mixed-metal oxide, or it can be a conducting polymer, and mixtures thereof. Suitable metals include the Group 11 metals, the metals in Groups 4, 5, and 6, and the Group 8-10 transition metals. If the anode is to be light-transmitting, mixed-metal oxides of Groups 12, 13 and 14 metals, such as indium-tin-oxide, are generally used. The anode may also include an organic material such as polyaniline as described in "Flexible light-emitting diodes made from soluble conducting polymer," Nature vol. 357, pp 477 479 (11 Jun. 1992). At least one of the anode and cathode should be at least partially transparent to allow the generated light to be observed.

Optional hole injection layer 120 includes hole injection materials. The term "hole injection layer" or "hole injection material" is intended to mean electrically conductive or semiconductive materials and may have one or more functions in an organic electronic device, including but not limited to, planarization of the underlying layer, charge transport and/or charge injection properties, scavenging of impurities such as oxygen or metal ions, and other aspects to facilitate or to improve the performance of the organic electronic device. Hole injection materials may be polymers, oligomers, or small molecules, and may be in the form of solutions, dispersions, suspensions, emulsions, colloidal mixtures, or other compositions.

The hole injection layer can be formed with polymeric materials, such as polyaniline (PANI) or polyethylenedioxythiophene (PEDOT), which are often doped with protonic acids. The protonic acids can be, for example, poly(styrenesulfonic acid), poly(2-acrylamido-2-methyl-1-propanesulfonic acid), and the like. The hole injection layer 120 can include charge transfer compounds, and the like, such as copper phthalocyanine and the tetrathiafulvalene-tetracyanoquinodimethane system (TTF-TCNQ). In some embodiments, the hole injection layer 120 is made from a dispersion of a conducting polymer and a colloid-forming polymeric acid. Such materials have been described in, for example, published U.S. patent applications 2004-0102577, 2004-0127637, and 2005-0205860.

Layer 130 includes hole transport material. In some embodiments, the hole transport layer includes a copolymer having Formula I.

In some embodiments, the hole transport layer includes a copolymer having Formula I and one or more additional materials. Such materials may be added to improve coating or other processing characteristics.

In some embodiments, the hole transport layer includes a copolymer having Formula I and a facilitation additive. Such materials have been described in published PCT application WO 2015/089304.

In some embodiments, the hole transport layer includes only a copolymer having Formula I, where additional materials that would materially alter the principle of operation or the distinguishing characteristics of the layer are not present therein.

In some embodiments, layer 130 includes other hole transport materials. Examples of hole transport materials for the hole transport layer have been summarized for example, in Kirk-Othmer Encyclopedia of Chemical Technology, Fourth Edition, Vol. 18, p. 837-860, 1996, by Y. Wang. Both hole transporting small molecules and polymers can be used. Commonly used hole transporting molecules include, but are not limited to: 4,4',4"-tris(N,N-diphenyl-amino)-triphenylamine (TDATA); 4,4',4"-tris(N-3-methylphenyl-N-phenyl-amino)-triphenylamine (MTDATA); N,N'-diphenyl-N,N'-bis(3-methylphenyl)-[1,1'-biphenyl]-4,4'-diamine (TPD); 4,4'-bis(carbazol-9-yl)biphenyl (CBP); 1,3-bis(carbazol-9-yl)benzene (mCP); 1,1-bis[(di-4-tolylamino) phenyl]cyclohexane (TAPC); N,N'-bis(4-methylphenyl)-N,N'-bis(4-ethylphenyl)-[1,1'-(3,3'-dimethyl)biphenyl]-4,4'-diamine (ETPD); tetrakis-(3-methylphenyl)-N,N,N',N'-2,5-phenylenediamine (PDA); α-phenyl-4-N,N-diphenylaminostyrene (TPS); p-(diethylamino)benzaldehyde diphenylhydrazone (DEH); triphenylamine (TPA); bis[4-(N,N-diethylamino)-2-methylphenyl](4-methylphenyl)methane (MPMP); 1-phenyl-3[p-(diethylamino)styryl]-5-[p-(diethylamino)phenyl] pyrazoline (PPR or DEASP); 1,2-trans-bis(9H-carbazol-9-yl)cyclobutane (DCZB); N,N,N',N'-tetrakis(4-methylphenyl)-(1,1'-biphenyl)-4,4'-diamine (TTB); N,N'-bis(naphthalen-1-yl)-N,N'-bis-(phenyl)benzidine (α-NPB); and porphyrinic compounds, such as copper phthalocyanine.

Commonly used hole transporting polymers include, but are not limited to, polyvinylcarbazole, (phenylmethyl)polysilane, poly(dioxythiophenes), polyanilines, and polypyrroles. It is also possible to obtain hole transporting polymers by doping hole transporting molecules such as those mentioned above into polymers such as polystyrene and polycarbonate. In some cases, the polymers and copolymers are crosslinkable. Examples of crosslinkable hole transport polymers can be found in, for example, published US patent application 2005-0184287 and published PCT application WO 2005/052027. In some embodiments, the hole transport layer is doped with a p-dopant, such as tetrafluoro-tetracyanoquinodimethane and perylene-3,4,9,10-tetracarboxylic-3,4,9,10-dianhydride.

Depending upon the application of the device, the photoactive layer 140 can be a light-emitting layer that is activated by an applied voltage (such as in a light-emitting diode or light-emitting electrochemical cell), a layer of material that absorbs light and emits light having a longer wavelength (such as in a down-converting phosphor device), or a layer of material that responds to radiant energy and generates a signal with or without an applied bias voltage (such as in a photodetector or photovoltaic device).

In some embodiments, the photoactive layer includes an organic electroluminescent ("EL") material. Any EL material can be used in the devices, including, but not limited to, small molecule organic fluorescent compounds, fluorescent and phosphorescent metal complexes, conjugated polymers, and mixtures thereof. Examples of fluorescent compounds include, but are not limited to, chrysenes, pyrenes, perylenes, rubrenes, coumarins, anthracenes, thiadiazoles, derivatives thereof, and mixtures thereof. Examples of metal complexes include, but are not limited to, metal chelated oxinoid compounds, such as tris(8-hydroxyquinolato)aluminum (Alq3); cyclometalated iridium and platinum electroluminescent compounds, such as complexes of iridium with phenylpyridine, phenylquinoline, or phenylpyrimidine ligands as disclosed in Petrov et al., U.S. Pat. No. 6,670,645 and Published PCT Applications WO 03/063555 and WO 2004/016710, and organometallic complexes described in, for example, Published PCT Applications WO 03/008424, WO 03/091688, and WO 03/040257, and mixtures thereof. In some cases the small molecule fluorescent or organometallic materials are deposited as a dopant with a host material to improve processing and/or electronic properties. Examples of conjugated polymers include, but are not limited to poly(phenylenevinylenes), polyfluorenes, poly (spirobifluorenes), polythiophenes, poly(p-phenylenes), copolymers thereof, and mixtures thereof.

In some embodiments, the photoactive layer includes an electroluminescent material in a host material having Formula I. In some embodiments, a second host material is also present. In some embodiments, photoactive layer includes only an electroluminescent material and a host material having Formula I. In some embodiments, photoactive layer includes only an electroluminescent material, a first host material having Formula I, and a second host material. Examples of second host materials include, but are not limited to, chrysenes, phenanthrenes, triphenylenes, phenanthrolines, naphthalenes, anthracenes, quinolines, isoquinolines, quinoxalines, phenylpyridines, benzodifurans, and metal quinolinate complexes.

Optional layer 150 can function both to facilitate electron transport, and also serve as a hole injection layer or confinement layer to prevent quenching of the exciton at layer interfaces. Preferably, this layer promotes electron mobility and reduces exciton quenching. Examples of electron transport materials which can be used in the optional electron transport layer, include metal chelated oxinoid compounds, including metal quinolate derivatives such as tris(8-hydroxyquinolato)aluminum (AlQ), bis(2-methyl-8-quinolinolato)(p-phenylphenolato) aluminum (BAlq), tetrakis-(8-hydroxyquinolato)hafnium (HfQ) and tetrakis-(8-hydroxyquinolato)zirconium (ZrQ); and azole compounds such as 2-(4-biphenylyl)-5-(4-t-butylphenyl)-1,3,4-oxadiazole (PBD), 3-(4-biphenylyl)-4-phenyl-5-(4-t-butylphenyl)-1,2,4-triazole (TAZ), and 1,3,5-tri(phenyl-2-benzimidazole) benzene (TPBI); quinoxaline derivatives such as 2,3-bis(4-fluorophenyl)quinoxaline; phenanthrolines such as 4,7-diphenyl-1,10-phenanthroline (DPA) and 2,9-dimethyl-4,7-diphenyl-1,10-phenanthroline (DDPA); triazines; fullerenes; and mixtures thereof.

In some embodiments, the electron transport material is selected from the group consisting of metal quinolates and phenanthroline derivatives. In some embodiments, the electron transport layer further includes an n-dopant. N-dopant materials are well known. The n-dopants include, but are not limited to, Group 1 and 2 metals; Group 1 and 2 metal salts, such as LiF, CsF, and $Cs_2CO_3$; Group 1 and 2 metal organic compounds, such as Li quinolate; and molecular n-dopants, such as leuco dyes, metal complexes, such as $W_2(hpp)_4$ where hpp=1,3,4,6,7,8-hexahydro-2H-pyrimido-[1,2-a]-pyrimidine and cobaltocene, tetrathianaphthacene, bis(ethylenedithio)tetrathiafulvalene, heterocyclic radicals or diradicals, and the dimers, oligomers, polymers, dispiro compounds and polycycles of heterocyclic radical or diradicals.

An optional electron injection layer may be deposited over the electron transport layer. Examples of electron injection materials include, but are not limited to, Li-containing organometallic compounds, LiF, $Li_2O$, Li quinolate, Cs-containing organometallic compounds, CsF, $Cs_2O$, and $Cs_2CO_3$. This layer may react with the underlying electron transport layer, the overlying cathode, or both. When an electron injection layer is present, the amount of material deposited is generally in the range of 1-100 Å, in some embodiments 1-10 Å.

The cathode, is an electrode that is particularly efficient for injecting electrons or negative charge carriers. The cathode can be any metal or nonmetal having a lower work function than the anode. Materials for the cathode can be selected from alkali metals of Group 1 (e.g., Li, Cs), the Group 2 (alkaline earth) metals, the Group 12 metals, including the rare earth elements and lanthanides, and the actinides. Materials such as aluminum, indium, calcium, barium, samarium and magnesium, as well as combinations, can be used.

It is known to have other layers in organic electronic devices. For example, there can be a layer (not shown) between the anode and hole injection layer to control the amount of positive charge injected and/or to provide band-gap matching of the layers, or to function as a protective layer. Layers that are known in the art can be used, such as copper phthalocyanine, silicon oxy-nitride, fluorocarbons, silanes, or an ultra-thin layer of a metal, such as Pt. Alternatively, some or all of the layers can be surface-treated to increase charge carrier transport efficiency. The choice of materials for each of the component layers is preferably determined by balancing the positive and negative charges in the emitter layer to provide a device with high electroluminescence efficiency.

It is understood that each functional layer can be made up of more than one layer.

The device layers can be formed by any deposition technique, or combinations of techniques, including vapor deposition, liquid deposition, and thermal transfer. Substrates such as glass, plastics, and metals can be used. Substrates can be flexible or non-flexible. Conventional vapor deposition techniques can be used, such as thermal evaporation, chemical vapor deposition, and the like. The organic layers can be applied from solutions or dispersions in suitable solvents, using conventional coating or printing techniques, including but not limited to spin-coating, dip-coating, roll-to-roll techniques, ink-jet printing, continuous nozzle printing, screen-printing, gravure printing and the like.

For liquid deposition methods, a suitable solvent for a particular compound or related class of compounds can be readily determined by one skilled in the art. For some applications, it is desirable that the compounds be dissolved in non-aqueous solvents. Such non-aqueous solvents can be relatively polar, such as $C_1$ to $C_{20}$ alcohols, ethers, and acid esters, or can be relatively non-polar such as $C_1$ to $C_{12}$ alkanes or aromatics such as toluene, xylenes, trifluorotoluene and the like. Other suitable liquids for use in making the liquid composition, either as a solution or dispersion as described herein, including the new compounds, includes, but not limited to, chlorinated hydrocarbons (such as methylene chloride, chloroform, chlorobenzene), aromatic hydrocarbons (such as substituted and non-substituted toluenes and xylenes), including triflurotoluene), polar solvents (such as tetrahydrofuran (THP), N-methyl pyrrolidone) esters (such as ethylacetate) alcohols (isopropanol), ketones (cyclopentanone) and mixtures thereof. Suitable solvents for electroluminescent materials have been described in, for example, published PCT application WO 2007/145979.

In some embodiments, the hole transport layer is formed by liquid deposition of hole transport material and any additional materials in a liquid medium. In some embodiments, the additional materials are processing aids and/or facilitation additives. The additional materials may or may not remain in the hole transport layer after deposition and processing. The liquid medium is one in which the hole transport material is dissolved or dispersed and from which it will form a film. In some embodiments, the liquid medium includes one or more organic solvents. In some embodiments, the organic solvent is an aromatic solvent. In some embodiments, the organic liquid is selected from chloroform, dichloromethane, chlorobenzene, dichlorobenzene, toluene, xylene, mesitylene, anisole, N-methyl-2-pyrrolidone ("NMP"), tetralin, 1-methoxynaphthalene, cyclohexylbenzene, and mixtures thereof. The hole transport material can be present in the liquid medium in a concentration of 0.2 to 5 percent (w/v); in some embodiments, 0.4 to 3 percent (w/v). The hole transport layer can be applied by any continuous or discontinuous liquid deposition technique. In some embodiments, the hole transport layer is applied by spin coating. In some embodiments, the hole transport layer is applied by inkjet printing. In some embodiments, the hole transport layer is applied by continuous nozzle printing. In some embodiments, the hole transport layer is applied by slot-die coating. After liquid deposition, the liquid medium can be removed in air, in an inert atmosphere, or by vacuum, at room temperature or with heating, or by a multi-step process that includes any combination of these conditions.

In some embodiments, the device is fabricated by liquid deposition of the hole injection layer, the hole transport layer, and the photoactive layer, and by vapor deposition of the anode, the electron transport layer, an electron injection layer and the cathode.

It is understood that the efficiency of devices made with the new compositions described herein, can be further improved by optimizing the other layers in the device. For example, more efficient cathodes such as Ca, Ba or LiF can be used. Shaped substrates and novel hole transport materials that result in a reduction in operating voltage or increase quantum efficiency are also applicable. Additional layers can also be added to tailor the energy levels of the various layers and facilitate electroluminescence.

In some embodiments, the device has the following structure, in order: anode, hole injection layer, hole transport layer, photoactive layer, electron transport layer, electron injection layer, cathode.

Although methods and materials similar or equivalent to those described herein can be used in the practice or testing of the present invention, suitable methods and materials are described below. In addition, the materials, methods, and examples are illustrative only and not intended to be limiting. All publications, patent applications, patents, and other references mentioned herein are incorporated by reference in their entirety.

EXAMPLES

The concepts described herein will be further described in the following examples, which do not limit the scope of the invention described in the claims.

Synthesis Example 1

This example illustrates the synthesis of a copolymer having Formula I, Copolymer H5. Copolymer H5 has the structure of Copolymer Type 5.

(a) Synthesis of Crosslinking Monomer:

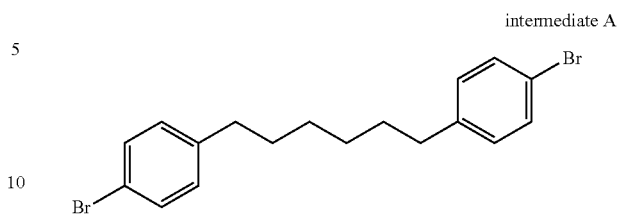

intermediate A

To an oven dried 1 L, 3 neck round bottom flask under nitrogen were added 1,4-dibromobenzene (55.84 g, 236.71 mmol) and anhydrous THF (400 mL). Once all the starting materials were dissolved, the solution was cooled to −67° C. (internal temperature). Some precipitation of the dibromobenzene was observed. Once the solution was cooled, n-Butyl lithium (15.16 g, 236.71 mmol) was added via cannula transfer and the solution was allowed to stir for 15 min at −67° C. careful observation of stirring was required due to lithium salt precipitation. 1,6 diiodohexane (40.00 g, 118.35 mmol) was added and the bath was allowed to slowly warm to room temperature resulting in a clear solution. The solution was allowed to stir at room temperature for 16 hours. The solution was slowly quenched with 1 N HCl (200 mL). A slight exotherm was observed. The layers were separated, and the organic layer was dried over NaSO$_4$ and concentrated via rotary evaporation. Elevating the water bath to 55° C., distillation of the low molecular weight impurities was achieved. The remaining crude was purified using flash chromatography (Silica, 100% hexane isocaratic). A second purification was performed using flash chromatography (C18, 10% H2O:90% ACN isocratic). Removal of the ACN resulted in precipitation of the product which was collected by filtration. Intermediate A was obtained as an white solid in 19% yield (8.871 g).

(b) Synthesis of Crosslinking Group XL1

XL1

To an oven dried 500 mL three neck flask under nitrogen were added Compound A (8.871 g, 22.39 mmol), benzocyclobutene-4-boronic acid (3.313 g, 22.39 mmol), sodium carbonate (7.12 g, 67.17 mmol) and 1:1 m-xylene:water (80 mL). The solution was degassed. Tetrakis(triphenylphosphine)Pd(0) (7.12 g, 67.17 mmol) was added to the solution. The resulting mixture was heated to 100° C. for four hours. Toluene (100 mL) and water (50 mL) was added to the reaction mixture. The layers were separated, and the organic layer was dried over NaSO$_4$ and filtered through a pad of celite, florisil and silica gel. The crude material was concentrated to give a yellow oil. It was purified using flash chromatography (silica, hexane:DCM 0-10%). The pure fractions were concentrated to give a white solid. The resulting material was solubilized in 400 mL of Acetonitrile. 50 mL of water was added. The ACN was removed by rotary evaporation resulting in precipitation of the product which was filtered and collected as a white solid (2.854 g, 30% yield).

(c) Synthesis of Monomer M1
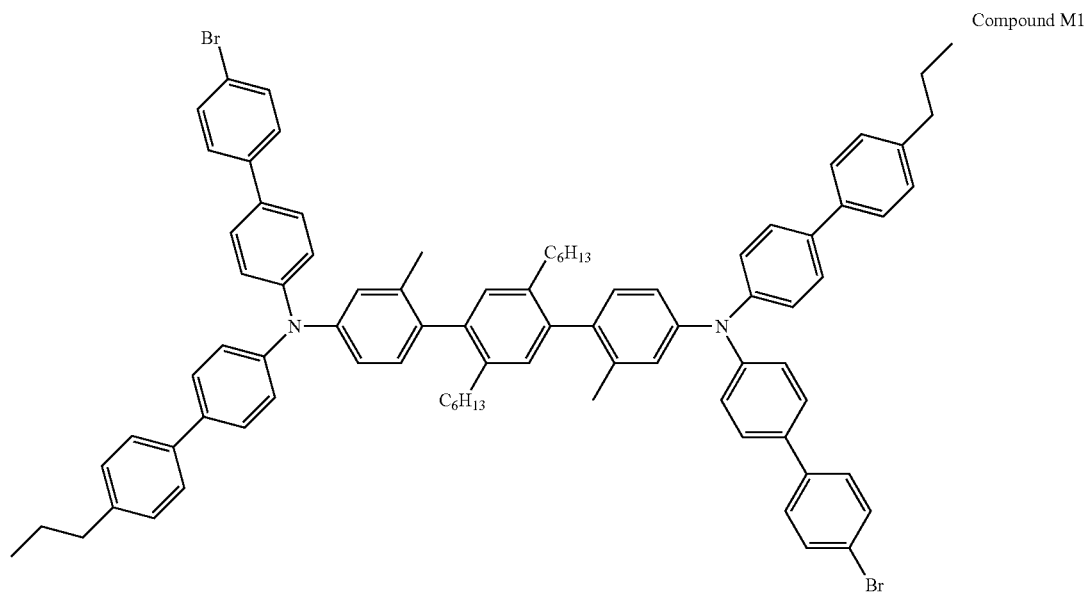
The synthesis of M1 and other monomers has been described in published PCT application WO 2011/159872. The synthesis can be carried out according to the scheme below.
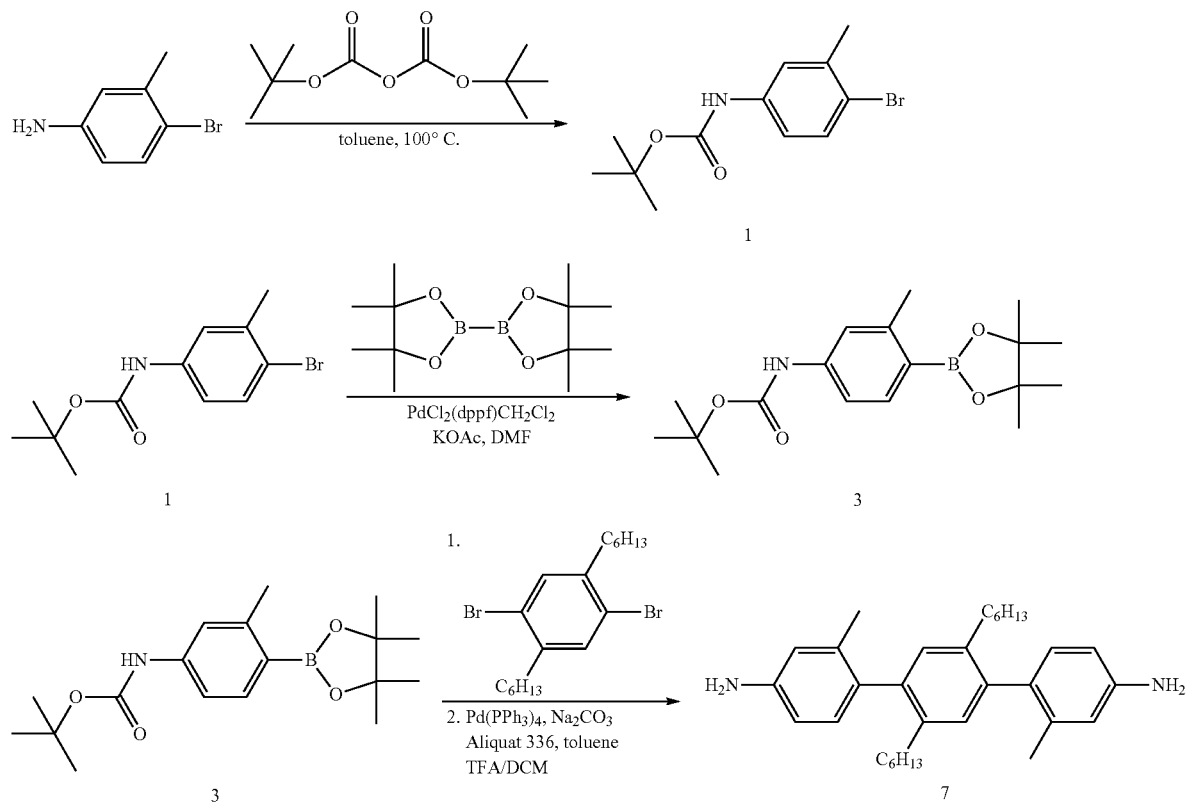

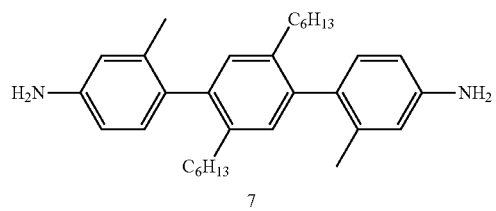
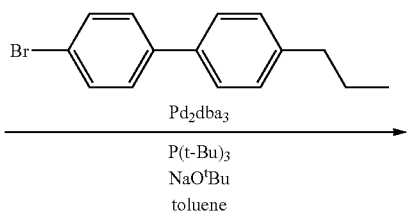
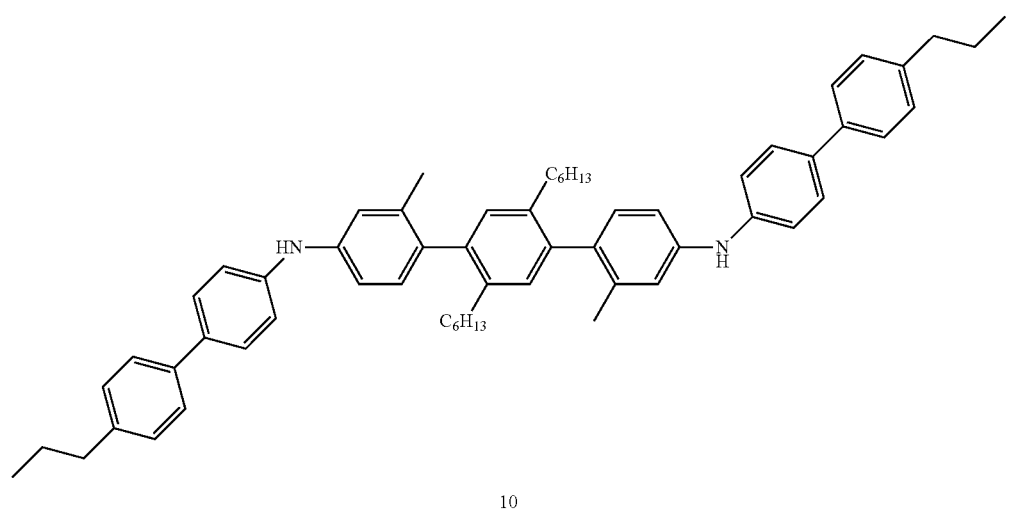
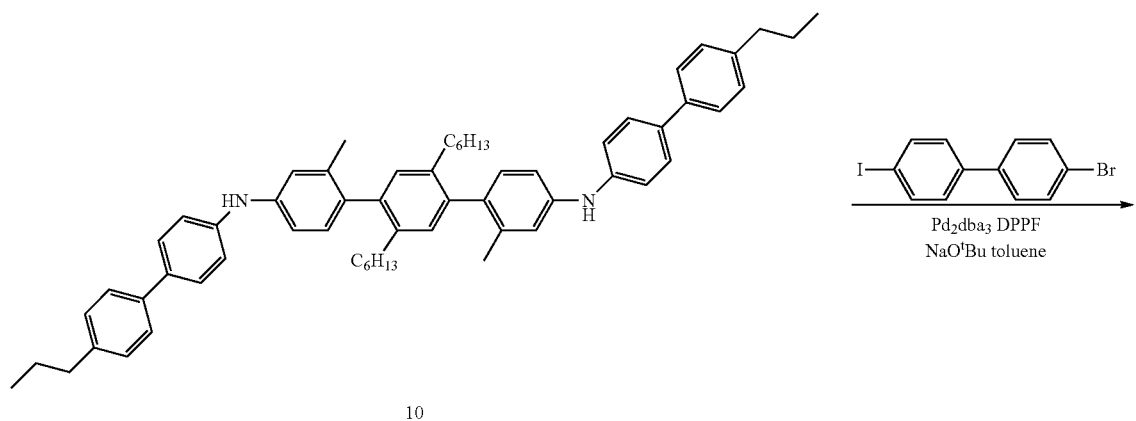

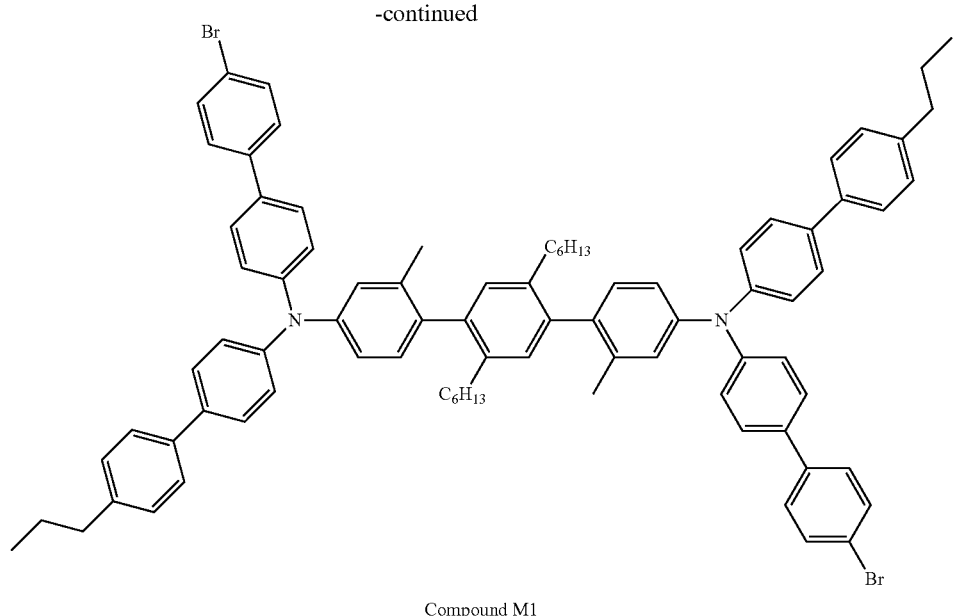
Compound M1
(d) Synthesis of Co-Polymer H5
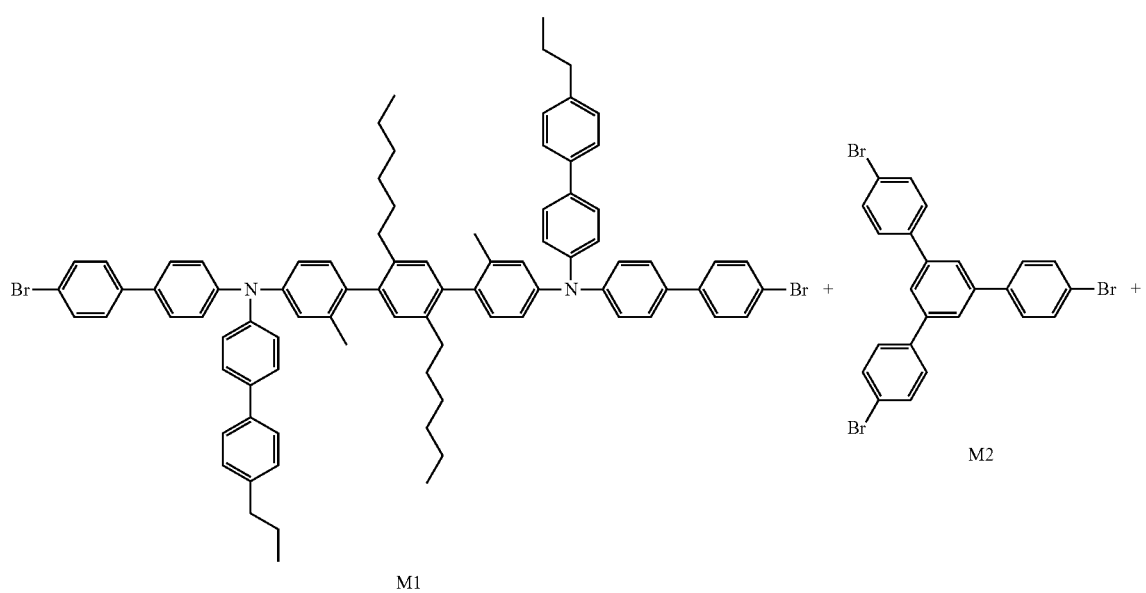
M1
M2
XL1

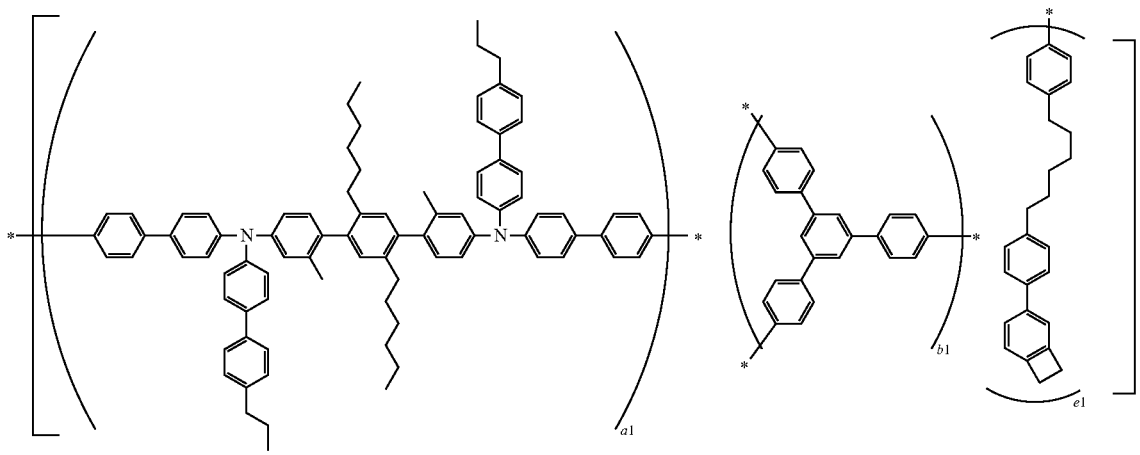

Compound M1 (0.765 mmol), M2 (0.158 mmol) and XL1 (0.396 mmol) were added to a scintillation vial and dissolved in 11 mL toluene. A clean, dry 50 mL Schlenk tube was charged with bis(1,5-cyclooctadiene)nickel(0) (2.42 mmol). 2,2'-Dipyridyl (2.42 mmol) and 1,5-cyclooctadiene (2.42 mmol) were weighed into a scintillation vial and dissolved in 5.5 mL N,N'-dimethylformamide and 11 mL of toluene. The solution was added to the Schlenk tube, which was then inserted into an aluminum block and heated to an internal temperature of 50° C. The catalyst system was held at 50° C. for 30 minutes. The monomer solution in toluene was added to the Schlenk tube and the tube was sealed. The polymerization mixture was stirred at 50° C. for 180 min. The Schlenk tube was then removed from the block and allowed to cool to room temperature. The contents were poured into HCl/methanol (5% v/v, conc. HCl). After stirring for 45 minutes, the polymer was collected by vacuum filtration and dried under high vacuum. The polymer was dissolved in toluene (1% wt/v) and passed through a column containing aluminum oxide, basic. (6 gram) layered onto silica gel (6 gram). The polymer/toluene filtrate was concentrated (2.5% wt/v toluene) and triturated with 3-pentanone. The toluene/3-pentanone solution was decanted from the semi-solid polymer which was then dissolved with 15 mL toluene before being poured into stirring methanol to yield co-polymer H5 in 60% yield.

Copolymers H1-H4 and H6-H28 were synthesized in an analogous manner using the method described above for Copolymer H5.

The copolymers were characterized by gel permeation chromatography ("GPC") using multi angle light scattering as the detector and an in-line viscometer, using THF as the solvent. GPC techniques have been well-described in the literature. See, for example, J. Appl. Polymer Science, Vol. 54, 91-103 (1994), and Agilent Technologies publication "A guide to multi-detector gel permeation chromatography" which can be found at www.agilent.com/cs/library/primers/public/5990-7196EN.pdf.

The GPC data is shown in Table 1.

Synthesis Example 2

This example illustrates the synthesis of a copolymer having Formula I, Copolymer H30. Copolymer H30 has the structure of Copolymer Type 17, and is made by Suzuki coupling, as shown in the scheme below. In the Suzuki approach, the end capping monomer is charged last after the monomers for units A and B' have been converted to polymer. This is done in order to consume all remaining functionalities that remain on the polymer.

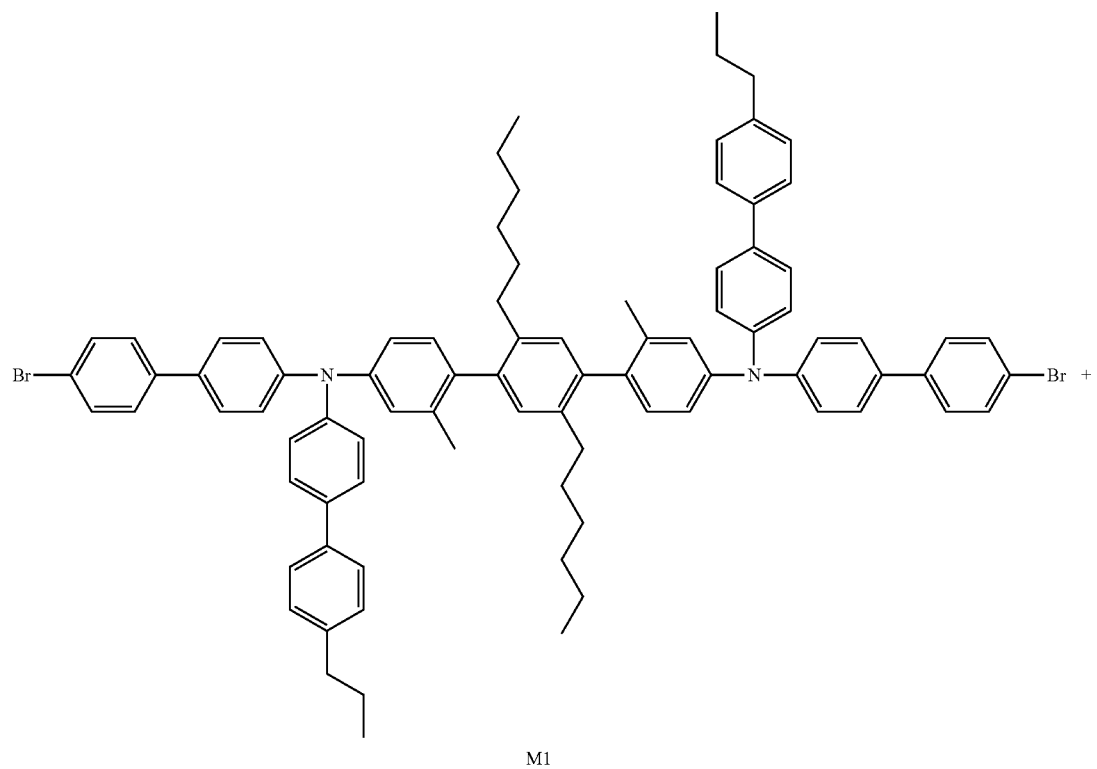
M1
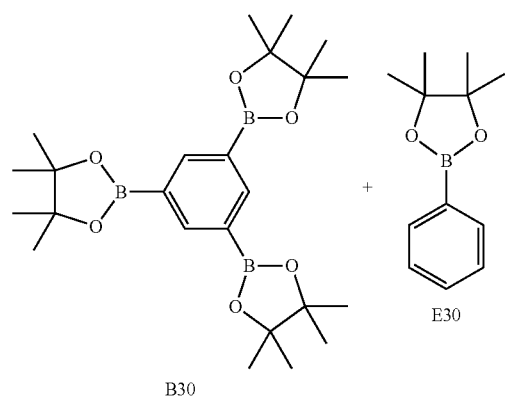
B30      E30

-continued

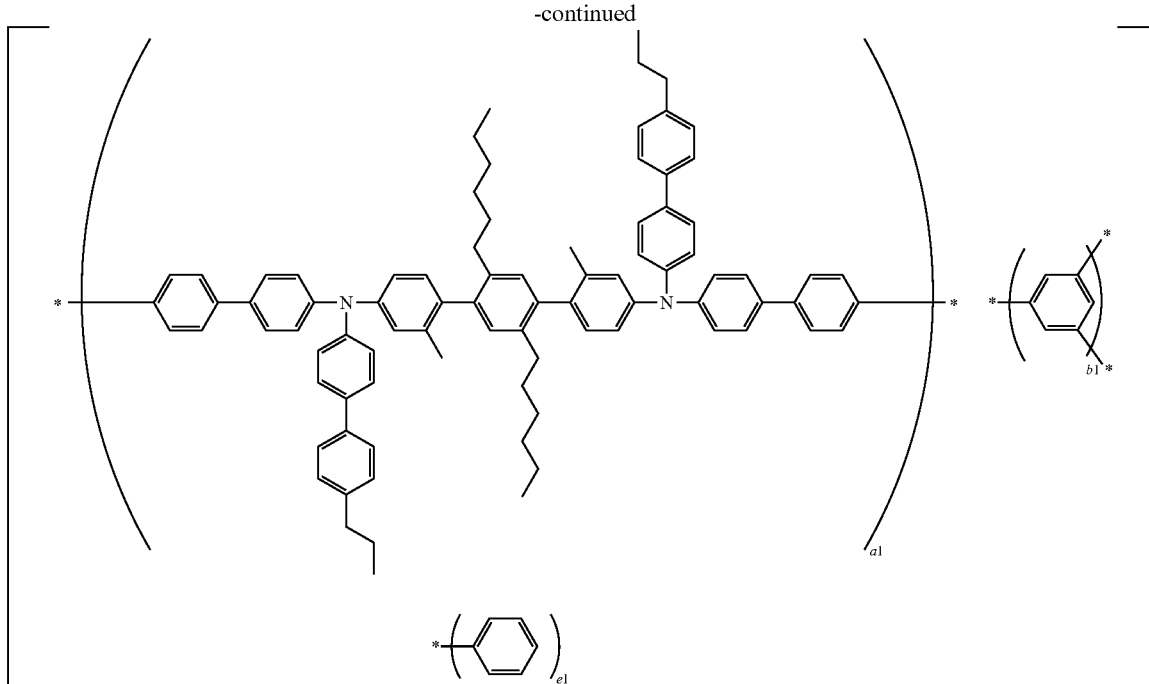

Under inert gas conditions, compound M1 (0.207 mmol), compound B30 (0.092 mmol), Aliquat 336 (0.041 mmol), 1.24 mL aqueous potassium carbonate (0.5M), 0.1 μmol bis(di-tert-butyl(4-dimethylaminophenyl)phosphine)dichloropalladium(II) and a total of 6.0 mL of toluene were added to a scintillation vial equipped with a magnetic stir bar. The vial was sealed with a screw-cap with septum, inserted into an aluminum block and heated to 105° C. external temperature over a period of 30 minutes and agitated at that temperature under gentle reflux for 5 hours. The reaction was then charged with 0.05 μmol bis(di-tert-butyl(4-dimethylaminophenyl)phosphine)dichloropalladium(II), phenylboronic acid pinacol ester E30 (0.138 mmol) and 0.9 ml toluene. The reaction was heated again at the above specified temperature for 1.5 hours. Next iodobenzene (0.092 mmol) and 0.6 mL of toluene were added. The reaction was heated an additional 1.5 hours and then cooled to room temperature. The aqueous layer was removed and the organic layer was washed with two portions of 20 mL of DI water. The toluene layer was dried by passing it through 10 g of silica gel as a desiccant and the silica was rinsed with toluene. The solvent was remove yielding 250 mg crude product. The crude product was further purified by passing a toluene solution through alumina, silica gel and Florisil®. After concentration, the solvent-wet product was diluted with toluene to about 14 mL and then added to 150 mL of ethyl acetate yielding about 200 mg of polymer. Re-precipitation of a product toluene solution into 3-pentanone yielded the 145 mg of the final Copolymer H30. GPC analysis (light scattering detector) is shown in Table 1.

Synthesis Example 3

This example illustrates the synthesis of a copolymer having Formula I, Copolymer H29. Copolymer H29 has the structure of Copolymer Type 9, and is made by Suzuki coupling, as shown in the schemes below.

(a) Monomer M3
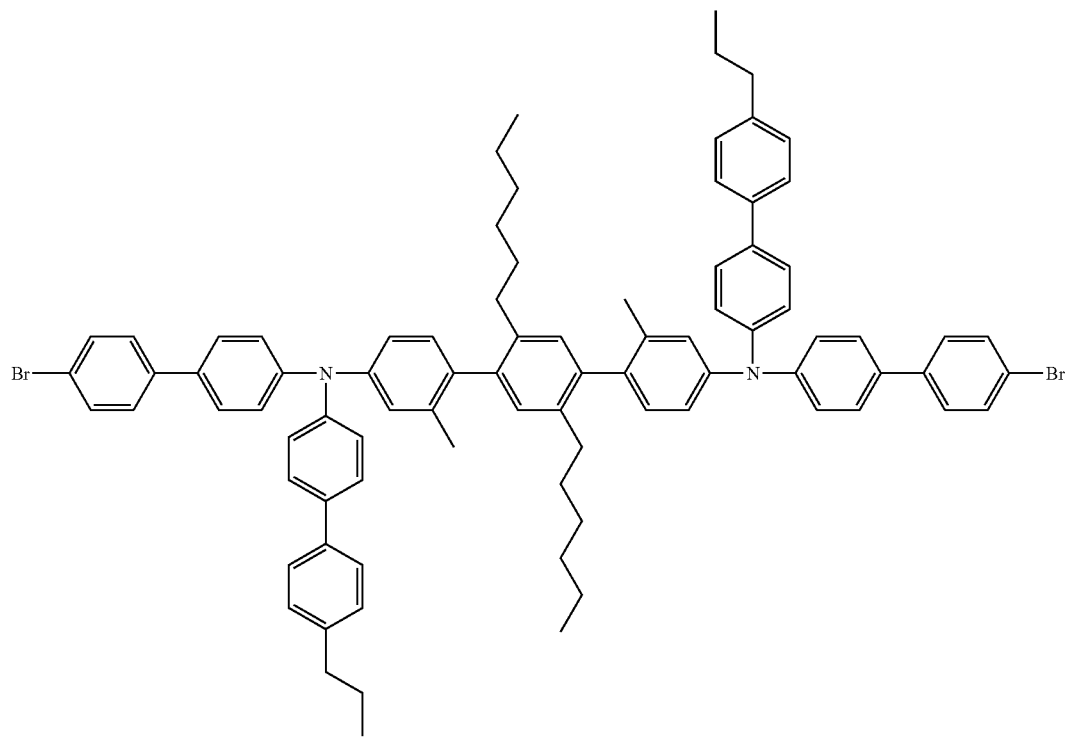
M1
↓
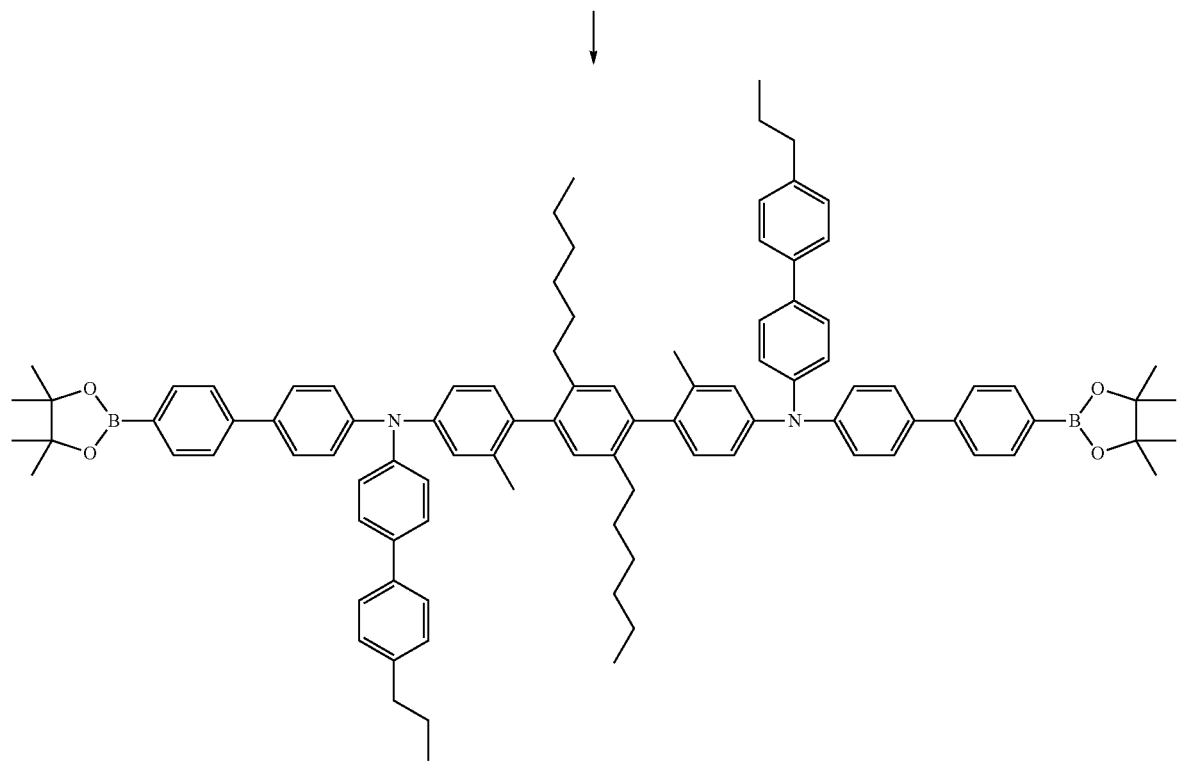
M3

27.81 g of compound M1 (21.3 mmol), 16.2 g of bis(pinacolato)diboron (63.8 mmol), 8.35 g of potassium acetate (85.1 mmol), 280 mL of 1,4-dioxane were charged to and inerted in a 1 L jacketed-reactor set-up with overhead mechanical stirrer and reflux condenser. After that, 0.70 g of [1,1'-Bis(diphenyl-phosphino)ferrocene] dichloropalladium (II), complex with dichloromethane were charged under inert conditions and the reaction mixture was heated to an external temperature of about 97° C. over a period of 1 hour. After 10 hours of heating the reaction was deemed completed and cooled to 25° C. The reaction mixture was passed through a bed of Celite and washed forward with 250 mL of dichloromethane/hexanes mixture (1:1 v/v). The solvent was removed and the residue was diluted with 50 mL of dichloromethane/hexanes (1:1, v/v), and addition dichloromethane aided the loading of the crude mixture onto a column containing 150 g of silica gel previously embedded with boric acid (Reference for boric acid embedded silica: Chem. Lett. 2012, 41, 972-973). The collected product fractions were combined and the column purification was repeated with 300 g of silica-gel embedded with boric acid. 19.1 g of lightly colored monomer were obtained after solvent removal. Further purification was achieved by passing the monomer through a column packed with 190 g of Florisil using dichloromethane/hexanes. Finally the monomer was dissolved in toluene/hexane and precipitated into methanol and isolated 15.4 g of solid monomer M3 in 52% yield.

(b) Copolymer H29

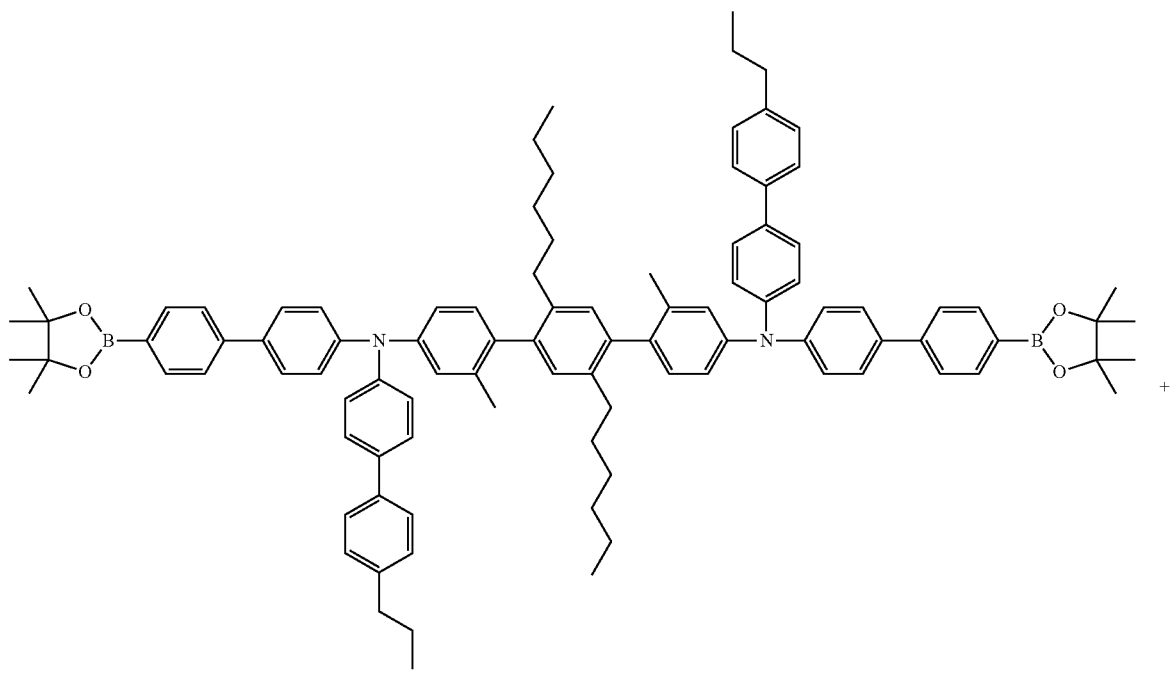

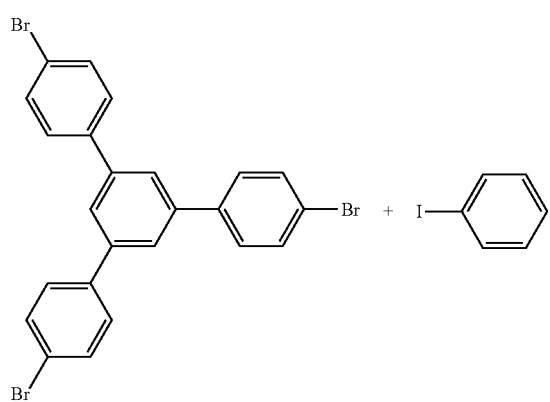

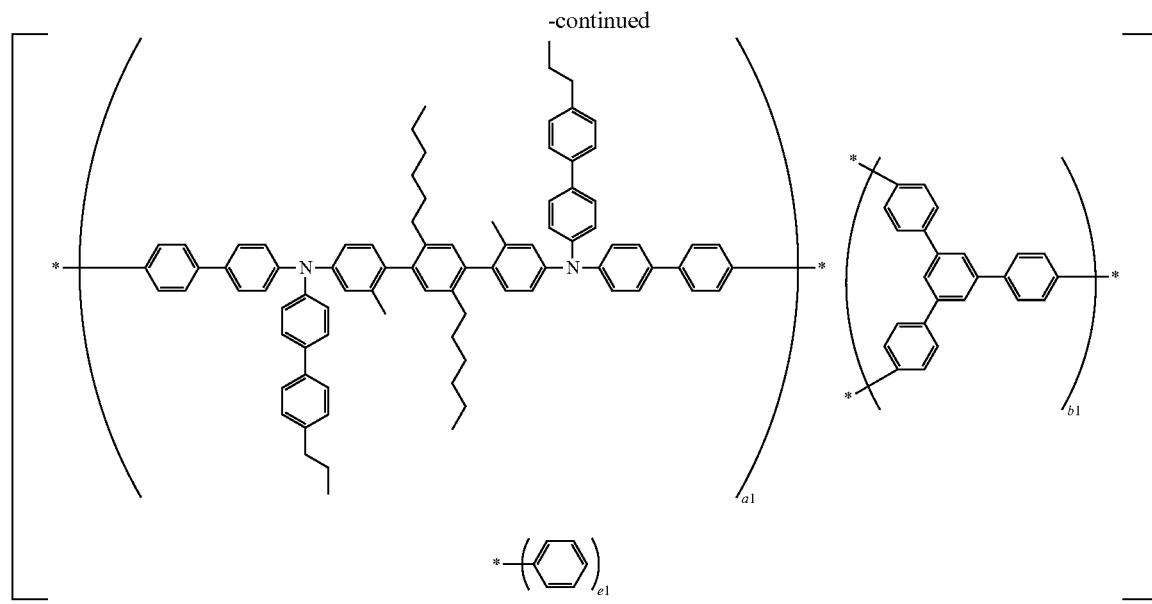

The synthesis was carried out in a manner analogous to Synthesis Example 2. GPC analysis is shown in Table 1.

TABLE 1

| Copolymer Type | Specific Copolymer | a1:b1:e1 a1:b1:c1:e1[#] | $M_w$ | [η] (mL/g)[##] |
|---|---|---|---|---|
| 1 | H1 | 58:12:30 | 69,000 | 48 |
|  | H11 | 38:12:50 | 13,000 | 21 |
|  | H31 | 76:12:12 | 587,950 |  |
|  | H32 | 84:04:12 | 114,365 | 78 |
| 2 | H2 | 76:12:12 | $1.6 \times 10^6$ | 134 |
|  | H10 | 68:12:20 | 150,000 | 68 |
|  | H14 | 58:12:30 | 43,000 | 41 |
|  | H21 | 52:20:28 | 191,700 | 54 |
| 3 | H3 | 58:12:30 | 22,000 | 28 |
| 4 | H4 | 50:10:10:30 | 44,000 | 38 |
| 5 | H5 | 58:12:30 | 32,000 | 40 |
|  | H24 | 52:20:28 | 122,000 | 46 |
| 6 | H6 | 58:12:30 | 35,000 | 38 |
| 7 | H7 | 52:20:28 | 108,800 | 43 |
|  | H8 | 60:16:24 | 103,600 | 49 |
|  | H19 | 44:24:32 | 57,650 | 37 |
|  | H20 | 54:20:26 | 130,700 | 47 |
|  | H22 | 58:20:22 | 199,000 | 56 |
| 8 | H9 | 38:12:50 | 18,000 | 24 |
|  | H13 | 58:12:30 | 62,000 | 43 |
|  | H33 | 84:04:12 | 113,105 | 73 |
| 9 | H12 | 58:12:30 | 59,000 | 48 |
|  | H29 | 42:17:41 | 461,000 | 59 |
| 10 | H15 | 50:10:10:30 | 57,000 | 39 |
| 11 | H18 | 58:12:30 | 34,000 | 37 |
| 12 | H23 | 58:12:30 | 25,000 | 18 |
| 13 | H25 | 54:20:26 | 87,000 | 45 |
| 14 | H26 | 54:20:26 | 100,000 | 43 |
|  | H27 | 45:11:44 | 19,000 | 25 |
|  | H28 | 57:16:27 | 73,000 | 40 |
| 15 | H17 | 58:12:30 | 15,000 | 19 |
| 16 | H34 | 58:12:30 | 51,000 |  |
| 17 | H30 | 47:21:32 | 232,350 | 45 |
| 18 | H16 | 58:12:30 | 73,000 | 43 |

[#]When 3 numbers are given, they represent the molar ratio a1:b1:e1 When 4 numbers are given, they represent the molar ratio a1:b1:c1:e1
[##][η] is the intrinsic viscosity Device Examples (1) Materials Dopant-1 is a bis(diarylamino)benzofluorene. Such materials have been described in, for example, U.S. Pat. No. 8,465,848.

ET-1 is an aryl phosphine oxide.

ET-2 is lithium quinolate.

ET-3 is an azine-substituted fluoranthene.

HIJ-1 is a hole injection material which is made from an aqueous dispersion of an electrically conductive polymer and a polymeric fluorinated sulfonic acid. Such materials have been described in, for example, U.S. Pat. No. 7,351,358.

Host-1 is a deuterated anthracene compound. Such materials have been described in published PCT Application WO 2011028216.

(2) Device Fabrication

OLED devices were fabricated by a combination of solution processing and thermal evaporation techniques. Patterned indium tin oxide (ITO) coated glass substrates from Thin Film Devices, Inc were used. These ITO substrates are based on Corning 1737 glass coated with ITO having a sheet resistance of 30 ohms/square and 80% light transmission. The patterned ITO substrates were cleaned ultrasonically in aqueous detergent solution and rinsed with distilled water. The patterned ITO was subsequently cleaned ultrasonically in acetone, rinsed with isopropanol, and dried in a stream of nitrogen.

Immediately before device fabrication the cleaned, patterned ITO substrates were treated with UV ozone for 10 minutes. Immediately after cooling, an aqueous dispersion of HIJ-1 was spin-coated over the ITO surface and heated to remove solvent. After cooling, the substrates were then spin-coated with a solution of hole transport material, and then heated to remove solvent. After cooling the substrates were spin-coated with a solution of the host and dopant, and heated to remove solvent. The substrates were masked and placed in a vacuum chamber. A layer of electron transport material was deposited by thermal evaporation, followed by a layer of electron injection material. Masks were then changed in vacuo and a layer of Al was deposited by thermal evaporation. The chamber was vented, and the devices were encapsulated using a glass lid, dessicant, and UV curable epoxy.

(3) Device Characterization

The OLED samples were characterized by measuring their (1) current-voltage (I-V) curves, (2) electroluminescence radiance versus voltage, and (3) electroluminescence spectra versus voltage. All three measurements were performed at the same time and controlled by a computer. The current efficiency of the device at a certain voltage is determined by dividing the electroluminescence radiance of the LED by the current density needed to run the device. The unit is a cd/A. The power efficiency is the current efficiency divided by the operating voltage. The unit is lm/W. The color coordinates were determined using either a Minolta CS-100 meter or a Photoresearch PR-705 meter.

Device Examples 1-6

These examples illustrate the use of copolymers having Formula I as the hole transport material in a device. The copolymer solution was in a solvent of mesitylene/NMP. The host/dopant solution was in a solvent of methyl benzoate.

Device structure, in order (all percentages are by weight, based on the total weight of the layer; all ratios are by weight):
Glass Substrate
Anode: ITO (50 nm)
Hole injection layer: HIJ-1 (100 nm)
Hole transport layer: Copolymer given in Table 2 (100 nm)
Photoactive layer: 93 wt % Host-1 and 7 wt % Dopant-1 (38 nm)
Electron transport layer: 3:2 ET-1:ET-2 (20 nm)
Electron injection layer: ET-2 (3 nm)
Cathode: Al (100 nm)
The device results are given in Table 2.

TABLE 2

| | | | Device results | | | | |
|---|---|---|---|---|---|---|---|
| Ex. | HTL | V | EQE (%) | CE (cd/A) | CIE x | CIE y | T95 |
| 1 | H19 | 4.4 | 4.6 | 4.1 | 0.14 | 0.10 | 340 |
| 2 | H7 | 4.6 | 5.6 | 5.0 | 0.14 | 0.10 | 650* |
| 3 | H8 | 4.5 | 5.2 | 4.8 | 0.14 | 0.11 | 800* |
| 4 | H20 | 4.6 | 5.6 | 4.5 | 0.14 | 0.09 | 962 |
| 5 | H21 | 4.8 | 5.7 | 4.9 | 0.14 | 0.10 | 1130* |
| 6 | H22 | 4.8 | 5.4 | 4.7 | 0.14 | 0.10 | 1310* |

All measurements are at 1000 nits unless otherwise specified;
V is the voltage in volts @ 15 mA/cm$^2$;
EQE = external quantum efficiency;
CE is the current efficiency;
CIEx and CIEy are the x and y color coordinates according to the C.I.E. chromaticity scale (Commission Internationale de L'Eclairage, 1931);
T95 is the time in hours to reach 95% of initial luminance at a current density of 22 mA/cm$^2$ and 50° C.

Device Examples 7-11

These examples illustrate the use of copolymers having Formula I as the hole transport material in a device. The copolymer solution was in a solvent of toluene. The host/dopant solution was in a solvent of toluene.

Device structure, in order (all percentages are by weight, based on the total weight of the layer; all ratios are by weight):
Glass Substrate
Anode: ITO (50 nm)
Hole injection layer: HIJ-1 (20 nm)
Hole transport layer: Copolymer given in Table 3 (20 nm)
Photoactive layer: 93 wt % Host-1 and 7 wt % Dopant-1
Electron transport layer: ET-3 (10 nm)
Electron injection layer: ET-2 (3 nm)
Cathode: Al (100 nm)
The device results are given in Table 3.

TABLE 3

| | | | Device results | | | | |
|---|---|---|---|---|---|---|---|
| Ex. | HTL | V | EQE (%) | CE (cd/A) | CIE x | CIE y | T95 |
| 7 | H1 | 4.9 | 6.7 | 8.0 | 0.14 | 0.15 | 4 |
| 8 | H31 | 4.4 | 6.1 | 6.4 | 0.14 | 0.13 | 12 |
| 9 | H13 | 4.7 | 6.0 | 7.2 | 0.14 | 0.16 | 40 |
| 10 | H33 | 3.3 | 2.1 | 2.3 | 0.14 | 0.13 | 5 |
| 11 | H32 | 4.5 | 5.4 | 6.4 | 0.14 | 0.15 | 18 |

All measurements are at 1000 nits unless otherwise specified;
V is the voltage in volts @ 15 mA/cm$^2$;
EQE = external quantum efficiency;
CE is the current efficiency;
CIEx and CIEy are the x and y color coordinates according to the C.I.E. chromaticity scale (Commission Internationale de L'Eclairage, 1931);
T95 is the time in hours to reach 95% of initial luminance at a current density of 22 mA/cm$^2$ and 50° C.

Device Examples 12-19

These examples illustrate the use of copolymers having Formula I as the hole transport material in a device. The copolymer solution was in a solvent of toluene. The host/dopant solution was in a solvent of toluene.

Device structure, in order (all percentages are by weight, based on the total weight of the layer; all ratios are by weight):
Glass Substrate
Anode: ITO (50 nm)
Hole injection layer: HIJ-1 (20 nm)
Hole transport layer: Copolymer given in Table 4 (20 nm)
Photoactive layer: 93 wt % Host-1 and 7 wt % Dopant-1 (38 nm)
Electron transport layer: 2:3 ET-1:ET-2 (20 nm)
Electron injection layer: ET-2 (3 nm)
Cathode: Al (100 nm)
The device results are given in Table 4.

TABLE 4

| | | | Device results | | | | |
|---|---|---|---|---|---|---|---|
| Ex. | HTL | V | EQE (%) | CE (cd/A) | CIE x | CIE y | T95 |
| 12 | H3 | 3.7 | 2.9 | 3.4 | 0.14 | 0.15 | 187 |
| 13 | H5 | 4.5 | 5.6 | 6.3 | 0.14 | 0.13 | 123 |
| 14 | H11 | 4.5 | 5.3 | 6.6 | 0.15 | 0.16 | 39 |
| 15 | H34 | 4.4 | 5.3 | 6.3 | 0.15 | 0.15 | 143 |

TABLE 4-continued

Device results

| Ex. | HTL | V | EQE (%) | CE (cd/A) | CIE x | CIE y | T95 |
|---|---|---|---|---|---|---|---|
| 16 | H6 | 4.4 | 4.8 | 6.1 | 0.15 | 0.16 | 59 |
| 17 | H18 | 4.0 | 3.8 | 3.7 | 0.14 | 0.11 | 35 |
| 18 | H23 | 4.2 | 4.7 | 5.1 | 0.14 | 0.13 | 24 |
| 19 | H24 | 4.7 | 6.6 | 7.4 | 0.14 | 0.14 | 36 |

All measurements are at 1000 nits unless otherwise specified;
V is the voltage in volts @ 15 mA/cm$^2$;
EQE = external quantum efficiency;
CE is the current efficiency;
CIEx and CIEy are the x and y color coordinates according to the C.I.E. chromaticity scale (Commission Internationale de L'Eclairage, 1931);
T95 is the time in hours to reach 95% of initial luminance at a current density of 22 mA/cm$^2$ and 50° C.

Note that not all of the activities described above in the general description or the examples are required, that a portion of a specific activity may not be required, and that one or more further activities may be performed in addition to those described. Still further, the order in which activities are listed are not necessarily the order in which they are performed.

In the foregoing specification, the concepts have been described with reference to specific embodiments. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of invention.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

It is to be appreciated that certain features are, for clarity, described herein in the context of separate embodiments, may also be provided in combination in a single embodiment. Conversely, various features that are, for brevity, described in the context of a single embodiment, may also be provided separately or in any subcombination. The use of numerical values in the various ranges specified herein is stated as approximations as though the minimum and maximum values within the stated ranges were both being preceded by the word "about." In this manner, slight variations above and below the stated ranges can be used to achieve substantially the same results as values within the ranges.

Also, the disclosure of these ranges is intended as a continuous range including every value between the minimum and maximum average values including fractional values that can result when some of components of one value are mixed with those of different value. Moreover, when broader and narrower ranges are disclosed, it is within the contemplation of this invention to match a minimum value from one range with a maximum value from another range and vice versa.

What is claimed is:

1. A hole transport copolymer having Formula I

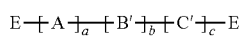
(I)

wherein:
A is a monomeric unit containing at least one triarylamine group;
B' is a monomeric unit having at least three points of attachment in the copolymer;
C' is an aromatic monomeric unit or a deuterated analog thereof;
E is the same or different at each occurrence and is selected from the group consisting of H, D, halide, alkyl, silyl, germyl, aryl, arylamino, siloxane, crosslinkable groups, deuterated alkyl, deuterated silyl, deuterated germyl, deuterated aryl, deuterated arylamino, deuterated siloxane, and deuterated crosslinkable groups;
a, b, and c are the same or different and are mole fractions, such that a+b+c=1, and a and b are non-zero.

2. The copolymer of claim 1, wherein monomeric unit A has a formula selected from the group consisting of Formula II, Formula III, Formula IV, Formula V-a, and Formula V-b

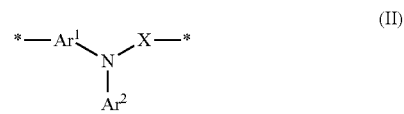
(II)

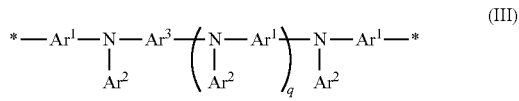
(III)

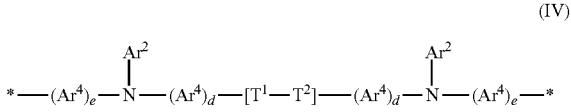
(IV)

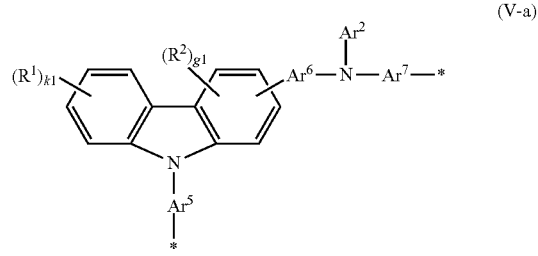
(V-a)

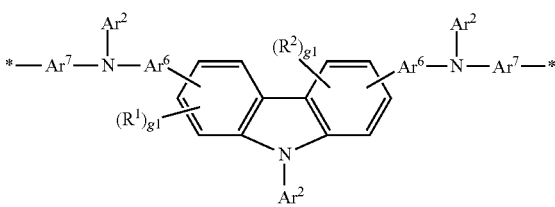
(V-b)

wherein:
Ar$^1$ is the same or different at each occurrence and is an aryl or deuterated aryl group;
Ar$^2$ is the same or different at each occurrence and is an aryl or deuterated aryl group;
Ar$^3$ is the same or different at each occurrence and is an aryl or deuterated aryl group;
Ar$^4$ is the same or different at each occurrence and is selected from the group consisting of phenylene, substituted phenylene, naphthylene, substituted naphthylene, and deuterated anlogs thereof;
Ar$^5$, Ar$^6$, and Ar$^7$ are the same or different at each occurrence and are aryl groups or deuterated aryl groups;

R¹ and R² are the same or different at each occurrence and are selected from the group consisting of D, F, CN, alkyl, fluoroalkyl, aryl, heteroaryl, amino, silyl, germyl, alkoxy, aryloxy, fluoroalkoxy, siloxane, siloxy, deuterated alkyl, deuterated partially-fluorinated alkyl, deuterated aryl, deuterated heteroaryl, deuterated amino, deuterated silyl, deuterated germyl, deuterated alkoxy, deuterated aryloxy, deuterated fluoroalkoxy, deuterated siloxane, deuterated siloxy, and crosslinking groups, wherein adjacent groups selected from R¹ and R² can be joined together to form a fused ring;

T¹ and T² are independently the same or different at each occurrence and are conjugated moieties which are connected in a non-planar configuration, or a deuterated analog thereof;

X is the same or different at each occurrence and is selected from the group consisting of a single bond, an aryl group, and a deuterated aryl group;

d is the same or different at each occurrence and is an integer from 1 to 6;

e is the same or different at each occurrence and is an integer from 1 to 6;

k1 is an integer from 0-4;

g1 is the same or different at each occurrence and is an integer from 0-3;

q is an integer of 0 or greater; and

* represents a point of attachment in the copolymer.

3. The copolymer of claim 2, wherein monomeric unit A has Formula III.

4. The copolymer of claim 3, wherein monomeric unit A has Formula III-b

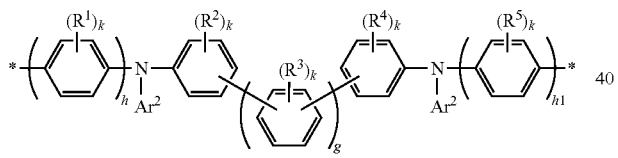

(III-b)

wherein:
Ar² is the same or different at each occurrence and is an aryl or deuterated aryl group;
R¹ through R⁵ are the same or different at each occurrence and are selected from the group consisting of D, F, CN, alkyl, fluoroalkyl, aryl, heteroaryl, amino, silyl, germyl, alkoxy, aryloxy, fluoroalkoxy, siloxane, siloxy, deuterated alkyl, deuterated partially-fluorinated alkyl, deuterated aryl, deuterated heteroaryl, deuterated amino, deuterated silyl, deuterated germyl, deuterated alkoxy, deuterated aryloxy, deuterated fluoroalkoxy, deuterated siloxane, deuterated siloxy, and crosslinking groups, wherein adjacent R¹ or R⁵ groups can be joined together to form a fused 5- or 6-membered aromatic ring;
k is the same or different at each occurrence and is an integer from 0 to 4;
g is an integer from 0 to 3;
h and h1 are the same or different and are 1 or 2; and
* represents a point of attachment in the copolymer.

5. The copolymer of claim 2, wherein Ar¹ is a hydrocarbon aryl group having no fused rings.

6. The copolymer of claim 5, wherein Ar¹ has at least one substituent selected from the group consisting of D, F, CN, alkyl, fluoroalkyl, aryl, heteroaryl, amino, silyl, germyl, alkoxy, aryloxy, fluoroalkoxy, siloxane, siloxy, crosslinking groups, deuterated alkyl, deuterated partially-fluorinated alkyl, deuterated aryl, deuterated heteroaryl, deuterated amino, deuterated silyl, deuterated germyl, deuterated alkoxy, deuterated aryloxy, deuterated fluoroalkoxy, deuterated siloxane, deuterated siloxy, and deuterated crosslinking groups.

7. The copolymer of claim 2, wherein Ar² is a hydrocarbon aryl group having no fused rings.

8. The copolymer of claim 2, wherein Ar² is selected from the group consisting of phenyl, biphenyl, terphenyl, 1-naphthyl, 2-naphthyl, anthracenyl, fluorenyl, deuterated analogs thereof, and derivatives thereof having one or more substituents selected from the group consisting of fluoro, alkyl, alkoxy, silyl, germyl, siloxy, a substituent with a crosslinking group, and deuterated analogs thereof.

9. The copolymer of claim 2, wherein R¹ is selected from the group consisting of D, $C_{1-10}$ alkyl, $C_{1-10}$ silyl, $C_{6-20}$ hydrocarbon aryl, $C_{3-20}$ heteroaryl, amino group, deuterated $C_{1-10}$ alkyl, deuterated silyl, deuterated $C_{6-20}$ hydrocarbon aryl, deuterated $C_{3-20}$ heteroaryl, and deuterated amino group.

10. The copolymer of claim 1, wherein monomeric unit B' has Formula VI

(VI)

wherein:
Z is selected from the group consisting of C, Si, Ge, N, a cyclic aliphatic moiety, an aromatic moiety, a deuterated cyclic aliphatic moiety, or a deuterated aromatic moiety having at least three bonding positions;
Y is a single bond, an alkyl, an aromatic moiety, a deuterated alkyl, or a deuterated aromatic moiety, provided that when Y is a single bond, alkyl, or deuterated alkyl, Z is an aromatic or deuterated aromatic moiety;
s is an integer from 3 to the maximum number of bonding positions available on Z; and
* represents a point of attachment in the copolymer.

11. The copolymer of claim 1, wherein monomeric unit B' has a formula selected from the group consisting of Formula VII, Formula VIII, Formula IX, Formula X, and Formula XI

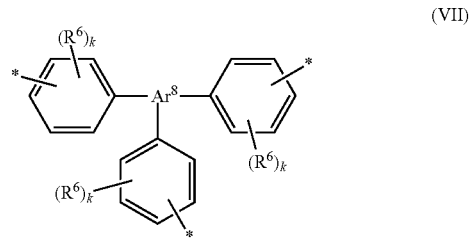

(VII)

-continued (VIII)

(IX)

(X)

(XI)

wherein:
Ar⁸ is an aromatic moiety or a deuterated aromatic moiety having at least three bonding positions;
$R^6$ is independently the same or different at each occurrence and is selected from the group consisting of D, F, CN, alkyl, fluoroalkyl, aryl, heteroaryl, amino, silyl, germyl, alkoxy, aryloxy, fluoroalkoxy, siloxane, siloxy, deuterated alkyl, deuterated partially-fluorinated alkyl, deuterated aryl, deuterated heteroaryl, deuterated amino, deuterated silyl, deuterated germyl, deuterated alkoxy, deuterated aryloxy, deuterated fluoroalkoxy, deuterated siloxane, deuterated siloxy, and crosslinking groups, wherein adjacent $R^6$ groups can be joined together to form a fused 5- or 6-membered aromatic ring;

k is the same or different at each occurrence and is an integer from 0 to 4;
k1 is an integer from 0 to 5; and
* represents a point of attachment in the copolymer.

12. The copolymer of claim 1, wherein E is a hydrocarbon aryl group or deuterated hydrocarbon aryl group.

13. The copolymer of claim 1, wherein Formula I, E is selected from the group consisting of phenyl, biphenyl, diphenylamino, substituted derivatives thereof, and deuterated analogs thereof.

14. The copolymer of claim 1, wherein a=0.60-0.90, b=0.10-0.40, and c=0-0.20.

15. An organic electronic device comprising an anode, a cathode, and at least one organic active layer therebetween, wherein the organic active layer comprises a copolymer according to claim 1.

16. The organic electronic device of claim 15, wherein the device comprises an anode, a hole transport layer, a photoactive layer, and a cathode, wherein one or both of the hole transport layer and the photoactive layer comprises the copolymer.

17. The organic electronic device of claim 16, wherein the hole transport layer comprises the copolymer.

18. A copolymer having Formula I', below $$[*-(A)_{a1}* \quad (*)_z(B')_{b1} \quad *-(C')_{c1}* \quad *-(E)_{e1}] \quad (I')$$

wherein:
A is a monomeric unit containing at least one triarylamine group;
B' is a monomeric unit having at least three points of attachment in the copolymer;
C' is an aromatic monomeric unit or a deuterated analog thereof;
E is the same or different at each occurrence and is selected from the group consisting of H, D, halide, alkyl, aryl, arylamino, siloxane, crosslinkable groups, deuterated alkyl, deuterated aryl, deuterated arylamino, deuterated siloxane, and deuterated crosslinkable groups;
a1, b1, c1, and e1 are mole fractions of reactant monomers, such that a1+b1+c1+e1=1, and a1 and b1 are non-zero;
z is an integer equal to or greater than 3; and
* indicates a point of attachment in the copolymer.

19. The copolymer of claim 18, wherein a1=0.30-0.90, b1=0.05-0.40, c1=0-0.15, and e1=0.05-0.60.

20. A hole transport copolymer having Formula I $$E-(A)_a-(B')_b-(C')_c-E \quad (I)$$

wherein:
A is a monomeric unit containing at least one triarylamine group;
B' is a monomeric unit having at least three points of attachment in the copolymer;
C' is an aromatic monomeric unit or a deuterated analog thereof;
E is the same or different at each occurrence and is selected from the group consisting of H, D, halide, alkyl, silyl, germyl, aryl, arylamino, siloxane, crosslinkable groups, deuterated alkyl, deuterated silyl, deuterated germyl, deuterated aryl, deuterated arylamino, deuterated siloxane, and deuterated crosslinkable groups;

a, b, and c are the same or different and are mole fractions, such that a+b+c=1, and a and b are non-zero;

wherein the copolymer has a $M_w$>10,000.

21. The copolymer of claim 5, wherein Ar' has at least one substituent selected from the group consisting of D, alkyl, arylamino, hydrocarbon aryl, deuterated alkyl, deuterated arylamino, and deuterated hydrocarbon aryl.

* * * * *